United States Patent [19]
Nakanishi et al.

[11] Patent Number: 5,796,124
[45] Date of Patent: *Aug. 18, 1998

[54] MOS GATE CONTROLLED THYRISTOR

[75] Inventors: Hidetoshi Nakanishi, Kawasaki; Yasunori Usui; Shigenori Yakushiji, both of Yokohama, all of Japan

[73] Assignee: Kabushiki Kaisha Toshiba, Kawasaki, Japan

[*] Notice: The term of this patent shall not extend beyond the expiration date of Pat. No. 5,336,907.

[21] Appl. No.: 610,070

[22] Filed: Feb. 29, 1996

Related U.S. Application Data

[63] Continuation of Ser. No. 133,434, Oct. 8, 1993, Pat. No. 5,543,639.

[30] Foreign Application Priority Data

| Oct. 8, 1992 | [JP] | Japan | 4-270172 |
| Feb. 23, 1993 | [JP] | Japan | 5-056396 |

[51] Int. Cl.$^6$ .................... H01L 29/74; H01L 31/111
[52] U.S. Cl. .................... 257/133; 257/139; 257/143; 257/147; 257/163
[58] Field of Search .................... 257/144, 139, 257/140, 143, 146, 149, 152, 163, 164, 165, 138, 147, 336, 337, 338, 339, 341, 342, 344, 378, 382, 212, 340, 107; 437/133, 30

[56] References Cited

U.S. PATENT DOCUMENTS

| 4,810,665 | 3/1989 | Chang et al. | 437/30 |
| 5,336,907 | 8/1994 | Nakanishi et al. | 257/133 |

FOREIGN PATENT DOCUMENTS

| 0405138 | 1/1991 | European Pat. Off. | 257/139 |

*Primary Examiner*—Steven H. Loke
*Attorney, Agent, or Firm*—Oblon, Spivak, McClelland, Maier & Neustadt, P.C.

[57] ABSTRACT

On one major surface of an n$^-$-type semiconductor substrate, a p-type region is formed in a semiconductor substrate, and an n-type emitter region is formed in the p-type base region. A p-type source region is formed near the p-type base region. A cathode electrode has a so-called shorted emitter structure in which the cathode electrode is connected to the p-type source region, the p-type base region, and the n-type emitter region. The p-type source region preferably has a pattern adjacent the p-type base region. The p-type base region is preferably constituted by a plurality of diffusion layers which are electrically connected to each other. Therefore, turn-off characteristics of a device can be improved, and turn-on characteristics are improved without degrading the turn-off characteristics, thereby improving trade-off between the turn-on characteristics and the turn-off characteristics.

4 Claims, 48 Drawing Sheets

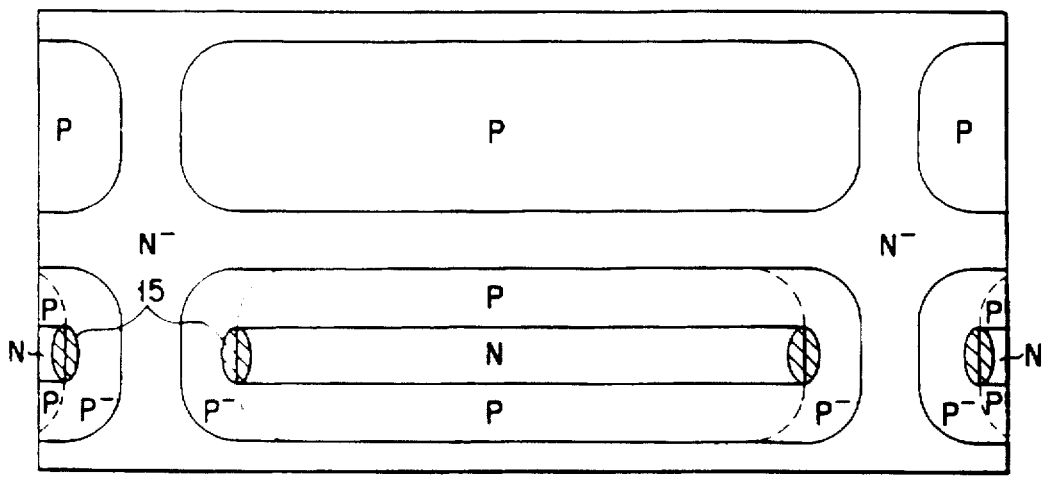
F I G. 2A
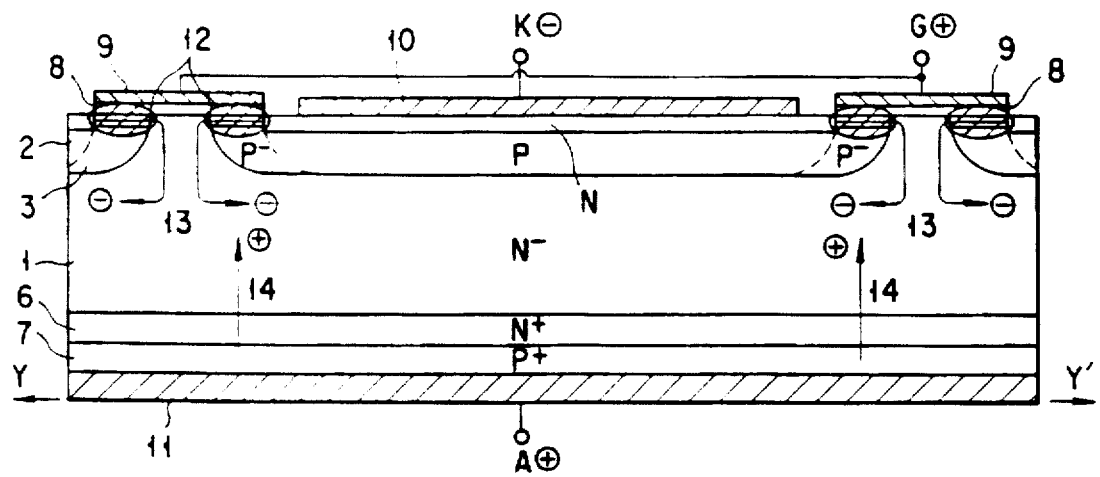
F I G. 2B
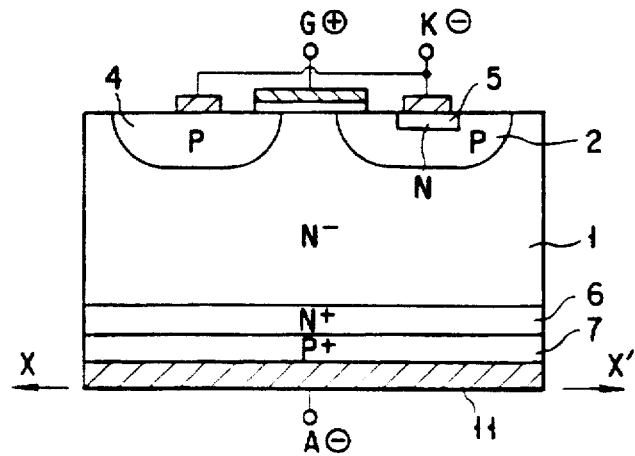
F I G. 2C

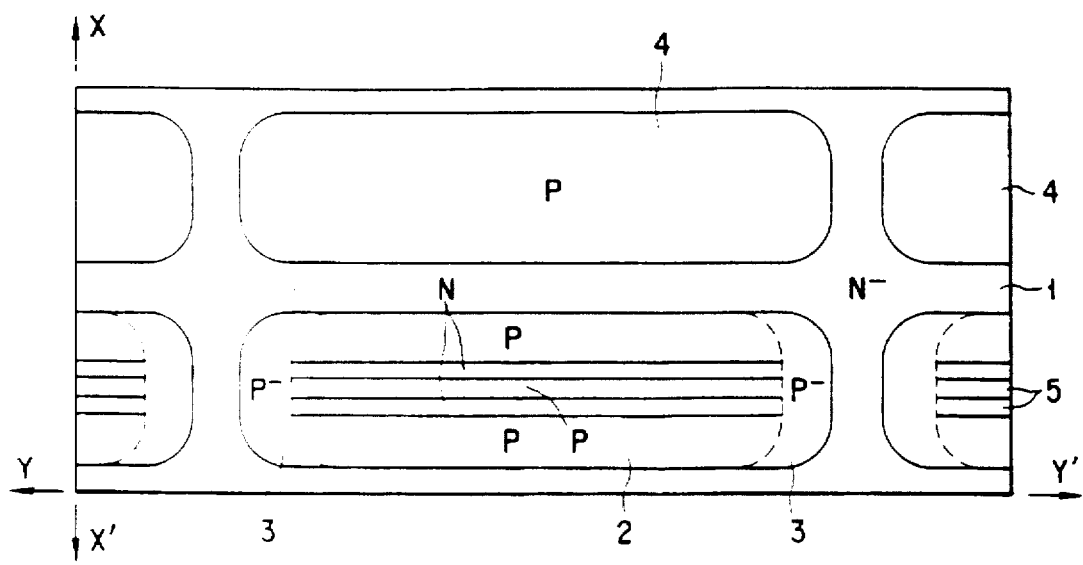
F I G. 6
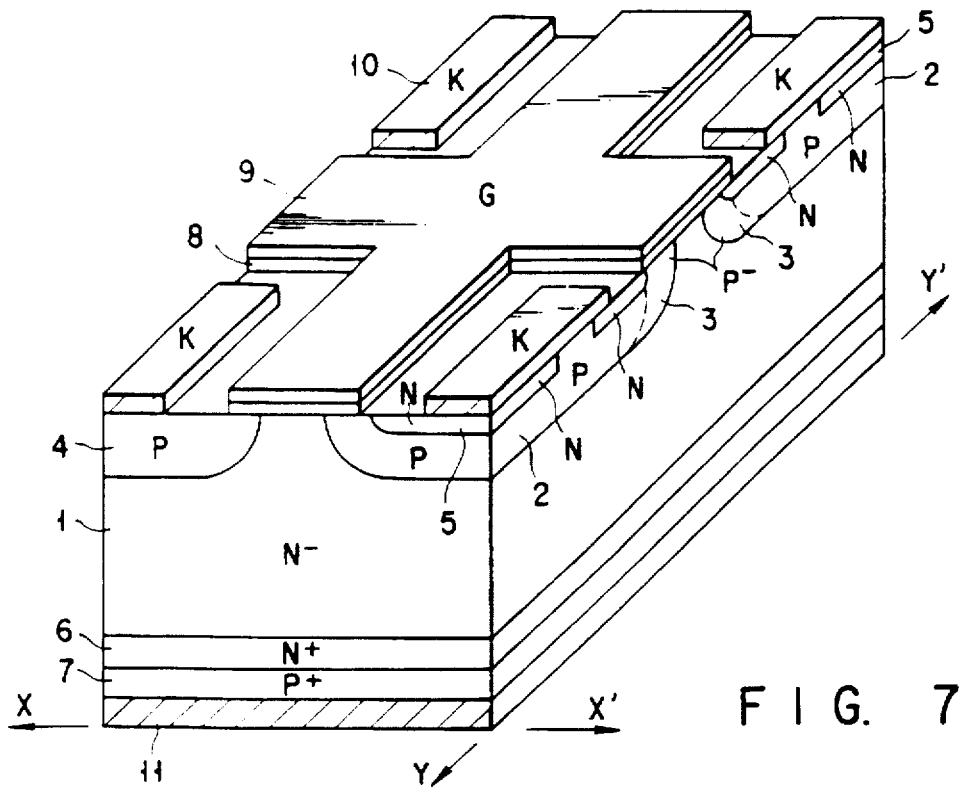
F I G. 7

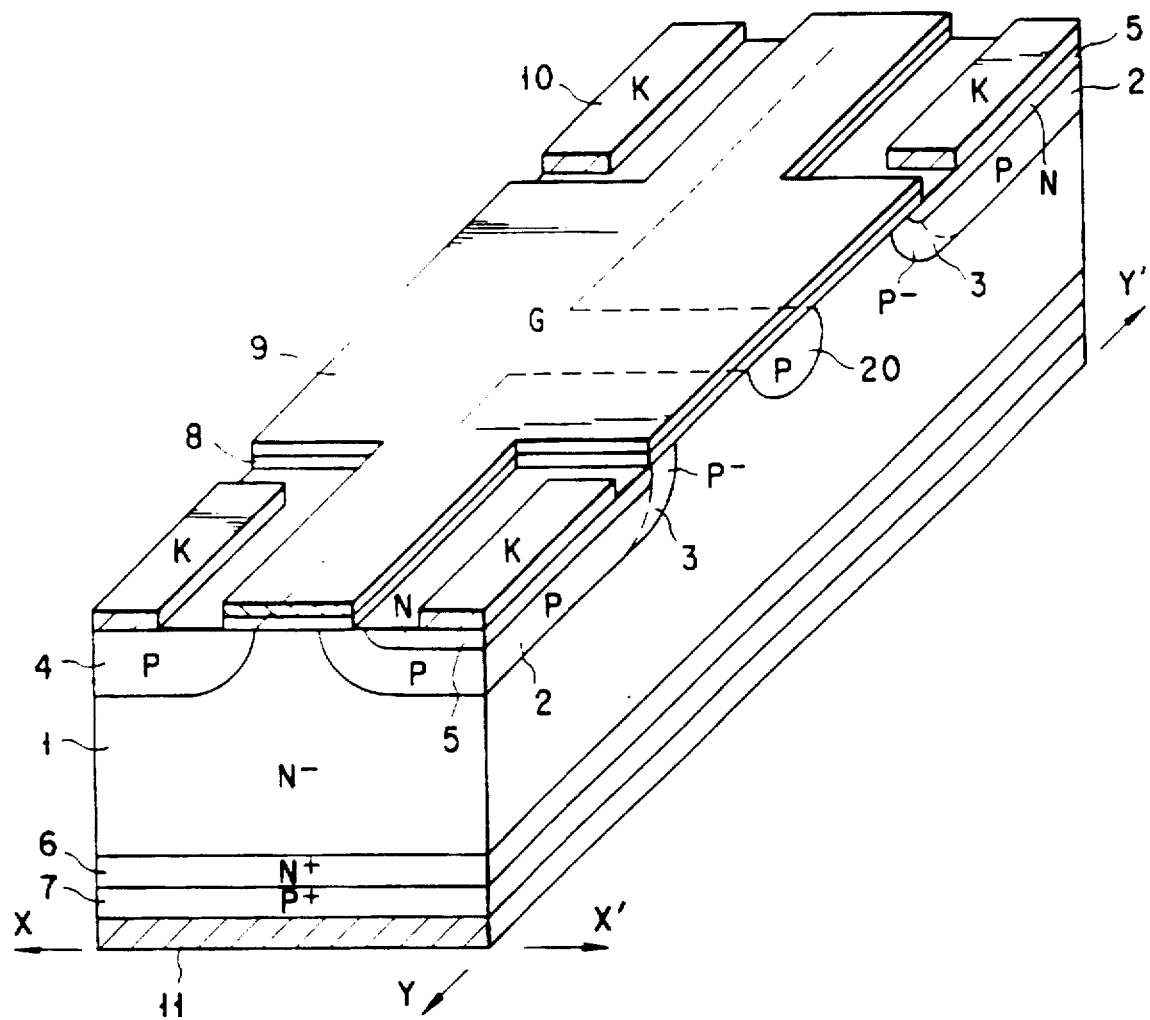
F I G. 16

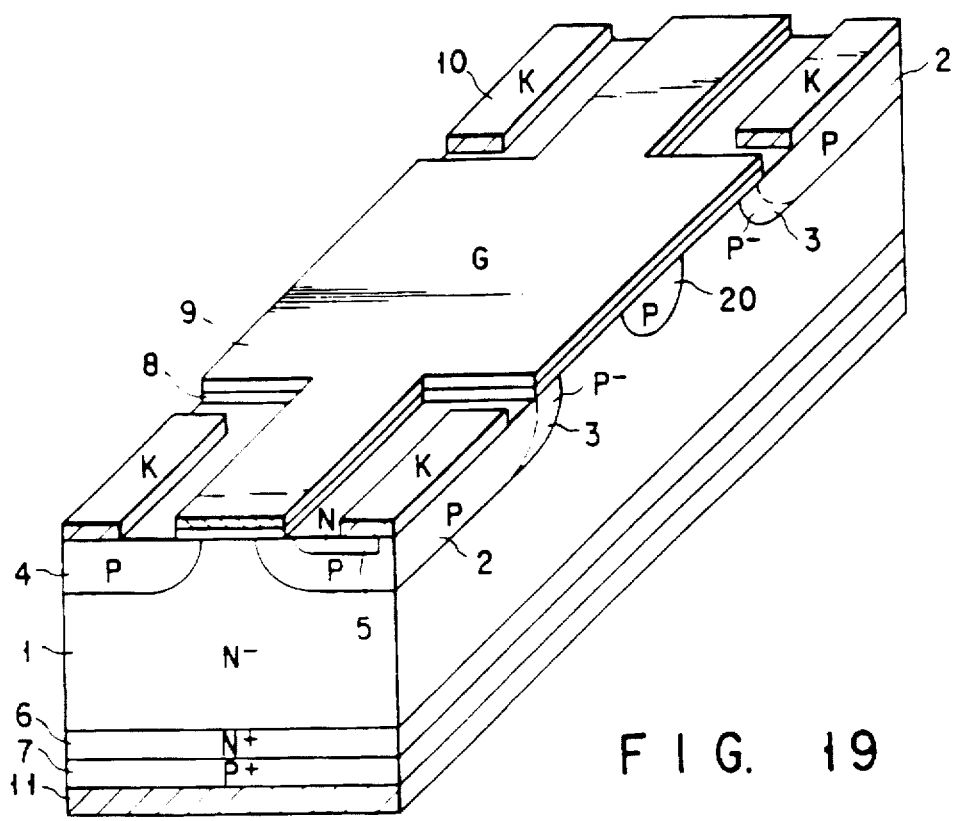
F I G. 19
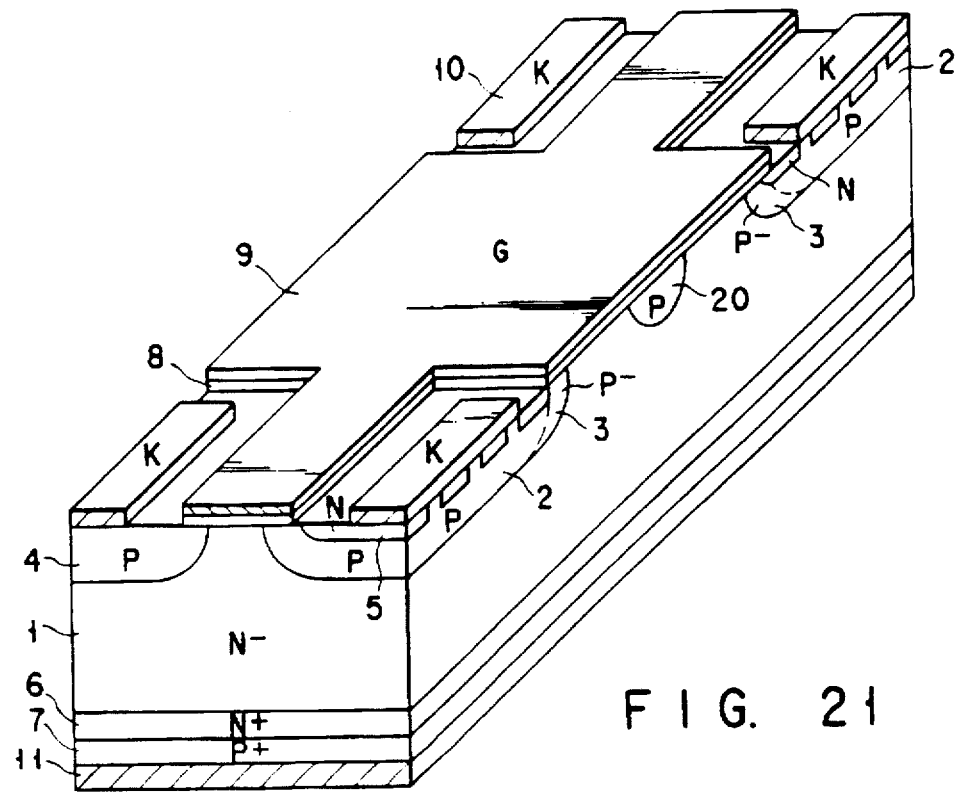
F I G. 21

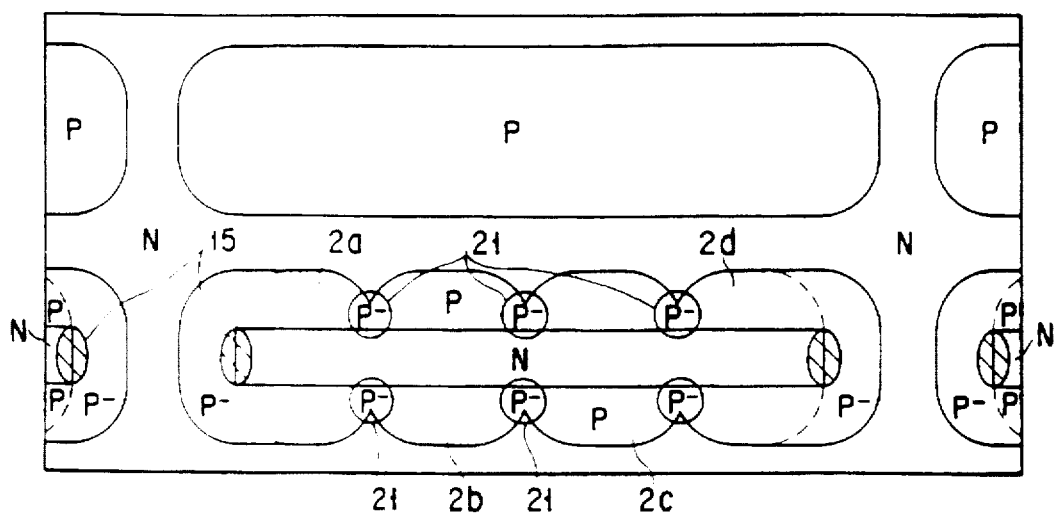
F I G. 28A
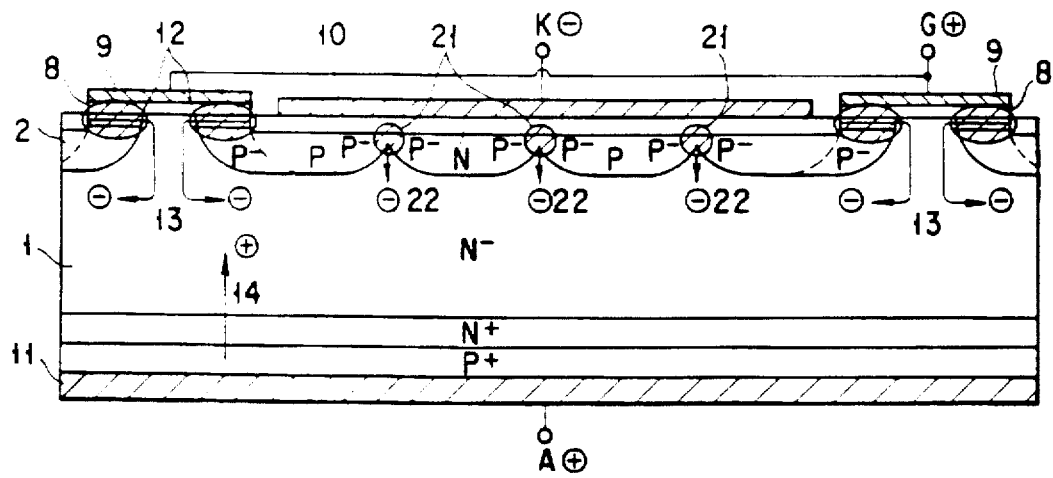
F I G. 28B
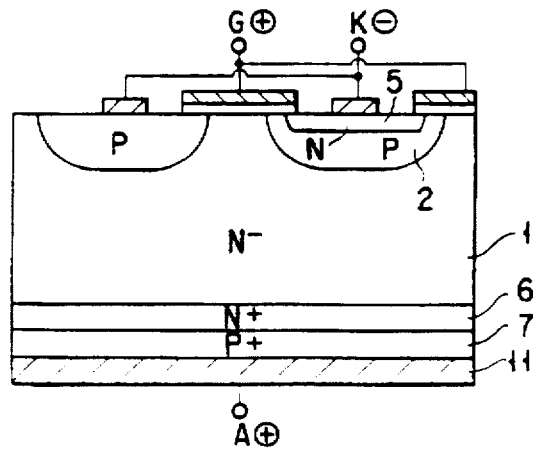
F I G. 28C

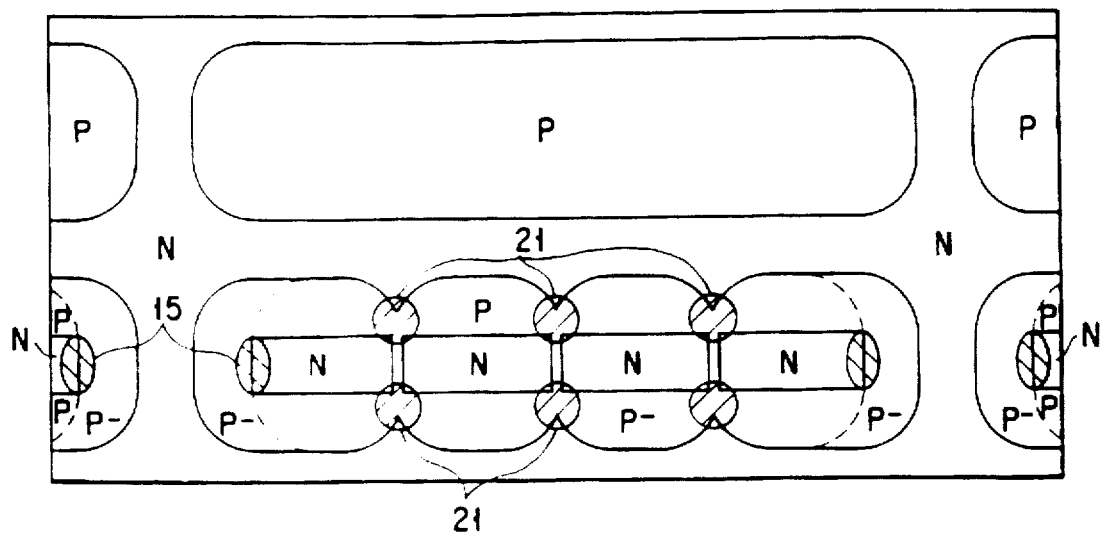
F I G. 31A
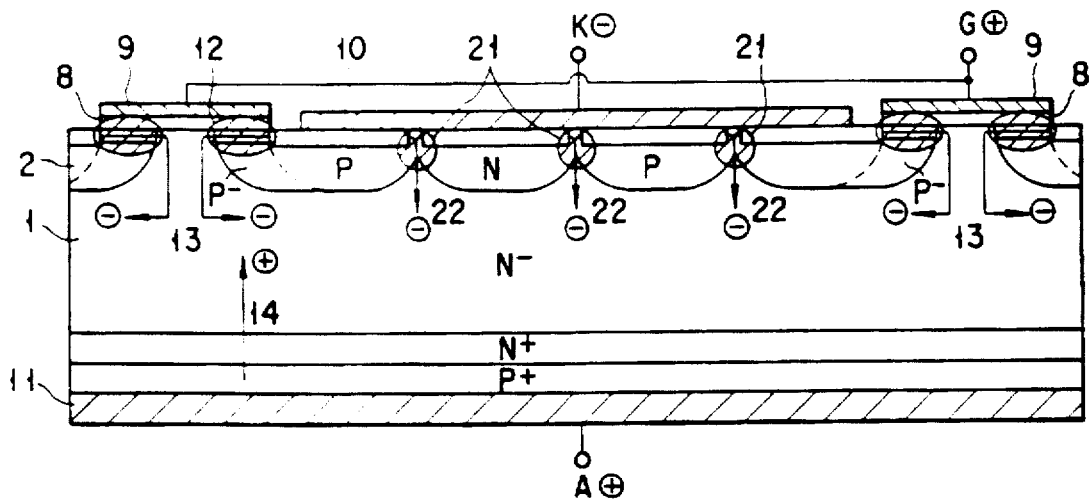
F I G. 31B
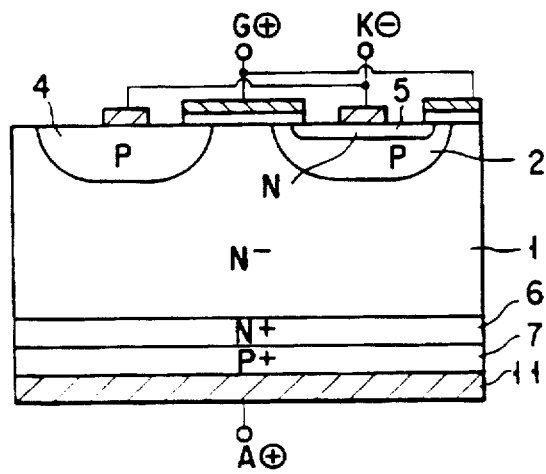
F I G. 31C

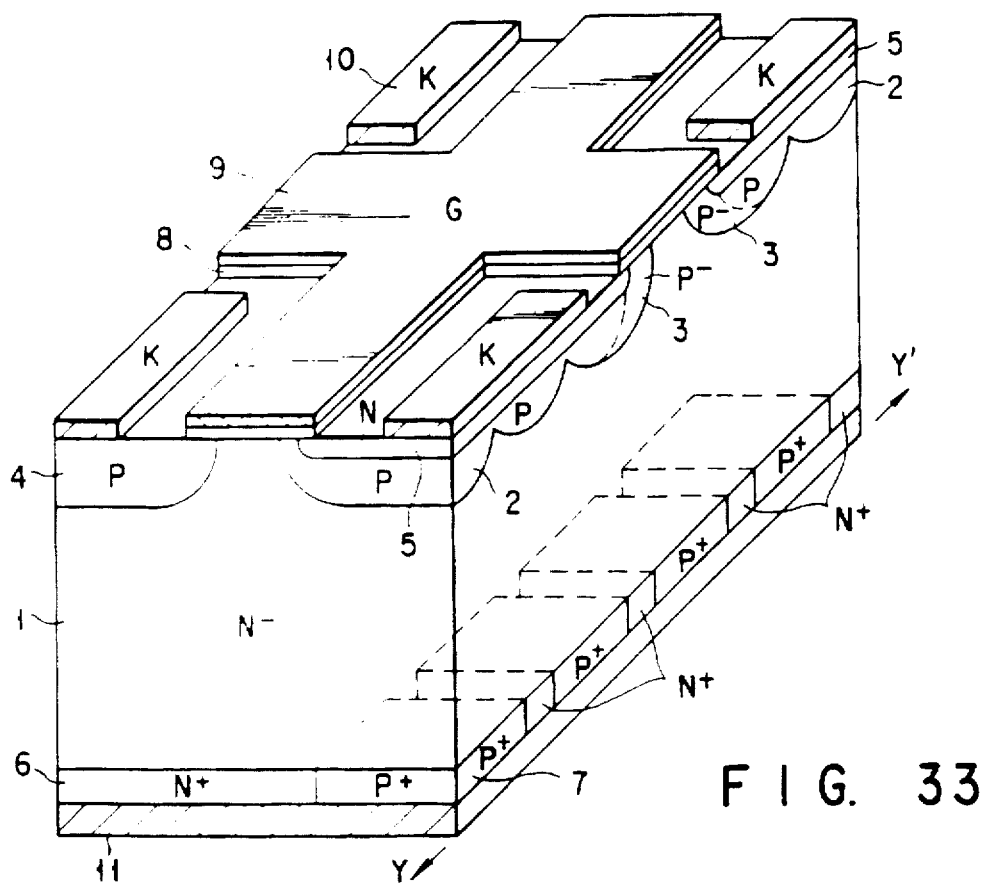
F I G. 33
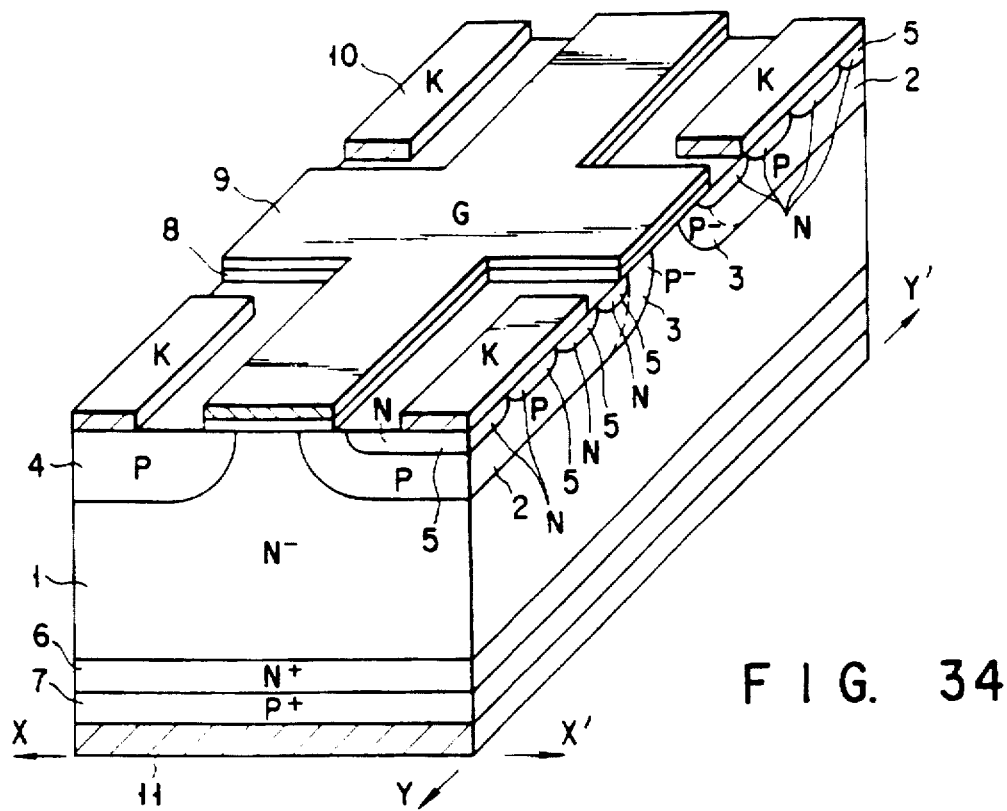
F I G. 34

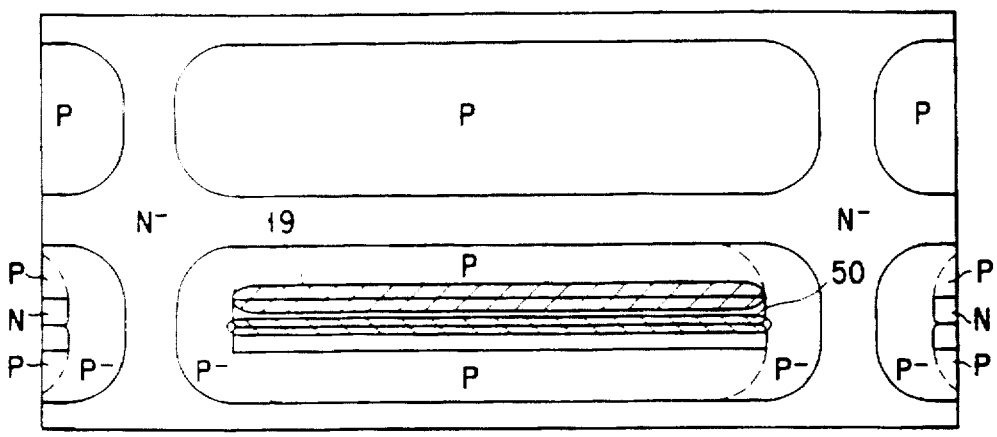
F I G. 40A
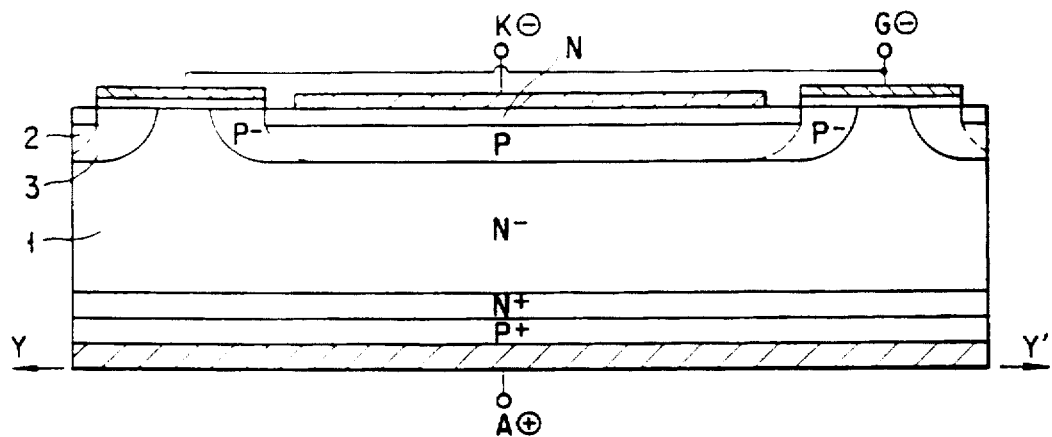
F I G. 40B
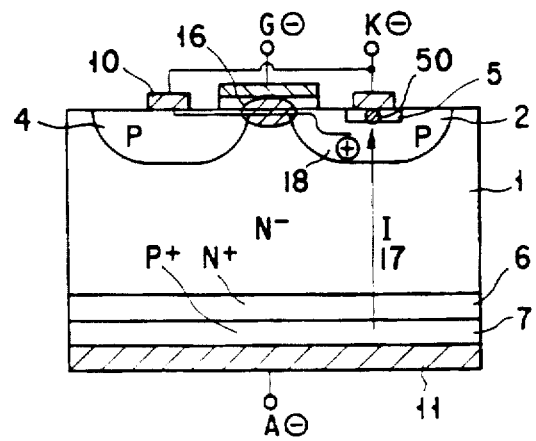
F I G. 40C

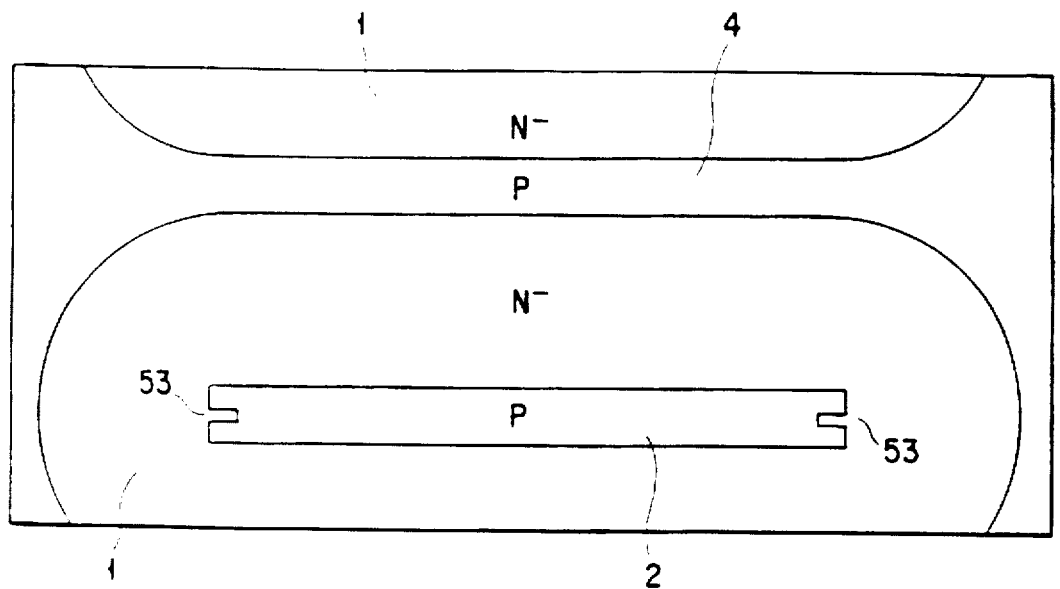
F I G. 45
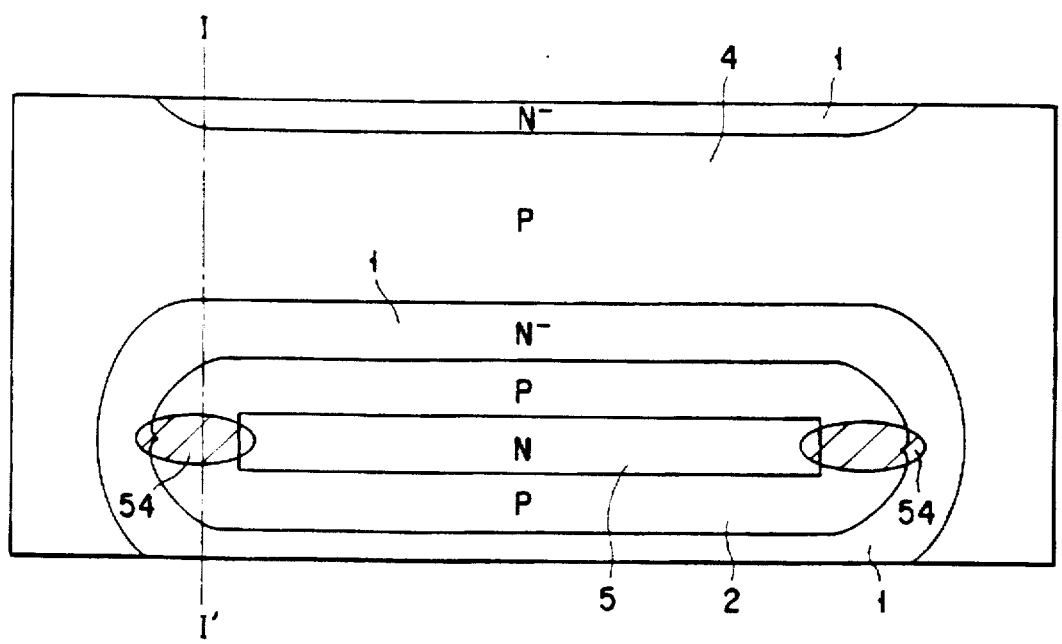
F I G. 46

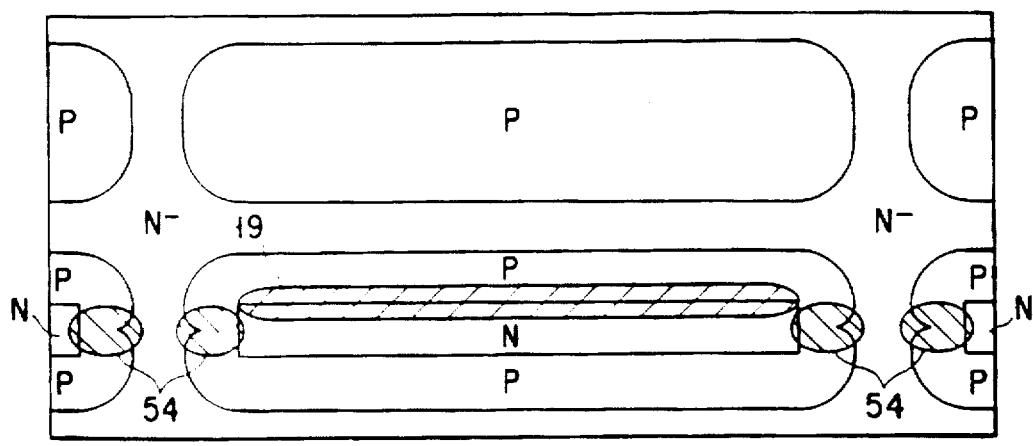
F I G. 48A
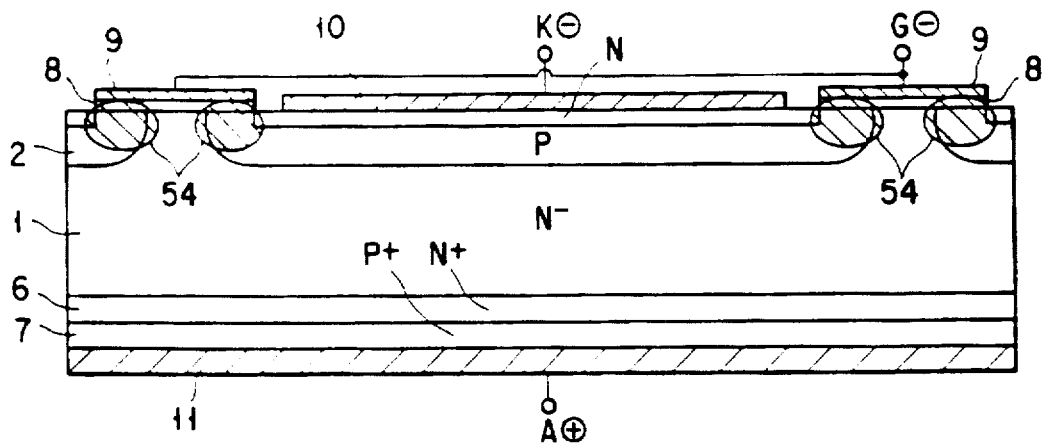
F I G. 48B
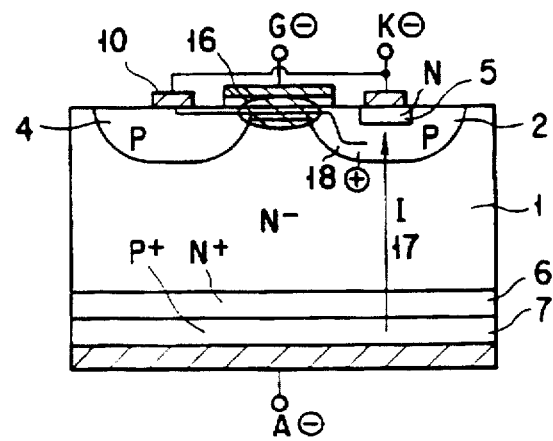
F I G. 48C

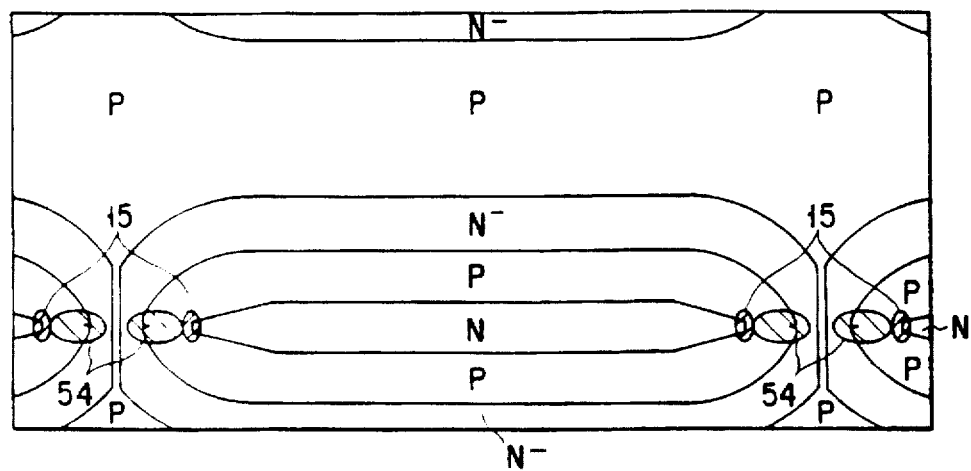
F I G. 54A
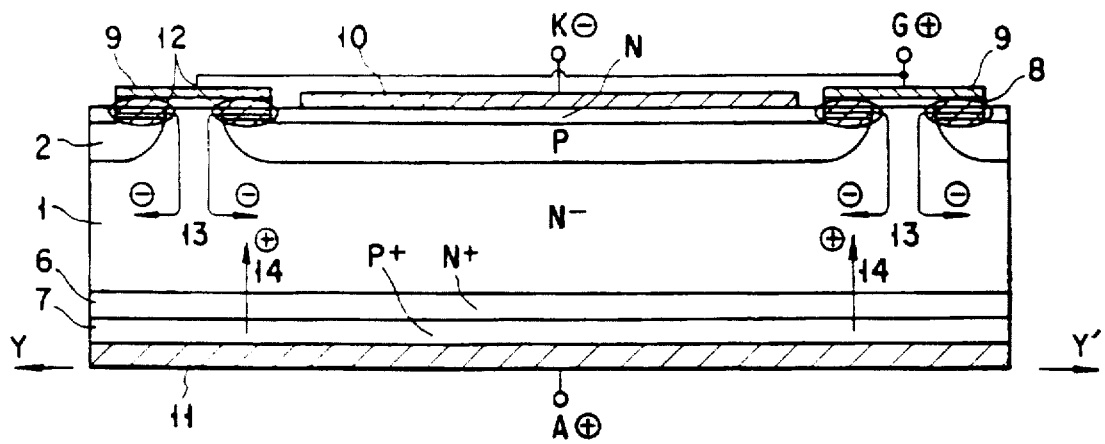
F I G. 54B
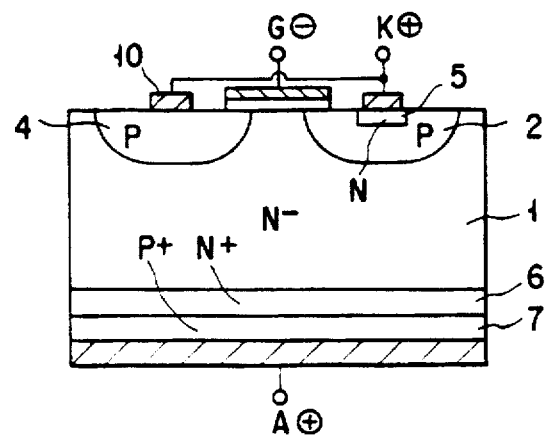
F I G. 54C

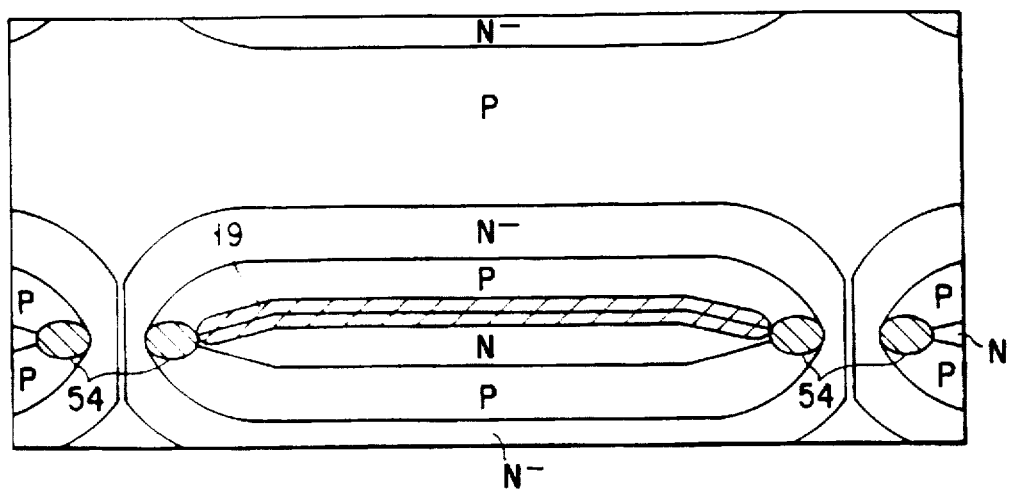
F I G. 55A
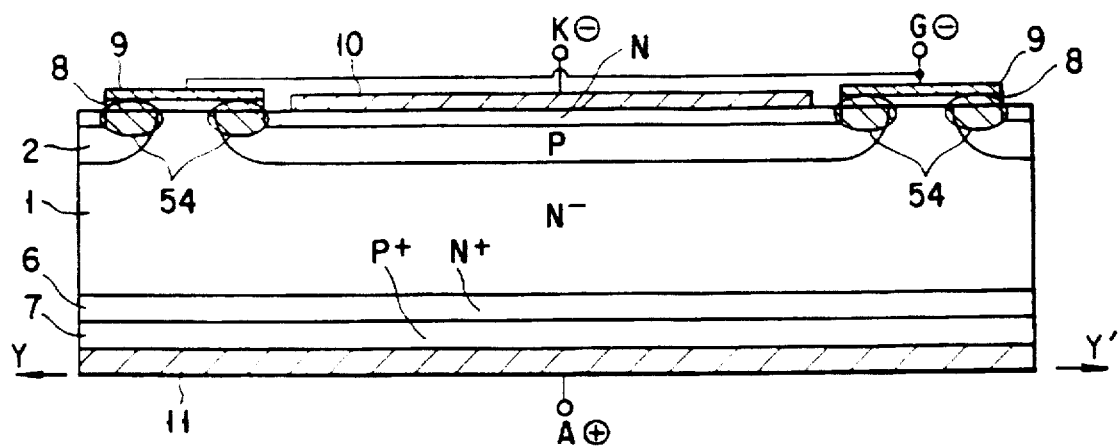
F I G. 55B
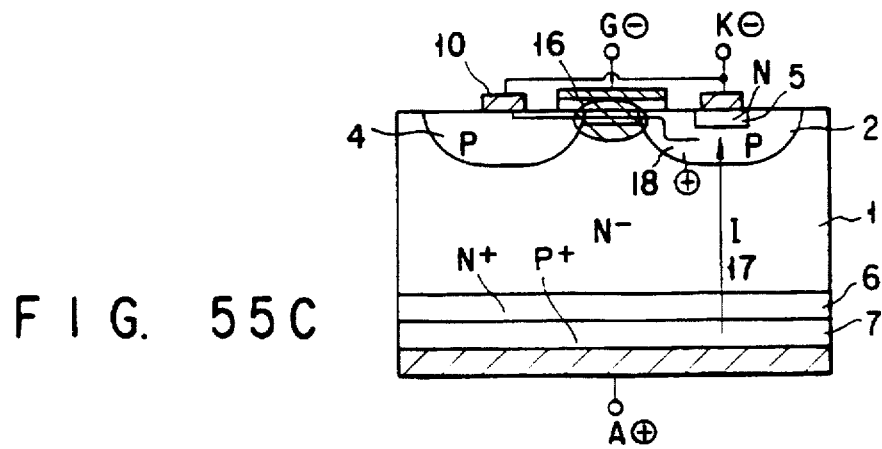
F I G. 55C

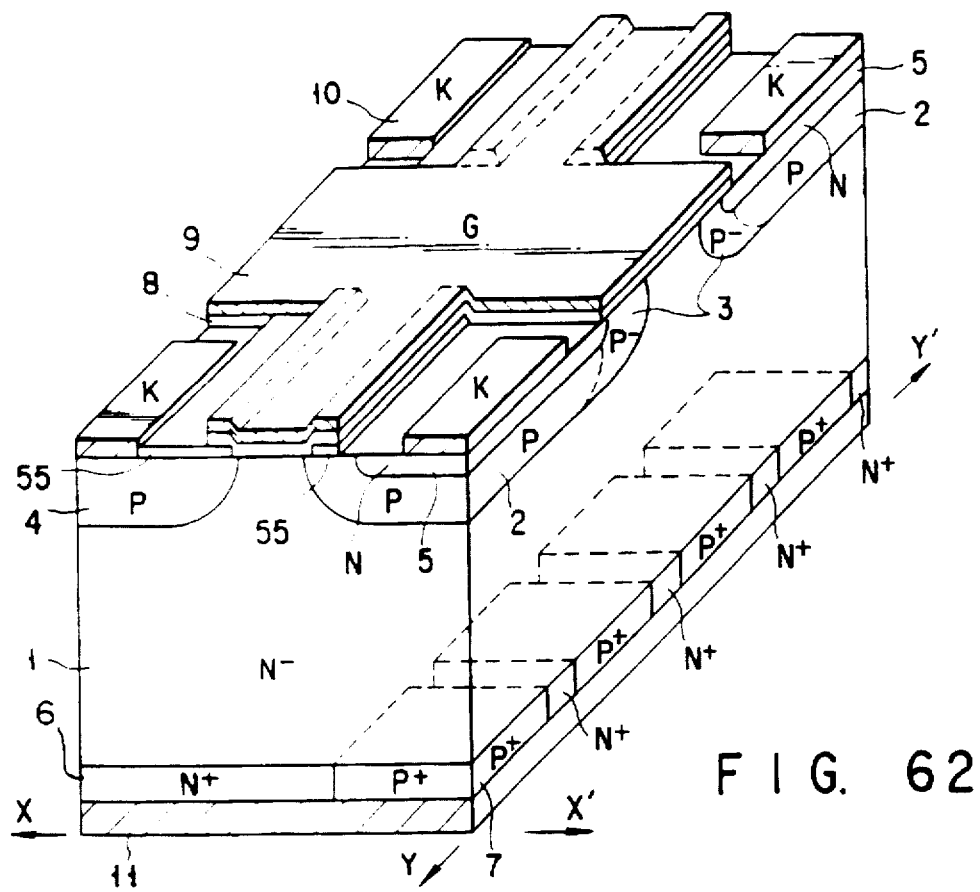
F I G. 62
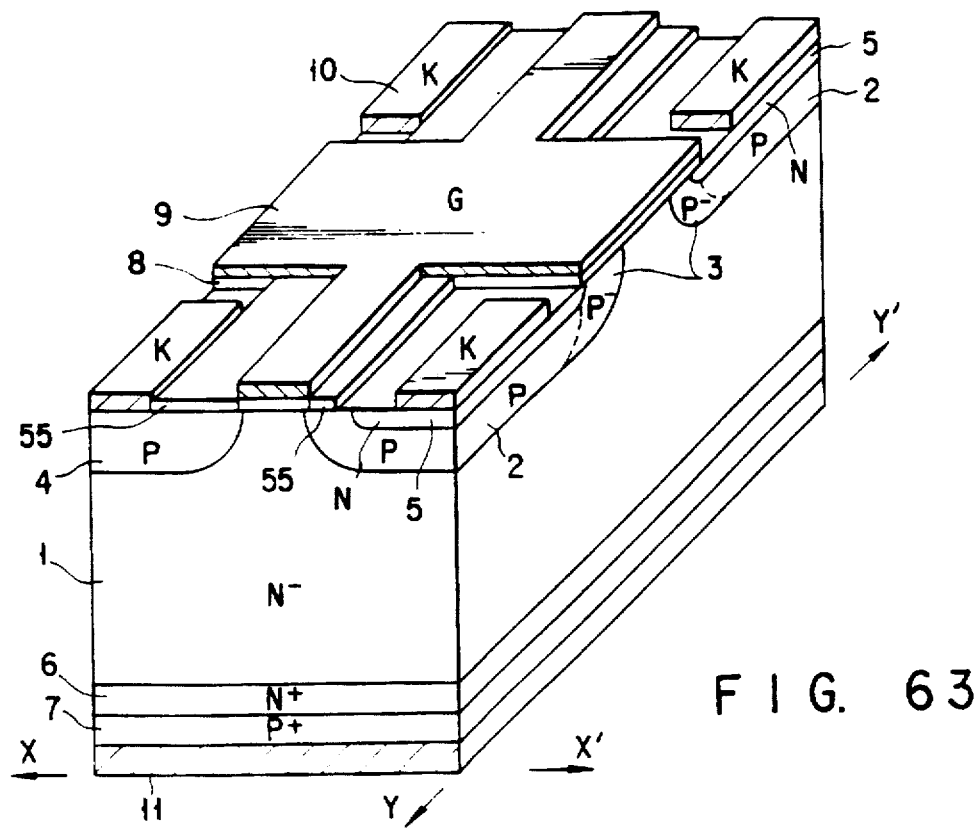
F I G. 63

MOS GATE CONTROLLED THYRISTOR

This is a continuation of application Ser. No. 08/133,434 filed on Oct. 8, 1993, now U.S. Pat. No. 5,543,639.

BACKGROUND OF THE INVENTION

1. Field of the Invention

The present invention relates to an improvement on a MOS gate controlled thyristor (to be referred to as an MCT hereinafter) which can be turned on/off using a MOS gate.

2. Description of the Related Art

FIG. 1 shows the structure of an MCT described in copending application filed Oct. 30, 1992, Ser. No. 969,491. The steps in manufacturing the MCT will be briefly described below. An $n^+$-type buffer layer 6 and a lower-surface $p^+$-type emitter layer 7 are formed on the lower surface of an $n^-$-type semiconductor substrate 1. A gate oxide film 8 and a polysilicon gate electrode 9 are formed on the upper surface of the substrate 1. A p-type base region 2, $p^-$-type base regions 3, a p-type source region 4, and an n-type emitter region 5 are respectively formed in the surface regions of the substrate by diffusion. In addition, an opening is partially formed in the gate oxide film 8 to form cathode electrodes 10. An anode electrode 11 is formed on the lower surface of the substrate 1.

An operational principle (turn-on/turn-off operations) of the MCT will be described below. Note that FIGS. 2A to 2C are views for explaining a turn-on operation, and FIGS. 3A to 3C are views for explaining a turn-off operation. FIGS. 2A and 3A are plan views; FIGS. 2B and 3B are sectional views along an Y—Y' line in FIG. 1; and FIGS. 2C and 3C are sectional views along a X—X' line in FIG. 1.

The turn-on operation will be described below with reference to FIG. 2A to 2C. An anode is biased positive, cathodes are biased negative, and a gate is biased positive. In this state, n-channel inversion layers 12 are formed in the $p^-$-type base regions 3, and electrons are injected from the n-type emitter region 5 into the $n^-$-type base regions (substrate) 1. In this manner, holes 14 are induced from the lower-surface $p^+$-type emitter layer 7, and the $n^-$-type base region 1 is subjected to conductivity modulation. Portions 15 where the $p^-$-type base regions 3 is in contact with the n-type emitter region 5 become early turn-on areas, thereby starting the turn-on operation of the device. When a turn-on region extends over the entire area of the n-type emitter region 5, the device is completely turned on.

The turn-off operation will be described below with reference to FIGS. 3A to 3C and 4. When the anode is biased positive, and the cathodes are biased negative, a main current 17 flows. In this state, when the gate is biased negative, the n-channel inversion layers 12 which are formed during the turn-on operation disappear. A p-channel inversion layer 16 is formed on the surface of the $n^-$-type base region 1 between the p-type base region 2 and the p-type source region 4. The p-type base region 2, the p-type source region 4, and the cathode electrodes 10 are short-circuited to each other, and holes 18 of the main current are discharged from the cathode electrodes 10. With this operation, injection of electrons from the n-type emitter region 5 is stopped, and the main current 17 does not flow. In the n-type emitter region 5, the turn-off operation is started from a region 19 opposite to the p-type source region 4. Finally, the turn-off region extends over the n-type emitter region 5, thereby completing the turn-off operation.

A MCT has been developed as a self-turn-off device to improve its turn-off efficiency having priority over other conditions. In this technique, an on-gate portion is separated from an off-gate portion, and a ratio of the area of the off-gate portion to the area of the on-gate portion is set such that most of the area of the gate is used as the off-gate portion. In addition, in portions except for the on-gate portion, in order to improve turn-off characteristics, the concentration of the p-type base region is increased, and a method of decreasing the resistance of a path, formed in a turn-off operation and constituted by the p-type base region 2, the p-channel inversion layer 16, and the p-type source region 4, for discharging a hole current is used.

According to this method, the turn-off region in the on-gate portion has a low impurity concentration due to the $p^-$-type base region 3. For this reason, although the turn-off operation of the off-gate portion can be preferably performed, a short-circuit resistance is not decreased, and a hole current is not sufficiently discharged. That is, the turn-off operation of the on-gate portion is not efficiently performed.

On the other hand, in the turn-on operation, even when electrons are injected from the on-gate portion into the $n^-$-type base region (substrate) 1, electrons are not easily injected from the n-type emitter region 5 except for the on-gate portion. The turn-on operation is performed by causing the on-gate region to extend over the entire area of the n-type emitter region 5. Therefore, in the semiconductor device described above a small on-gate area, the efficiency of the turn-on characteristics is poorer than that of the turn-off characteristics, and trade-off between the turn-on characteristics and the turn-off characteristics cannot be easily obtained.

As described in the above technique, a turn-off operation of the on-gate portion is not efficiently performed. On the other hand, the efficiency of the turn-on characteristics is poorer than that of the turn-off characteristics, and trade-off between the turn-on characteristics and the turn-off characteristics cannot be easily obtained.

SUMMARY OF THE INVENTION

The present invention has been made to solve the above drawbacks, and has as its first object to improve the turn-off characteristics of an on-gate portion in a turn-on operation to further improve the turn-off characteristics of a device and as its second object to improve the turn-on characteristics without degrading the turn-off characteristics to improve trade-off between the turn-on characteristics and the turn-off characteristics.

In order to achieve the above objects, according to the first aspect of the present invention, there is provided a semiconductor device comprising a semiconductor substrate of a first conductivity type, a first semiconductor region of a second conductivity type formed on a first major surface side of the semiconductor substrate, a second semiconductor region of the first conductivity type formed in the first semiconductor region, a first electrode formed to be in contact with both the first and second semiconductor regions, a third semiconductor region of the second conductivity type formed on a second major surface side of the semiconductor substrate, and a second electrode formed to be in contact with the third semiconductor region.

The semiconductor device further comprises a fourth semiconductor region of the second conductivity type formed on the first major surface side of the semiconductor substrate to be adjacent to the first semiconductor region, and a gate electrode formed on the semiconductor substrate, the first semiconductor region, and the fourth semiconductor regions through an insulating film, wherein the first electrode is formed to be in contact with the fourth semiconductor region.

The semiconductor device further comprises a fifth semiconductor region formed in contact with the first semiconductor region and having an impurity concentration lower than that of the first semiconductor region, wherein the gate electrode is also formed on the fifth semiconductor region through the insulating film.

In order to achieve the above objects, according to the second aspect of the present invention, there is provided a semiconductor device comprising a semiconductor substrate of a first conductivity type, a first semiconductor region of a second conductivity type formed on a first major surface side of the semiconductor substrate, a second semiconductor region of the first conductivity type formed in the first semiconductor region, a third semiconductor region of the second conductivity type formed on a second major surface side of the semiconductor substrate, a fourth semiconductor region of the second conductivity type formed on the first major surface side of the semiconductor substrate to surround at least the first semiconductor region, a gate electrode formed on the semiconductor substrate, the first semiconductor region, and the fourth semiconductor region through an insulating film, a first electrode formed to be in contact with the second and fourth semiconductor regions, and a second electrode formed to be in contact with the third semiconductor region.

The first electrode is formed to be in contact with the first semiconductor region. The semiconductor device further comprises a fifth semiconductor region formed to be in contact with the first semiconductor region and having an impurity concentration lower than that of the first semiconductor region, wherein the gate electrode is also formed on the fifth semiconductor region through the insulating film.

In order to achieve the above objects, according to the third aspect of the present invention, there is provided a semiconductor device comprising a first semiconductor substrate of a first conductivity type, a first semiconductor region of a second conductivity type constituted by a plurality of diffusion layers formed on a first major surface side of the semiconductor substrate and connected to each other, a second semiconductor region of the first conductivity type formed in the first semiconductor region, a first electrode formed to be in contact with the second semiconductor region, a third semiconductor region of the second conductivity type formed on a second major surface side of the semiconductor substrate, and a second electrode formed to be in contact with the third semiconductor region.

The first electrode is formed to be in contact with the first semiconductor region. The semiconductor device further comprises a fourth semiconductor region of the second conductivity type formed on the first major surface side of the semiconductor substrate to be adjacent to the first semiconductor region, and a gate electrode formed on the semiconductor substrate, the first semiconductor region, and the fourth semiconductor region through an insulating film, wherein the first electrode is also formed to be in contact with the fourth semiconductor region.

The semiconductor device further comprises a fifth semiconductor region formed to be in contact with the first semiconductor region and having an impurity concentration lower than that of the first semiconductor region, wherein the gate electrode is also formed on the fifth semiconductor region through the insulating film. The depth of a portion where the plurality of diffusion layers constituting the first semiconductor region are in contact with each other is smaller than that of each of other portions of the plurality of diffusion layers. The first electrode is formed to be in contact with each diffusion layer at each portion where the depth of the diffusion layer is small.

In order to achieve the above objects, according to the fourth aspect of the present invention, there is provided a semiconductor device comprising a semiconductor substrate of a first conductivity type, a first semiconductor region of a second conductivity type formed on a major surface side of the semiconductor substrate, a second semiconductor region of the second conductivity type constituted by a diffusion layer formed in the first semiconductor region and having a predetermined depth, a portion of the diffusion layer being shallower than each of other portions of the diffusion layer and being interposed between other portions of the diffusion layer, a first electrode formed to be in contact with the second semiconductor region, a third semiconductor region of the second conductivity type formed on a second major surface side of the semiconductor substrate, and a second electrode formed to be in contact with the third semiconductor region.

The shallow portion of the diffusion layer constituting the second semiconductor region has an impurity concentration lower than each of other portions of the second semiconductor region. The semiconductor device further comprises a fourth semiconductor region of the second conductivity type formed on the first major surface side of the semiconductor substrate to be adjacent to the first semiconductor region and to interpose the semiconductor substrate with an adjacent fourth semiconductor region, a gate electrode formed on the semiconductor substrate, the first semiconductor region, and the fourth semiconductor region through an insulating film, wherein the first electrode is also formed in contact with the fourth semiconductor region.

The semiconductor device further comprises a fifth semiconductor region of the second conductivity type formed to be in contact with the first semiconductor region and having an impurity concentration lower than that of the first semiconductor region, wherein the gate electrode is also formed on the fifth semiconductor region through the insulating film.

In order to achieve the above objects, according to the fifth aspect of the present invention, there is provided a semiconductor device comprising a semiconductor substrate of a first conductivity type, a first semiconductor region of a second conductivity type constituted by a diffusion layer formed on a first major surface side of the semiconductor substrate and having a predetermined depth, a portion of an end of the diffusion layer being an on-gate region, the portion of the end of the diffusion layer being interposed between other portions of the diffusion layer and being shallower than each of other portions of the diffusion layer, a second semiconductor region of the first conductivity type formed in the first semiconductor region, a first electrode formed to be in contact with the second semiconductor region, a third semiconductor region of a second conductivity type formed on a second major surface side of the semiconductor substrate, and a second electrode formed to be in contact with the third semiconductor region.

The widths of the first semiconductor region and the second semiconductor region are gradually decreased near the shallow portion of the diffusion layer serving as the on-gate region, and the width of a cathode electrode formed in the second semiconductor region is gradually decreased near the shallow portion of the diffusion layer.

The semiconductor device further comprises a fourth semiconductor region of the second conductivity type semiconductor substrate to be adjacent to the first semiconductor region and to interpose the semiconductor substrate with an adjacent fourth semiconductor region, and a gate electrode formed on the semiconductor substrate, the first semiconductor region including the shallow portion of the diffusion layer, and the fourth semiconductor region through an insulating film, wherein the first electrode is also formed to be in contact with the fourth semiconductor region.

In order to achieve the above objects, according to the sixth aspect of the present invention, there is provided a semiconductor device comprising a semiconductor substrate of a first conductivity type, a first semiconductor region of a second conductivity type formed on a first major surface side of the semiconductor substrate, a second semiconductor region of the first conductivity type formed in the first semiconductor region, a third semiconductor region of the second conductivity type formed on a second major surface side of the semiconductor substrate, a fourth semiconductor region of the second conductivity type formed to be adjacent to the first semiconductor region and to interpose the semiconductor substrate with an adjacent fourth semiconductor region, a gate electrode formed on the semiconductor substrate, the first semiconductor region, and the fourth semiconductor region through an insulating film, a first electrode formed to be in contact with the fourth semiconductor region, a second electrode formed to be in contact with the third semiconductor region, a first low-resistance film formed in the first semiconductor region on the fourth semiconductor region side to be in contact with only the first semiconductor region (except for on-gate region), and a second low-resistance film formed in the fourth semiconductor region on the first semiconductor region side to be in contact with both the fourth semiconductor region and the first electrode.

According to the above structure, the first electrode of the semiconductor device is connected to both the first semiconductor region and the second semiconductor region. Therefore, a hole current in a turn-off operation can be discharged from the short-circuited portion between the first semiconductor region and the second semiconductor region, and turn-off characteristics can be more improved.

An impurity region formed immediately under the gate electrode is connected to the fourth semiconductor region to assure the breakdown voltage of the device. In other words, since the fourth semiconductor region, a hole current of the on-gate portion in which the hole current is not easily discharged can be discharged to the first electrode through the impurity regions (the fourth semiconductor regions) in the turn-off operation, thereby improving the turn-off characteristics.

The first impurity region is constituted by a plurality of diffusion layers, and the depth of a portion where the diffusion layers are in contact with each other is smaller than that of each of the portions of the diffusion layers. For this reason, the shallow portion has the same effect as that obtained when an impurity concentration is decreased, electrons are easily injected from the fourth semiconductor region into the semiconductor substrate in a turn-on operation, and the turn-on characteristics can be improved without degrading the turn-off characteristics.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2A to 2C are views showing a turn-on operation of the semiconductor device in FIG. 1;

FIG. 6 is a plan view showing the semiconductor device in FIG. 5;

FIG. 7 is a view showing a semiconductor device according to another embodiment of the first aspect of the present invention;

FIG. 16 is a view showing a semiconductor device according to the first embodiment of the second aspect of the present invention;

FIG. 19 is a view showing a semiconductor device according to the second embodiment of the second aspect of the present invention;

FIG. 21 is a view showing a semiconductor device according to the third embodiment of the second aspect of the present invention;

FIG. 28A to 28C a view showing a turn-on operation of the semiconductor device in FIG. 27;

FIG. 31A to 31C are a view showing a turn-on operation of the semiconductor device in FIG. 30;

FIG. 33 is a view showing a semiconductor device according to the third embodiment of the third aspect of the present invention;

FIG. 34 is a view showing a semiconductor device according to the first embodiment of the fourth aspect of the present invention;

FIG. 40 to 40C are a view showing a turn-off operation of the semiconductor device in FIG. 38;

FIGS. 45 and 46 are views showing a method of manufacturing a semiconductor device according to the first embodiment of the fifth aspect of the present invention;

FIG. 48A to 48C are a view showing a turn-off operation of the semiconductor device in FIG. 42;

FIG. 54A to 54C are a view showing a turn-on operation of the semiconductor device in FIG. 50;

FIG. 55A to 55C are a view showing a turn-off operation of the semiconductor device in FIG. 50;

FIG. 62 is a view showing a modification of the semiconductor device in FIG. 58;

FIG. 63 is a view showing a semiconductor device according to the second embodiment of the sixth aspect of the present invention;

DETAILED DESCRIPTION OF THE PREFERRED EMBODIMENTS

An embodiment of the present invention will be described below with reference to the accompanying drawings.

The first aspect of the present invention will be described below.

Figure 5:
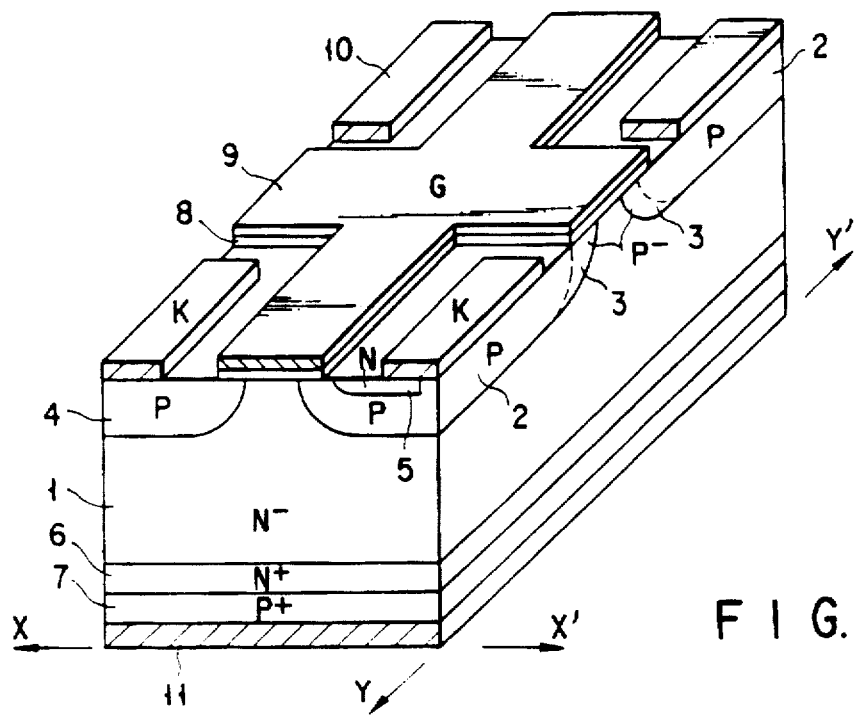
FIG. 5 is a view showing a semiconductor device according to an embodiment of the first aspect of the present invention.

FIG. 5 shows a semiconductor device according to an embodiment of the first aspect of the present invention, and FIG. 6 is a plan view showing the semiconductor device in FIG. 5. Referring to FIGS. 5 and 6, reference numeral 1 denotes an $n^-$-type semiconductor substrate; 2, a p-type base region; 3, $p^-$-type base regions; 4, a p-type base region; 5, an n-type emitter region; 6, an $n^+$-type buffer layer; 7, a lower-surface $p^+$-type emitter layer; 8, a gate oxide film; 9, a polysilicon gate electrode; 10, cathode electrodes; and 11, an anode electrode.

The present invention of the first aspect of the present invention has the following characteristic feature. That is, the cathode electrode 10 is connected to both the p-type base region 2 and the n-type emitter region 5 to short-circuit the p-type base region 2 to the n-type emitter region 5 (shorted emitter structure).

Figure 8:
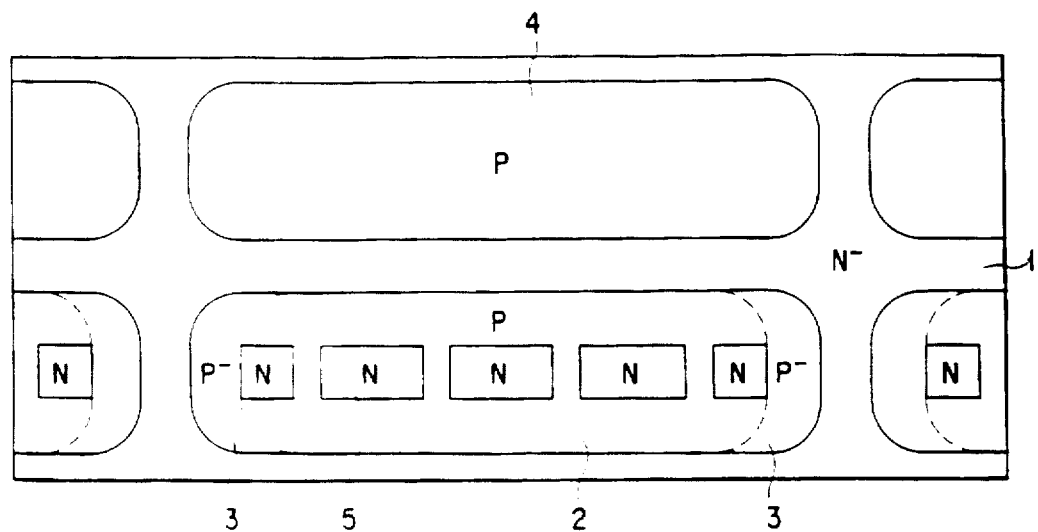
FIG. 8 is a plan view showing the semiconductor in FIG. 7.
Figure 9:
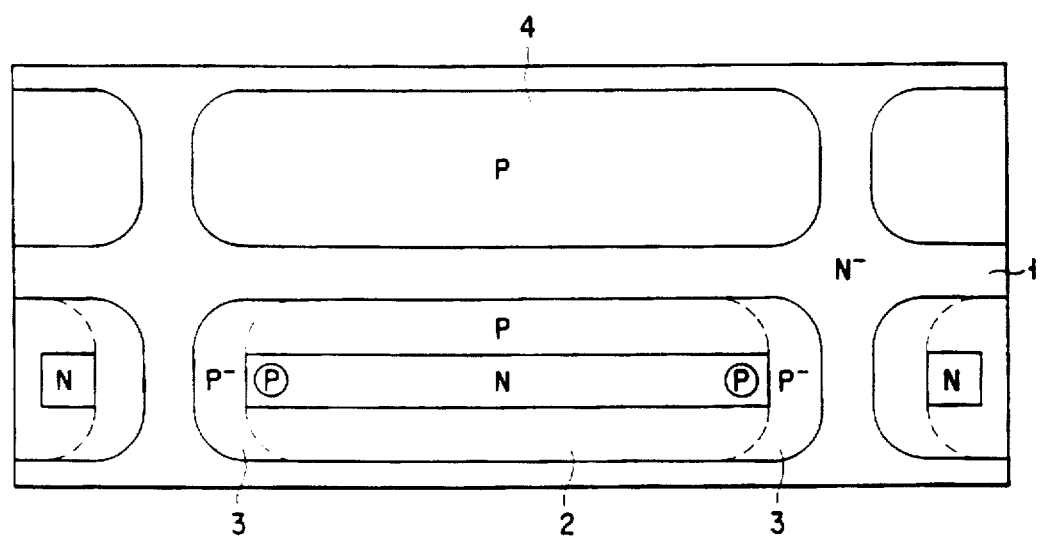
FIG. 9 is a view showing a semiconductor device according to still another embodiment of the first aspect of the present invention.

Therefore, the n-type emitter region 5, as shown in FIGS. 5 and 6, may be formed in the p-type base region 2 to have a long stripe-like shape, or, as shown in FIGS. 7 and 8, a plurality of n-type emitter regions 5 may be formed in the p-type base region 2 at predetermined intervals. In addition, the n-type emitter region 5, as shown in FIG. 9, may be formed such that the p-type base region 2 appears on the substrate surface near the $p^-$-type base region 3.

The steps in manufacturing the semiconductor device of the first aspect of the present invention will be briefly described below. The $n^+$-type buffer layer 6 and the lower-surface p⁺-type emitter layer 7 are formed on the n⁻-type semiconductor substrate 1. The gate oxide film 8 and the polysilicon gate electrode 9 are formed. Thereafter, the p-type base region 2, the p⁻-type base regions 3, the p-type source region 4, and the n-type emitter region 5 are respectively formed in the surface regions of the substrate 1 by diffusion. Finally, the cathode electrodes 10 and the anode electrode 11 are formed.

According to the above arrangement, the semiconductor device of the first aspect of the present invention has a shorted emitter structure in which the cathode electrode 10 is connected to both the p-type base region 2 and the n-type emitter region 5. For this reason, turn-off characteristics which pose problems in the prior art can be improved.

That is, in a conventional structure, in order to improve the turn-off characteristics, the concentrations of the p-type base region 2 and the p-type source region 4 are increased, and the resistance of a path, i.e., the p-type base region 2→a p-channel inversion layer →the p-type source region 4→the cathode electrode 10, formed in a turn-off operation, for discharging the hole current component of a main current is decreased, so that holes are efficiently discharged. However, when only this method is used, the efficiency of discharging holes is dependent on only the potential difference between the main current portion and the cathode electrodes. For this reason, the efficiency of discharging holes is limited to a predetermined value. That is, when the main current becomes larger, the number of electrons injected from the n-type emitter region is increased, and the number of holes injected in accordance with the injection of electrons is increased. For this reason, when holes are discharged from only the p-channel gate portion, the main current cannot be easily cut off.

According to the present invention, not only holes are discharged from the p-channel gate portion, but also the cathode electrode 10 is connected to both the p-type base region 2 and the n-type emitter region 5 to short-circuit the p-type base region 2 to the n-type emitter region 5. For this reason, the hole components of the main current can be discharged directly from the p-type base region 2, and can be directly discharged from the p-channel inversion layer to the cathode electrode 10 through the p-type source region 4. The efficiency of discharging holes in the turn-off operation can be increased.

Figure 11:
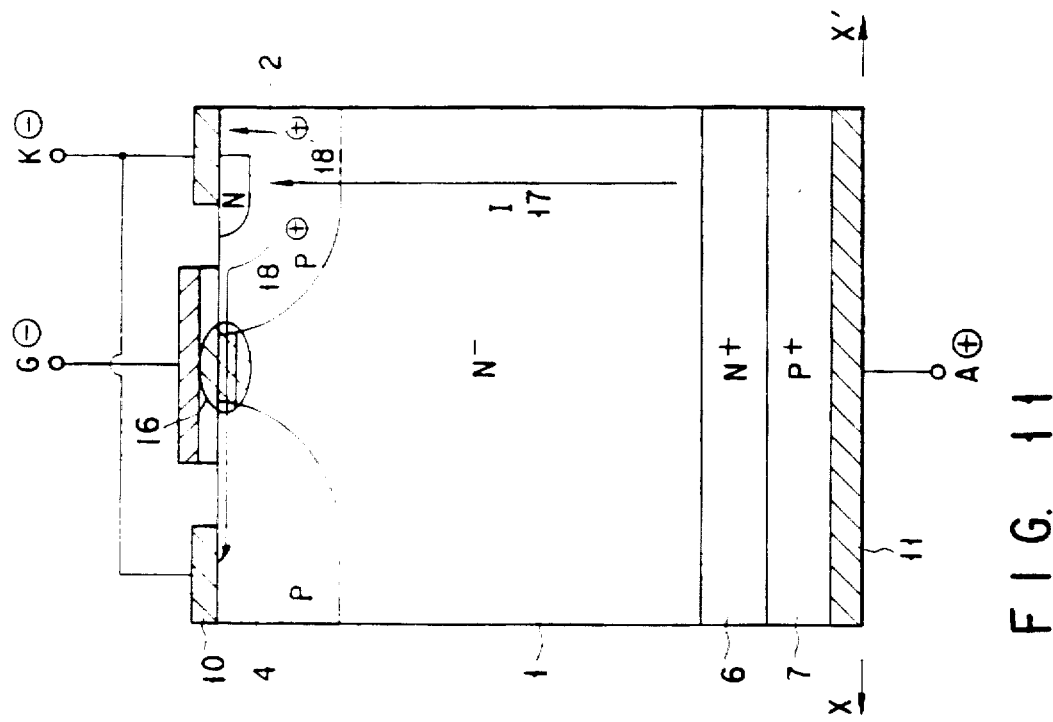
FIGS. 11 and 12 are views showing a turn-off operation of the semiconductor device of the first aspect of the present invention.
Figure 10:
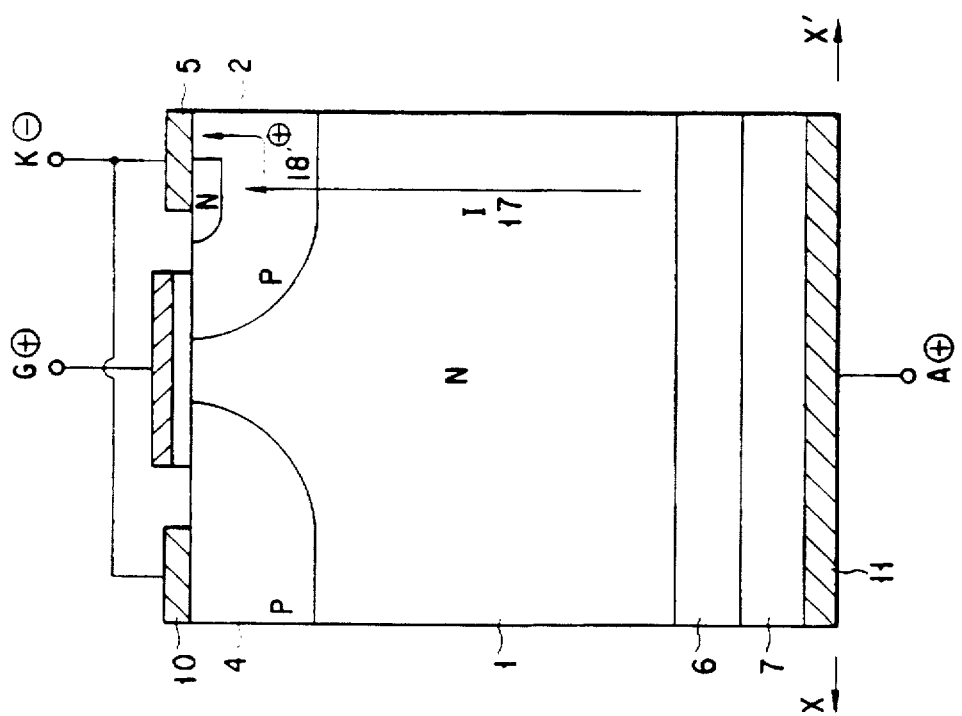
FIG. 10 is a view showing a turn-on operation of the semiconductor device of the first aspect of the present invention.
Figure 12:
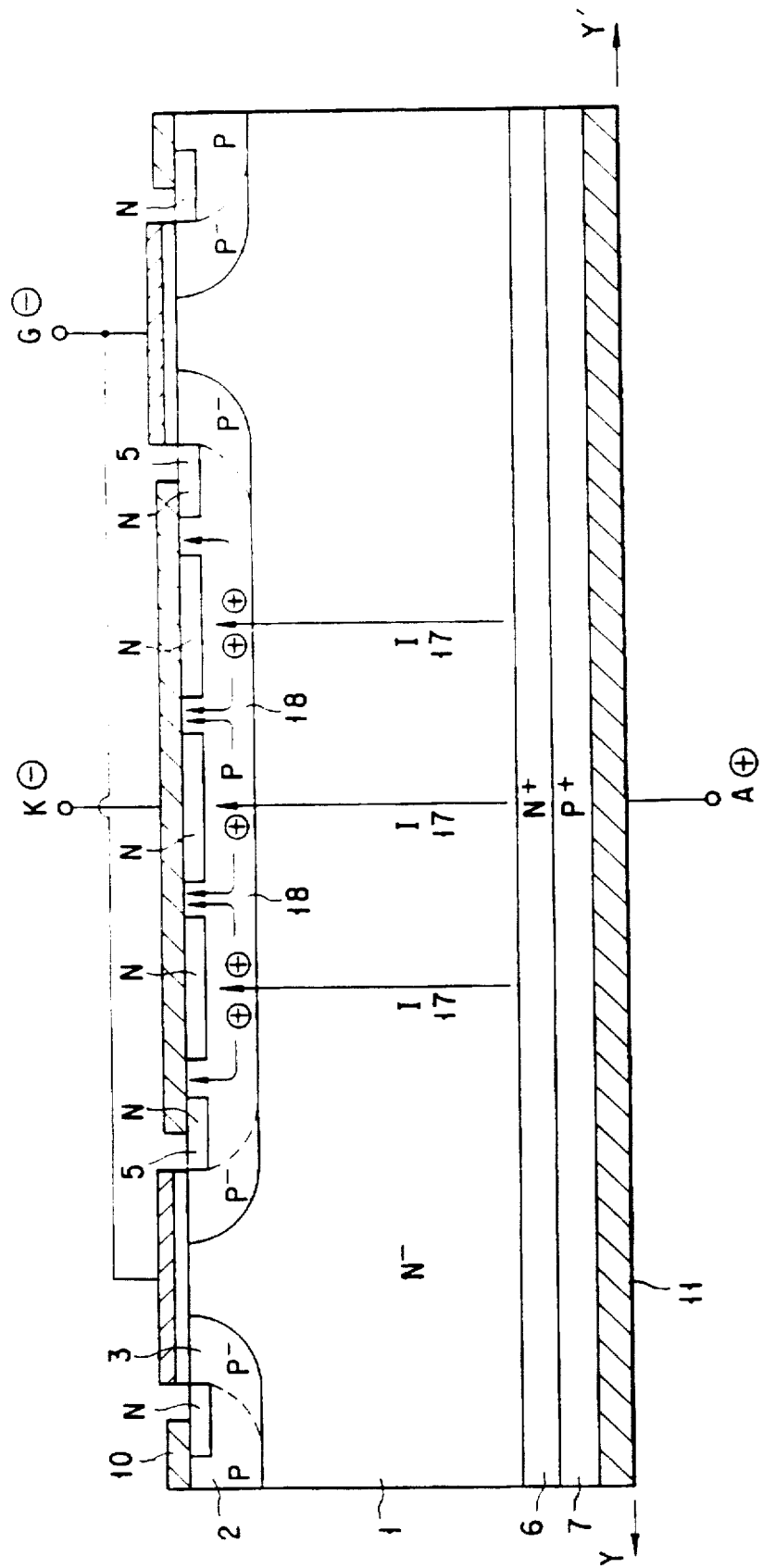

For example, as shown in FIG. 10, an anode is biased negative, cathodes are biased positive, and a main current 17 flows. In this state, when the gate is biased negative with respect to the cathode, an n-channel region which is formed during the turn-on operation disappears. In addition, as shown in FIGS. 11 and 12, a p-channel inversion layer 16 is formed on the surface of the n⁻-type base region (substrate) 1 between the p-type base region 2 and the p-type source region 4, and the path, i.e., the p-type base region 2→the p-channel inversion layer→the p-type source region 4→the cathode electrode 10, is formed. In addition, since the cathode electrode 10 is also connected to the p-type base region 2, the hole components of the main current are also discharged through a path, i.e., the p-type base region 2→the cathode electrode 10.

More specifically, since the hole components of the main current are discharged to the cathode electrode through the two paths, turn-off characteristics are improved compared with a conventional method using only one path.

Even when the main current 17 flows in the turn-on state, the hole components of the main current are discharged from a portion where the p-type base region is short-circuited to the cathode electrode, as a matter of course.

In the first embodiment, a so-called shorted emitter structure has been described. However, the shapes and area ratios of means, such as the p-type base region 2, the n-type emitter region 5, and the cathode electrodes 10, for short-circuiting the p-type base region 2 to the n-type emitter region 5 are not limited to specific ones as long as the p-type base region is short-circuited to the n-type emitter region by the cathode electrode.

Figure 13:
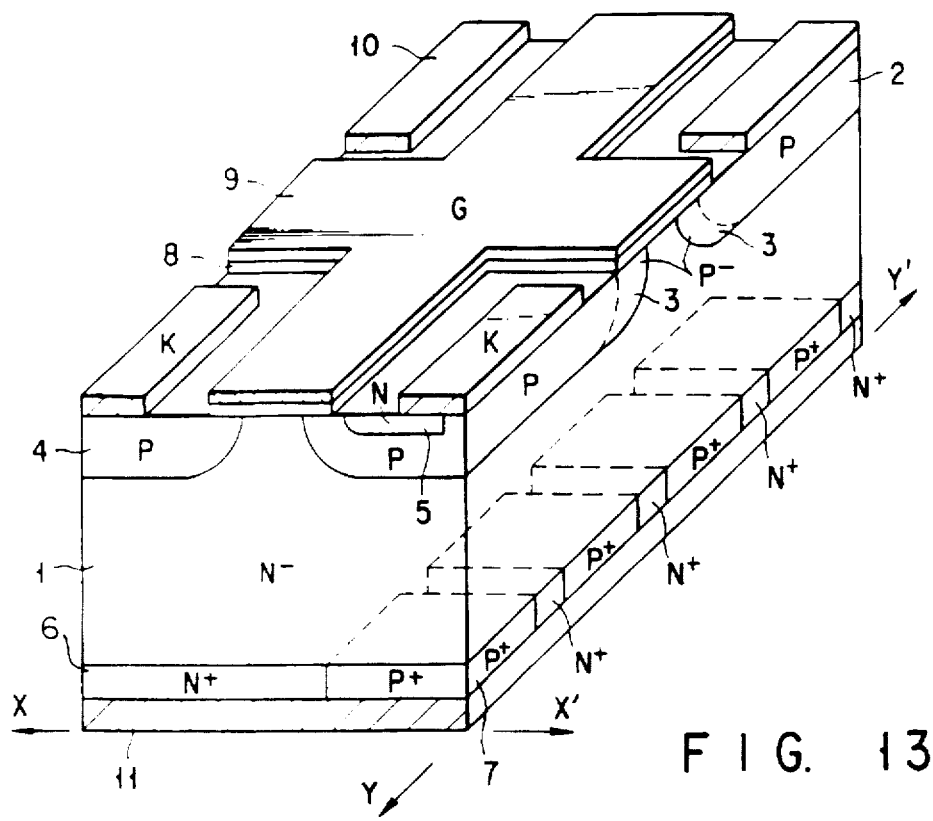
FIG. 13 is a view showing a semiconductor device according to still another embodiment of the first aspect of the present invention.

The semiconductor device of the first aspect of the present invention, as shown in FIG. 13, can also be applied to a structure in which the anode electrode 11 is connected to the n⁺-type buffer layer 6 and the lower-surface p⁺-type emitter layer 7 to short-circuit the corresponding n⁺-type buffer layer 6 to the corresponding lower-surface p⁺-type emitter layer 7. The second aspect of the present invention will be described below.

Figure 14:
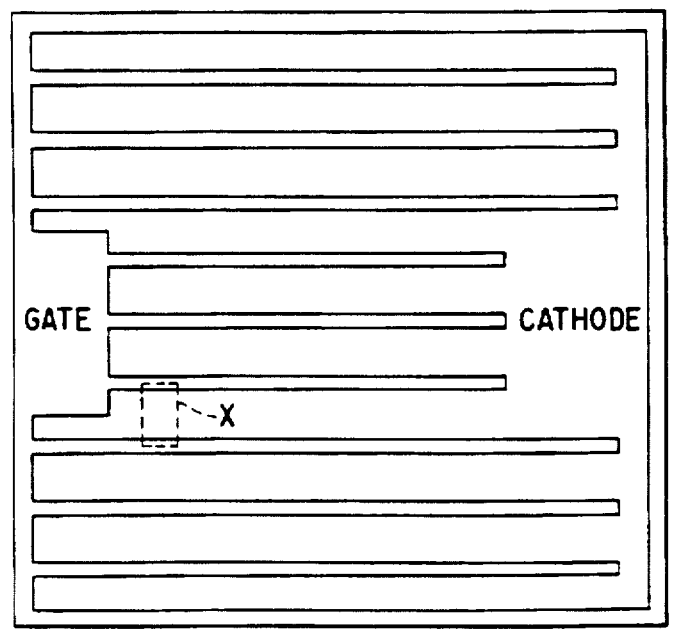
FIG. 14 is a view showing a pattern of an electrode on a chip on which the semiconductor device of the first aspect of the present invention is formed.
Figure 15:
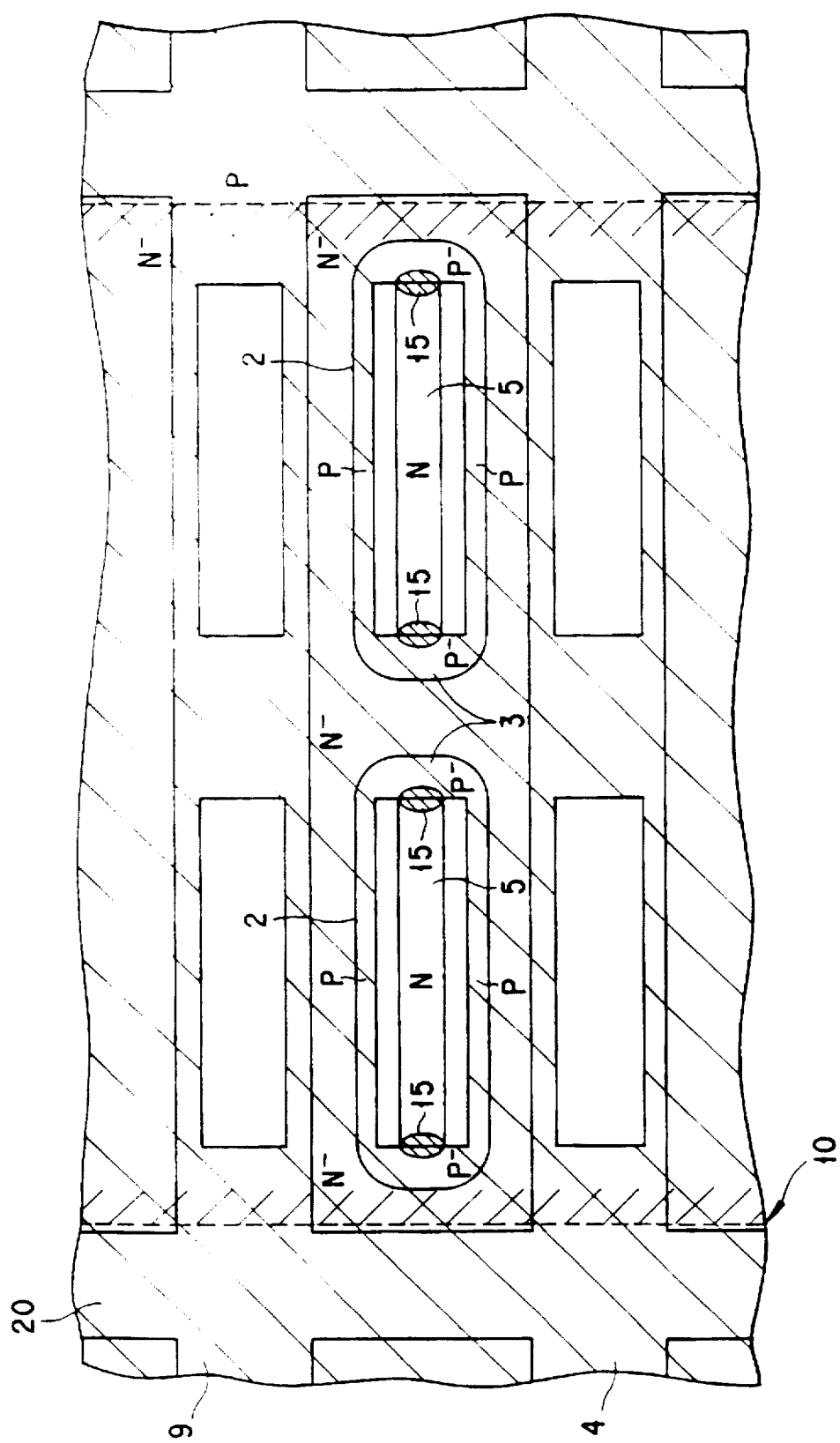
FIG. 15 is a view showing a part enclosed by a dotted line X in FIG. 14.

FIGS. 14 to 16 show a semiconductor device according to the first embodiment of the second aspect of the present invention. Note that, referring to FIGS. 14 to 16, reference numeral 1 denotes an n⁻-type semiconductor substrate; 2, a p-type base region; 3, p⁻-type base regions; 4, a p-type source region; 5, an n-type emitter region; 6, an n⁺-type buffer layer; 7, a lower-surface p⁺-type emitter layer; 8, a gate oxide film; 9, a polysilicon gate electrode; 10, cathode electrodes; 11, an anode electrode; and 20, an auxiliary p-type emitter region.

Fig. 14 is a schematic view showing a pattern arrangement of electrodes on a chip on which the semiconductor device according to the second aspect of the present invention is formed. FIG. 15 shows a portion enclosed by a dotted line X in FIG. 14 in detail. The semiconductor device according to the second aspect of the present invention, for example, as shown in FIG. 16, since the auxiliary p-type emitter region 20 formed immediately under the gate electrode to assure a high breakdown voltage of the device is used to discharge holes in a turn-off operation, the auxiliary p-type emitter region 20 is electrically connected to the p-type source region 4.

The steps in manufacturing the semiconductor device of the second aspect of the present invention will be briefly described below. The n⁺-type buffer layer 6 and the lower-surface p⁺-type emitter layer 7 are formed on the n⁻-type semiconductor substrate 1. The auxiliary p-type emitter region 20 is formed by diffusion. The gate oxide film 8 and the polysilicon gate electrode 9 are formed. Thereafter, the p-type base region 2, the p⁻-type base regions 3, and the p-type source region 4 are respectively formed in the surface regions of the substrate 1 by diffusion. At this time, the p-type source region 4 can be simultaneously formed to be connected to each other. In this manner, the p-type source region 4 and the auxiliary p-type emitter region 20 have a pattern surrounding the p-type base region 2. Finally, the cathode electrodes 10 and the anode electrode 11 are formed.

An operational principle of the semiconductor device of the second aspect of the present invention will be described below.

Figure 17A:
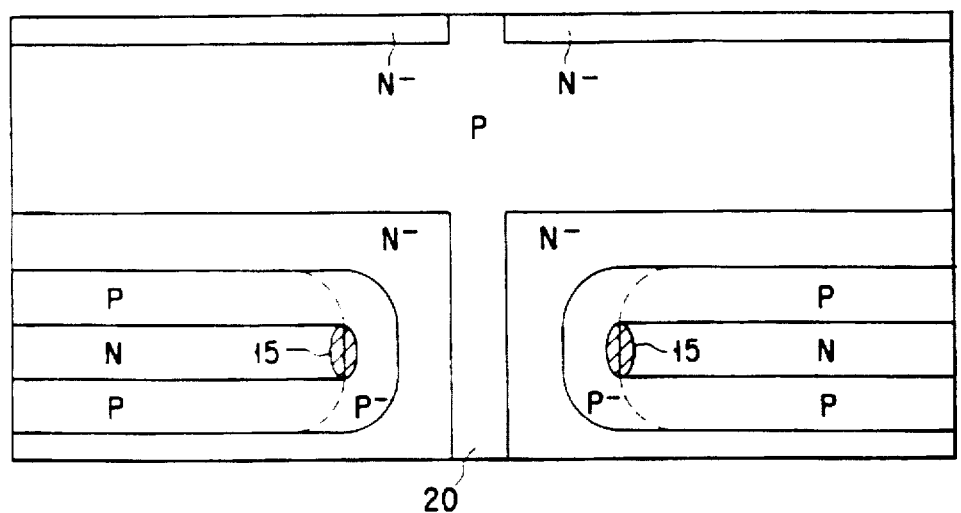
FIG. 17A to 17C are a view showing a turn-on operation of the semiconductor device in FIG. 16.
Figure 17B:
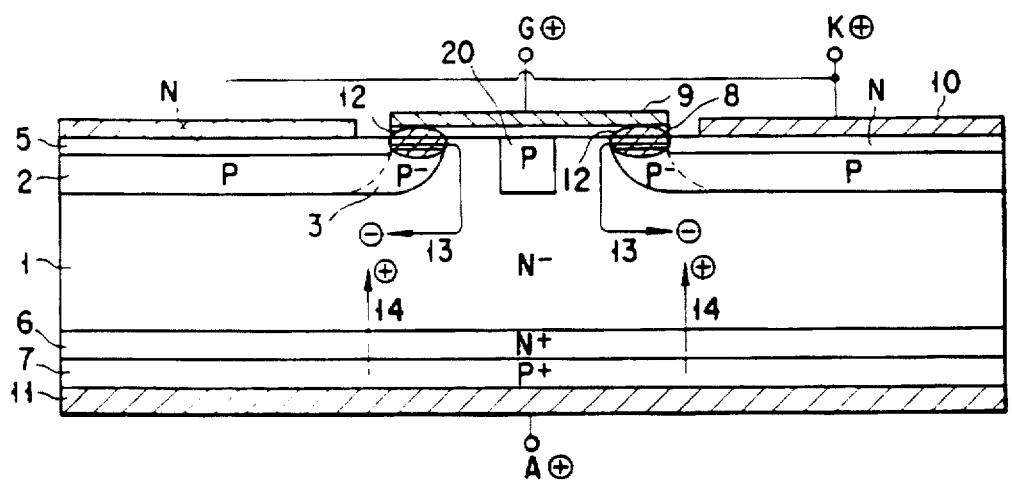
Figure 17C:
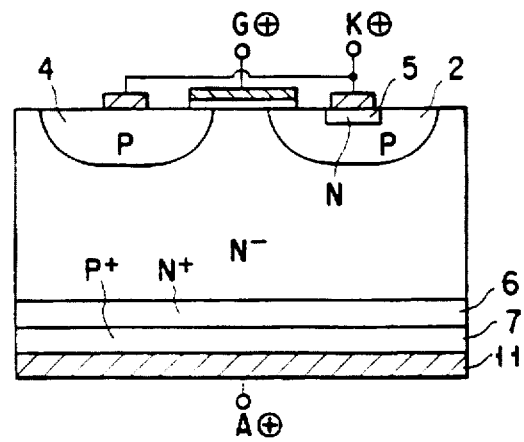

A turn-on operation will be described below with reference to FIGS. 17A to 17C. An anode is biased negative, cathodes are biased positive, and a gate is biased positive. In this state, an n-channel inversion layer 12 is formed on the surface of each p⁻-type base region 3, and electrons 13 are injected from the n-type emitter region 5 into the n⁻-type base region (substrate) 1. Holes 14 are then induced, and the holes 14 are injected into the n⁻-type base region 1. As a result, conductivity modulation occurs in the n⁻-type base region 1, and portions 15 where the p⁻-type base regions 3 are brought into contact with the n-type emitter region 5 become early turn-on areas, thereby starting a turn-on operation. When a turn-on region extends over the entire area of the n-type emitter region 5, the device is completely turned on.

A turn-off operation will be described below with reference to FIGS. 18A to 18C. The anode is biased positive, the cathode is biased negative, and the main current 17 flows from the anode to the cathode. In this state, the n-channel region 12 which is formed during the turn-on operation disappears. In addition, a p-channel inversion layer 16 is formed on the n⁻-type base region (substrate)1 between the p-type base region 2 and the p-type source region 4, and a p-channel inversion layer 21 is formed on the surface of the n⁻-type base region 1 between the p⁻-type base region 3 and the auxiliary p-type emitter region 20.

For this reason, holes 22 which are present in the n⁻-type base region 1 and the p-type base region 2 immediately below the n-type emitter region 5 are discharged through two paths, i.e., a path in the order of the p⁻-type base region 3→the p-channel inversion layer 16→the p-type source region 4→the cathode electrode 10 and a path in the order of the auxiliary p-type emitter region 20→the p-type source region 4→and the cathode electrode 10.

With the above operation, the injection of electrons from the n-type emitter region 5 is stopped, and the main current 17 does not flow. A turn-off operation is started from each region 19 where the n-type emitter region 5 is opposite to the p-type base region 2, and formation of the p-channel inversion layer 21 causes the holes 22 to be discharged from an on-gate region in which holes are most easily left. Therefore, in addition to in the region 19, in each region 23 where the n-type emitter region 5 is opposite to a p⁻-type base region 3, a turn-off operation is started. The turn-off region extends from the regions 19 and 23 over the entire area of the n-type emitter region 5, and the device is turn off.

FIG. 19 shows a semiconductor device according to the second embodiment of the second aspect of the present invention. In this embodiment, a shorted emitter structure according to the first aspect of the present invention is combined with the semiconductor device according to the second aspect of the present invention.

An operational principle of the semiconductor device according to this embodiment will be described below. Note that, since a turn-off operation is performed in the same manner as that in the semiconductor device in FIG. 17, a description thereof will be omitted.

Figure 20A:
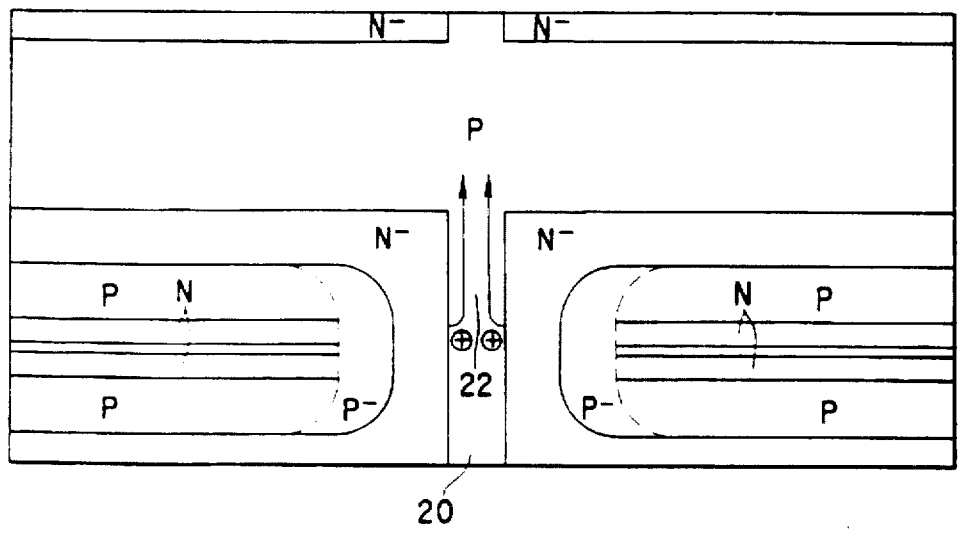
FIG. 20A to 20C are a view showing an operational principle of the semiconductor device in FIG. 19.
Figure 20B:
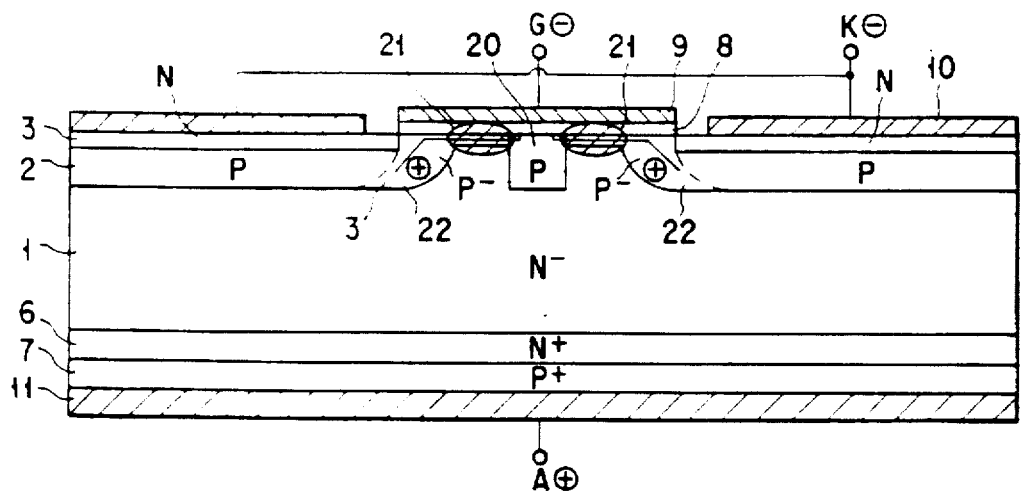
Figure 20C:
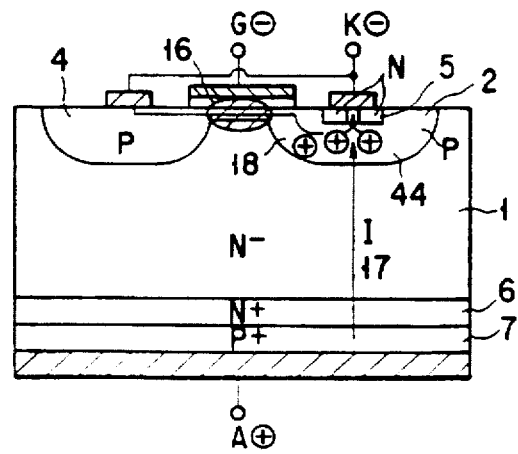
Figure 22A:
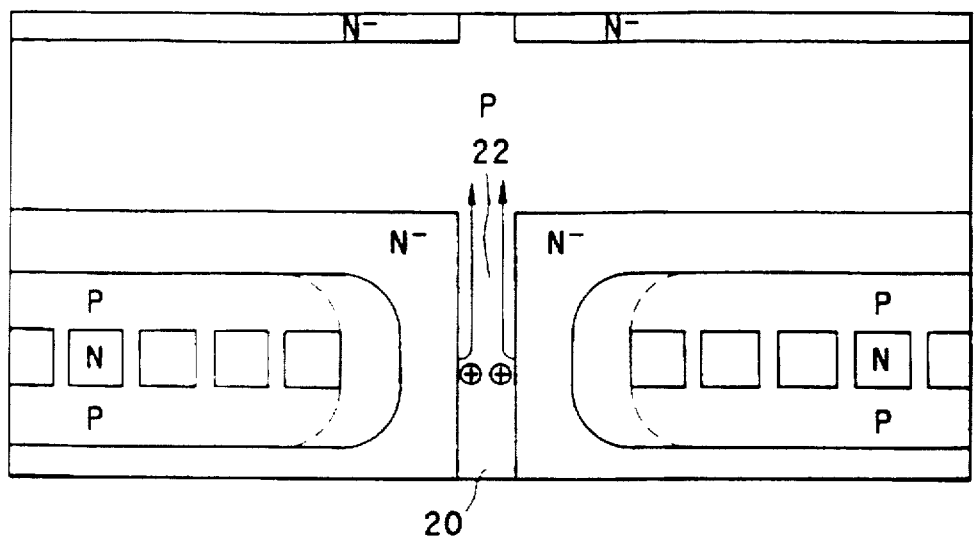
FIG. 22A to 22C are a view showing an operational principle of the semiconductor device in FIG. 21.
Figure 22B:
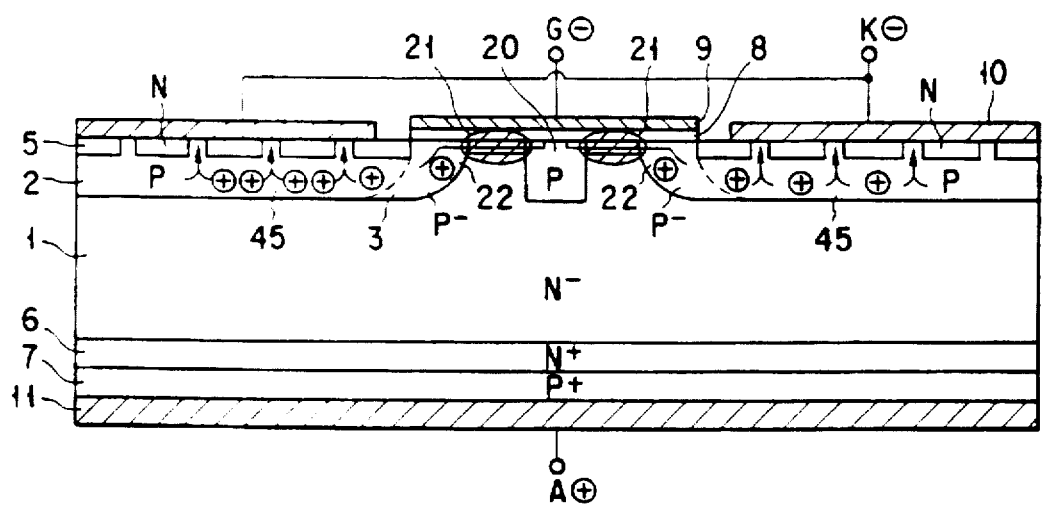
Figure 22C:
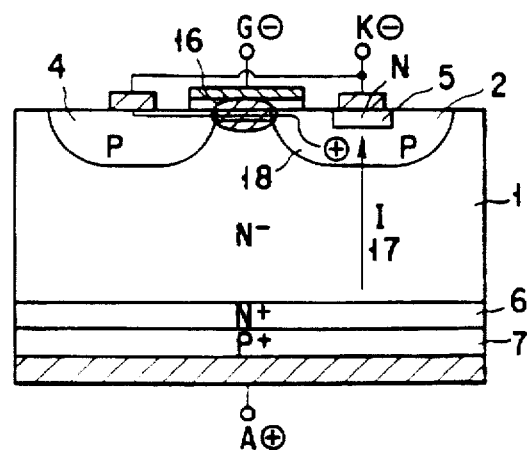

A turn-off operation will be described below with reference to FIGS. 20A to 20C. An anode is biased positive, cathodes are biased negative, and a main current 17 flows from the anode to the cathode. In this state, when a gate is biased positive with respect to the cathode, an n-channel region 12 which is formed during a turn-on operation disappears. In addition, a p-channel inversion layer 16 is formed on the surface of an n⁻-type base region 1 between a p-type base region 2 and a p-type source region 4, and a p-channel inversion layer 21 is formed on the surface of the n⁻-type base region 1 between each p⁻-type base region 3 and an auxiliary p-type emitter region 20.

For this reason, holes 18 in the main current are discharged through a path, i.e., the p-type base region 2→the p-channel inversion layer 16→the p-type source region 4→a cathode electrode 10, and holes 22 are discharged through a path, i.e., the p⁻-type base region 3→the p-channel inversion layer 21→the auxiliary p-type emitter region 20→the p-type source region 4→the cathode electrode 10.

Since the semiconductor device of this embodiment has the shorted emitter structure in which the p-type base region 2 is connected to the cathode electrode 10, holes 44 are discharged through a path, i.e., the p-type base region 2→the cathode electrode 10. In this manner, the efficiency of discharging holes is further increased. In the above operation, injection of electrons from an n-type emitter region 5 is stopped, and the main current 17 does not flow. As a result, the device is turn off.

FIGS. 21 and 22A to 22C show a semiconductor device according to the third embodiment of the second aspect of the present invention. In this embodiment, a shorted emitter structure according to the first aspect of the present invention is combined with a semiconductor device according to the second aspect of the present invention. Note that, since the semiconductor device according to this embodiment has the same structure as that of the second embodiment in FIG. 19 except for the shape of an n-type emitter region 5, an operational principle or the like thereof will be omitted.

Figure 23:
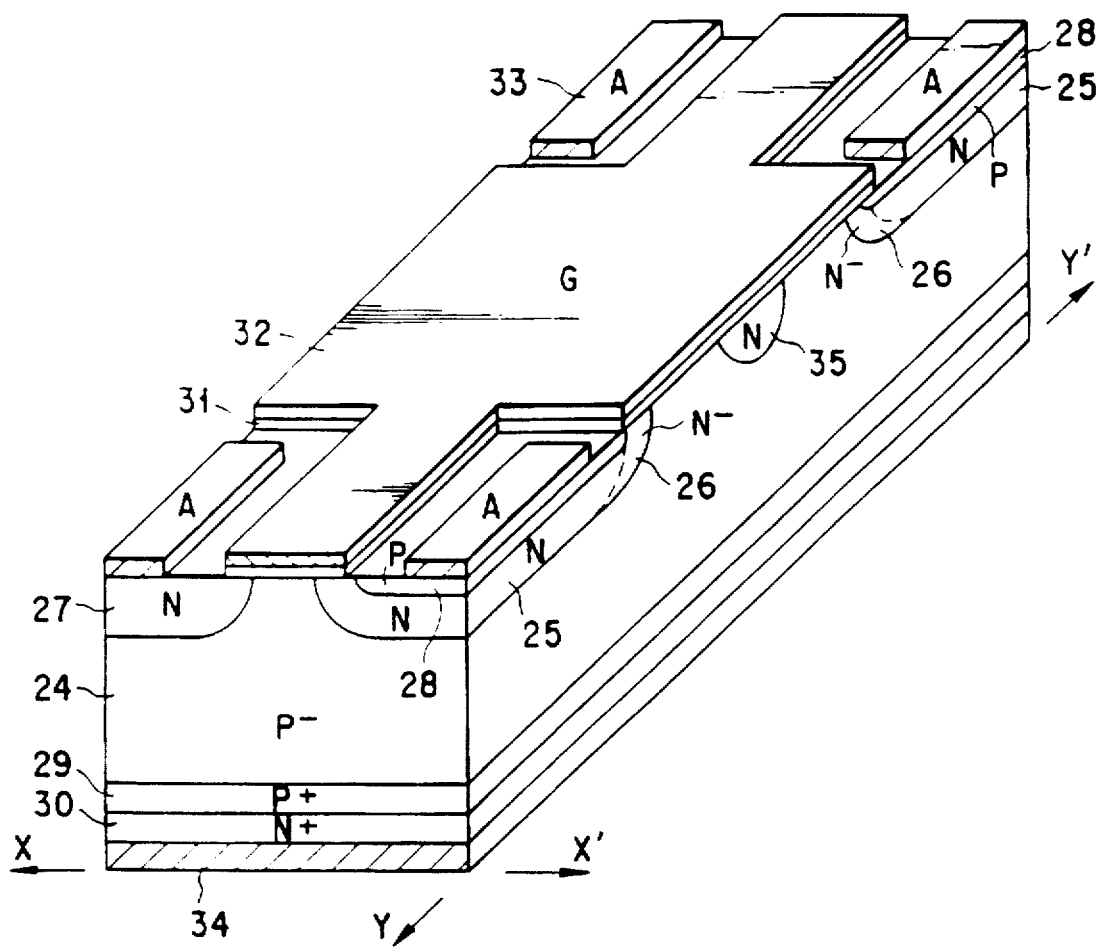
FIG. 23 is a view showing a semiconductor device according to the fourth embodiment of the second aspect of the present invention.

FIG. 23 is a semiconductor device according to the fourth embodiment of the second aspect of the present invention. In this embodiment, the conductivity type of the semiconductor device in FIG. 16 is reversed, i.e., the n⁻-type substrate 1 in FIG. 16 is replaced with a p⁻-type semiconductor substrate 24. Referring to FIG. 23, reference numeral 24 denotes the p⁻-type semiconductor substrate; 25, an n-type base region; 26, n⁻-type base regions; 27, an n-type source region; 28, a p-type emitter region; 29, a p⁺-type buffer layer; 30, a lower-surface n⁺-type emitter layer; 31, a gate oxide film; 32, a polysilicon gate electrode; 33, anode electrodes; 34, a cathode electrode; and 35, an auxiliary n-type emitter region.

The steps in manufacturing the semiconductor device of this embodiment will be briefly described below. The p⁺-type buffer layer 29 and the lower-surface n⁺-type emitter layer 30 are formed on the p⁻-type semiconductor substrate 24. The auxiliary n-type emitter region 35 is formed by diffusion. The gate oxide film 31 and the polysilicon gate electrode 32 are formed. Thereafter, the n-type base region 25, the n⁻-type base regions 26, the n-type source region 27, and the p-type emitter region 28 are respectively formed in the surface regions of the substrate 24 by diffusion. At this time, the n-type source region 27 and the auxiliary n-type emitter region 35 can be simultaneously formed to be connected to each other. In this manner, the n-type source region 27 and the auxiliary n-type base region 25. Finally, the cathode electrode 33 and the anode electrodes 34 are formed.

An operational principle of the semiconductor of the present invention will be described below.

Figure 24A:
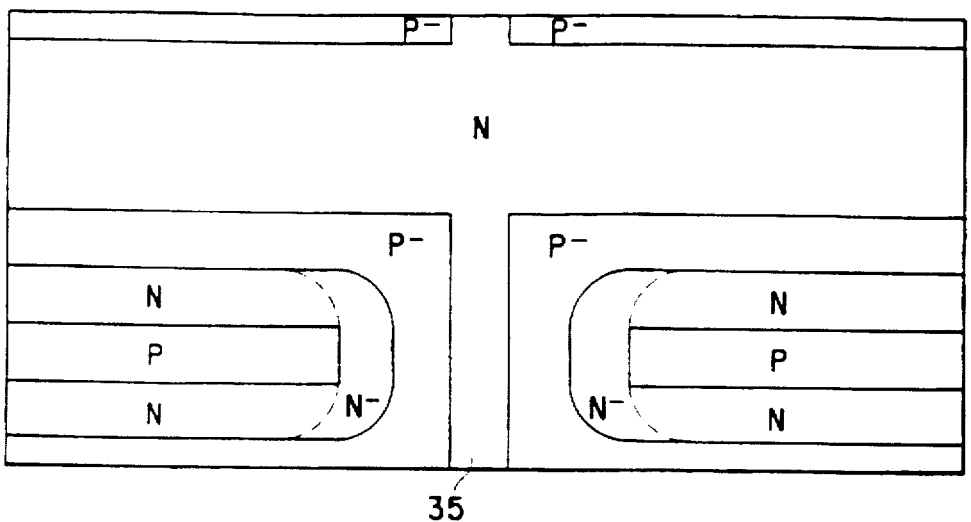
FIG. 24A to 24C are a view showing a turn-on operation of the semiconductor device in FIG. 23.
Figure 24B:
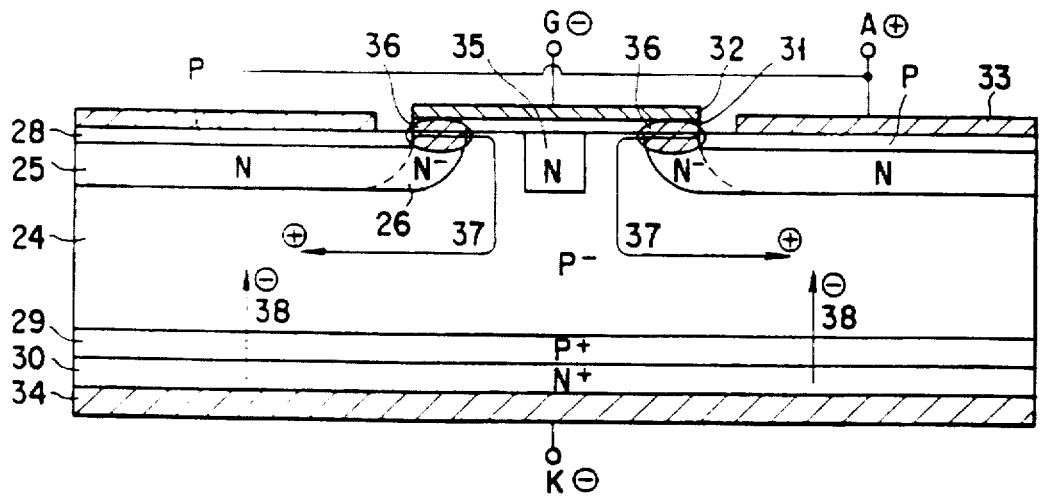
Figure 24C:
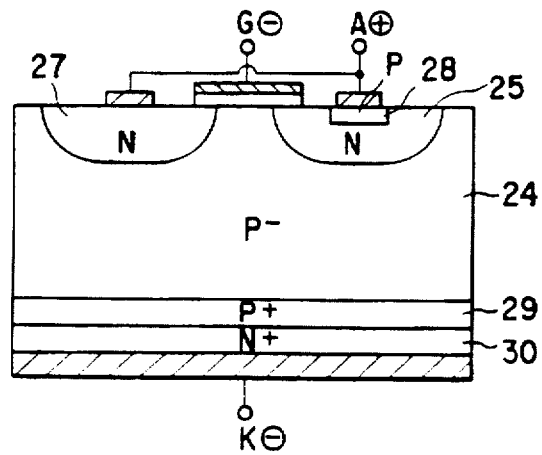

A turn-on operation will be described below with reference to FIG. 24A to 24C. Anodes are biased positive, a cathode is biased negative, and a gate is biased negative. In this case, a p-channel inversion layer 36 is formed on the surface of each n⁻-type base region 26, and holes 37 are injected from the p-type emitter region 28 into the p⁻-type base region (substrate) 24. In this manner, electrons 38 are injected from the lower-surface n⁺-type emitter layer 30 into the p⁻ type base region 24. As a result, conductivity modulation occurs in the p⁻-type base region 24, and portions 36 where the n⁻-type base regions 26 face the p-type emitter region 28 become early turn-on areas, thereby starting a turn-on operation. When a turn-on region extends over the entire area if the p-type emitter region 28, the device is completely turned on.

Figure 25A:
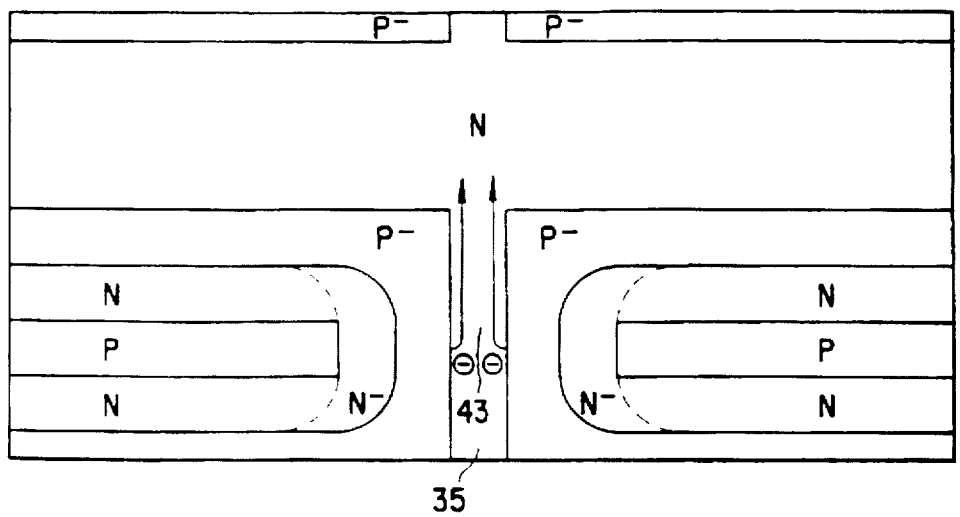
FIG. 25A to 25C are a view showing a turn-off operation of the semiconductor device in FIG. 23.
Figure 25B:
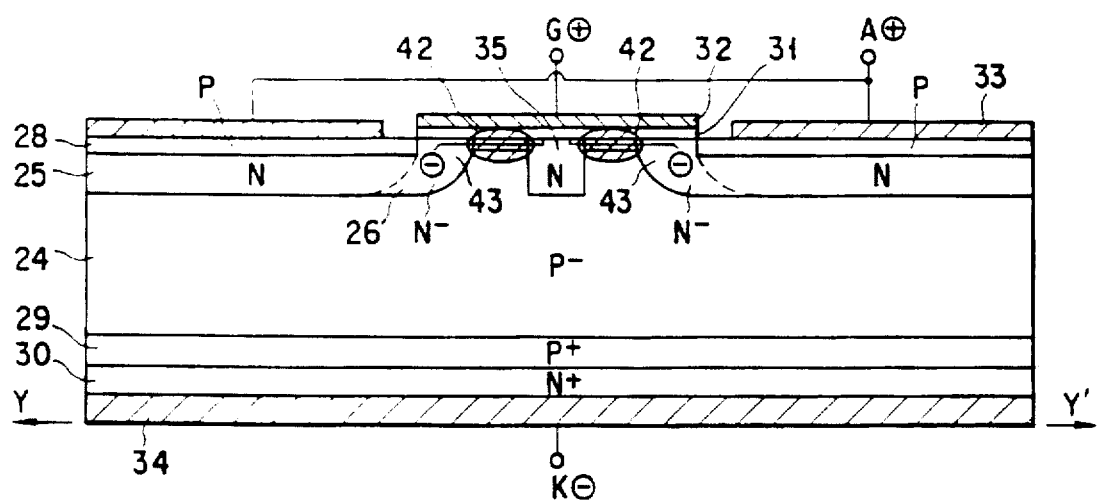
Figure 25C:
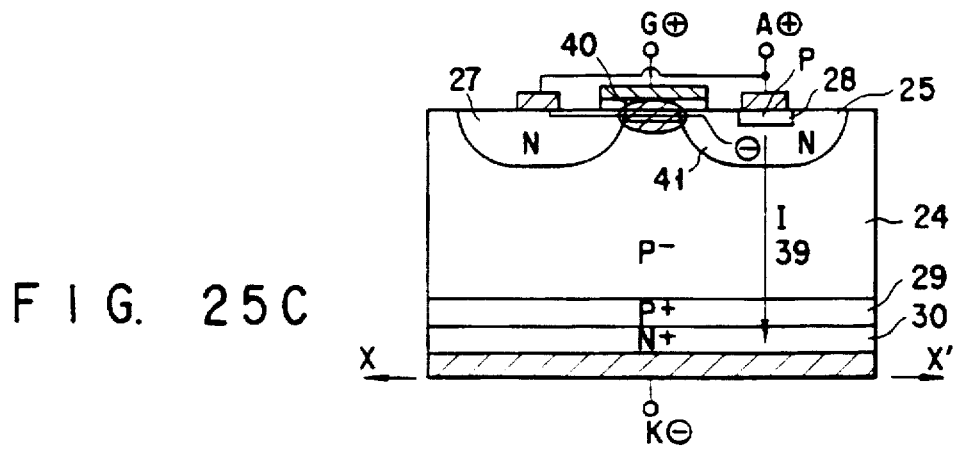

A turn-off operation will be described below with reference to FIG. 25A to 25C. The anodes are biased positive, the cathode is biased negative, and a main current 39 flows from the anodes to the cathode. In this state, when the gate is biased positive, the p-channel inversion layer 36 which is formed during the turn-on operation disappears. In addition, an n-channel inversion layer 40 is formed on the surface of the p⁻-type base region 24 between the n-type base region 25 and the n-type source region 27, and an n-channel inversion layer 42 is formed on the surface of the p⁻-type base region 24 between the n⁻-type base region 26 and the auxiliary n-type emitter region 35.

For this reason, electrons 41 of the main current are discharged through a path, i.e., the n-type base region 25→the n-channel inversion layer 40→the n-type source region 27→the anode electrode 33, and electrons 43 in the n-type base region 25 are discharged through a path, i.e., the n⁻-type base region 26→the n-channel inversion layer 42→the auxiliary n-type emitter region 35→the n-type source region 27→the anode electrode 33. With the above operation, injection of holes from the p-type emitter region 28 is stopped, and the main current does not flow. As a result, the device is turned off.

Figure 26:
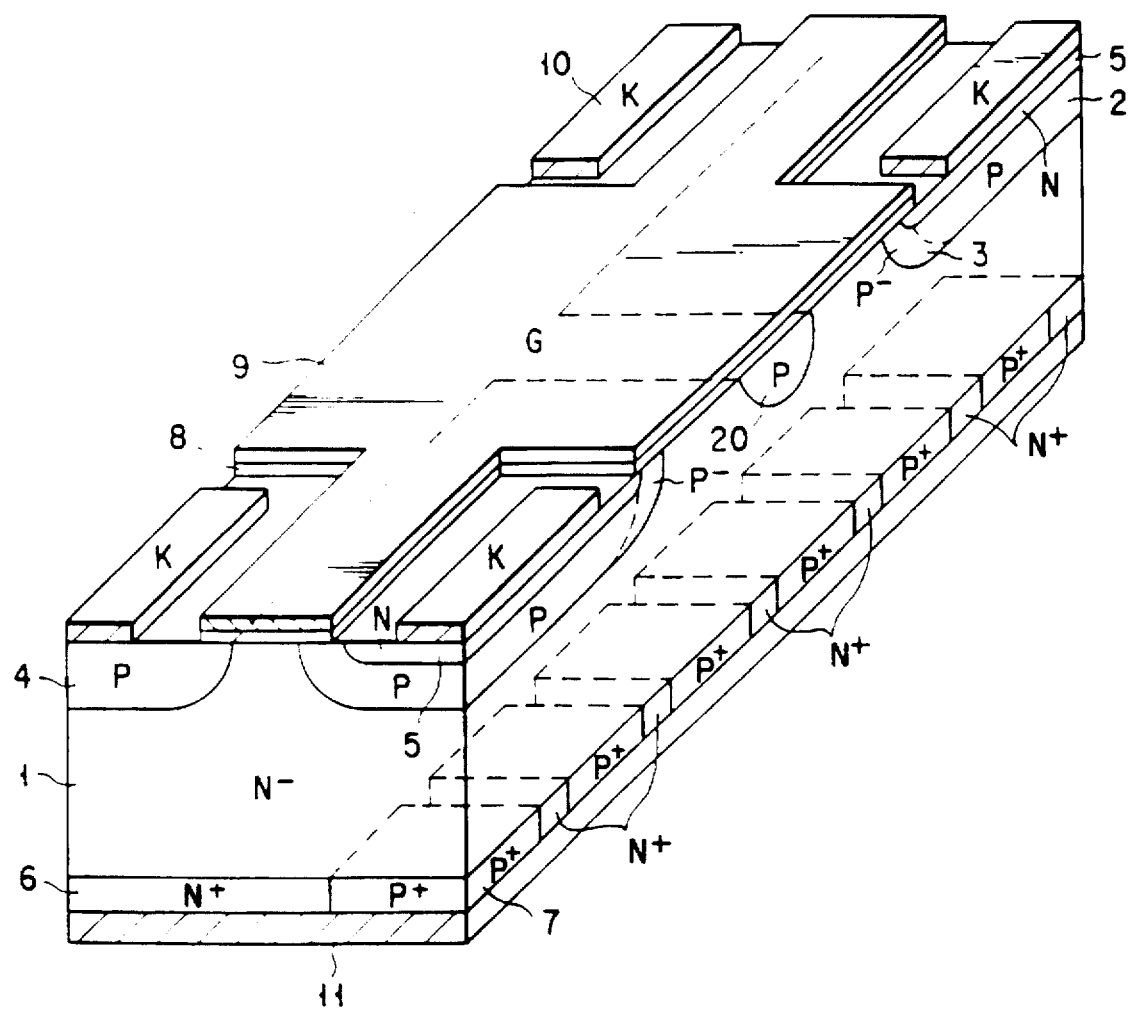
FIG. 26 is a view showing a semiconductor device according to still another embodiment of the second aspect of the present invention.

According to the first to fourth embodiments related to the second aspect of the present invention, the second aspect of the present invention can be effectively applied to a combination between these embodiments, e.g., a combination between the semiconductor device in FIG. 16 and the semiconductor device in FIG. 23. In addition, the second aspect of the present invention can also be applied to a structure in which, as shown in FIG. 26, the anode electrode 11 is connected to the n⁺-type buffer layer 6 and the lower-surface p⁺-type emitter layer 7 to short-circuit the corresponding n⁺-type buffer layer 6 to the corresponding lower-surface p⁺-type emitter layer 7.

According to the above arrangement, the semiconductor device of the second aspect of the present invention, the p-type source region 4 is formed integrally with the auxiliary p-type emitter region 20 and they are electrically connected to each other. In addition, the p-type source region 4 and the auxiliary p-type emitter region 20 have a pattern surrounding the p-type base region 2. In this manner, turn-off characteristics which pose problems in the prior art can be further improved.

More specifically, in order to improve the turn-off characteristics, the concentrations of the p-type base region 2 and the p-type source region 4 are decreased, and a method of decreasing the resistance of a path, i.e., p-type base region→p-channel inversion layer→p-type source region→cathode electrode, formed in the turn-off operation, for discharging the hole current component of the main current is used, thereby efficiently discharging holes. However, when only this method is used, although the turn-off operation can be easily performed by increasing the efficiency of discharging holes, the resistance of a path for discharging holes in the n-type emitter region 5 facing the p⁻-type base region 3 serving as an on-gate region is still high. For this reason, the holes are not easily discharged, and a portion which is turned on is left, so that the efficiency of discharging holes is limited to a predetermined value.

According to the second aspect of the present invention, the auxiliary p-type emitter region 20 electrically connected to the p-type source region 4 is formed in the n⁻-type base region (substrate) 1 near the p⁻-type base region 3 such that a turn-off operation occurs in the n-type emitter region 5 which is in contact with the p⁻-type base region 3 serving as the on-gate region. In this manner, since holes can also be discharged in the turn-off operation through a path, i.e., p⁻-type base region→p-channel inversion layer→auxiliary p-type emitter region p-type source region→cathode electrode, the turn-off operation is started from the almost entire area of the n-type emitter region. As a result, the turn-off efficiency is further increased.

Figure 18A:
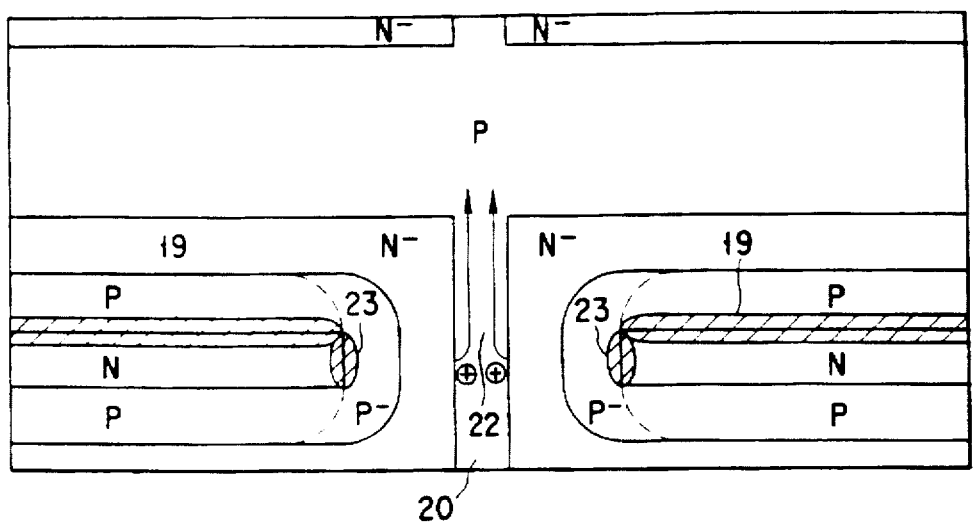
FIG. 18A to 18C are a view showing a turn-off operation of the semiconductor device in FIG. 16.
Figure 18B:
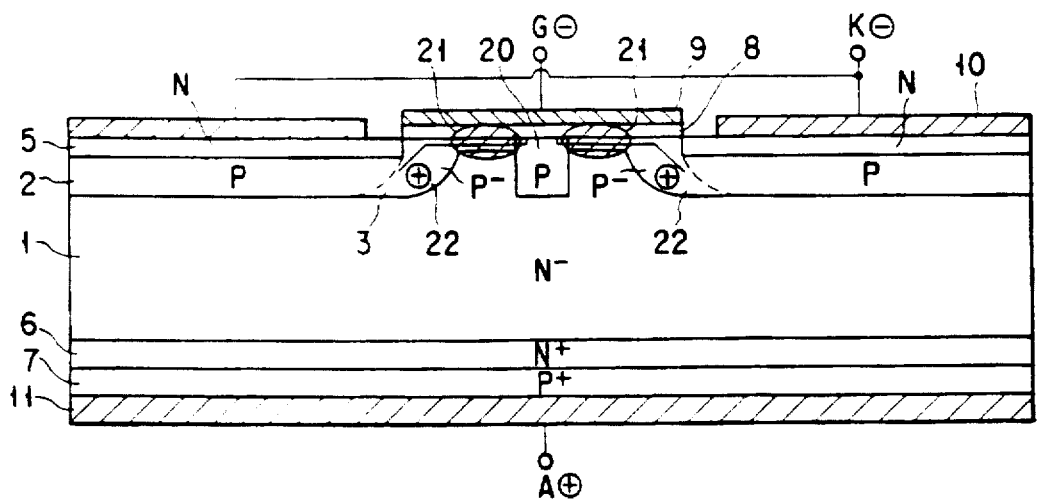
Figure 18C:
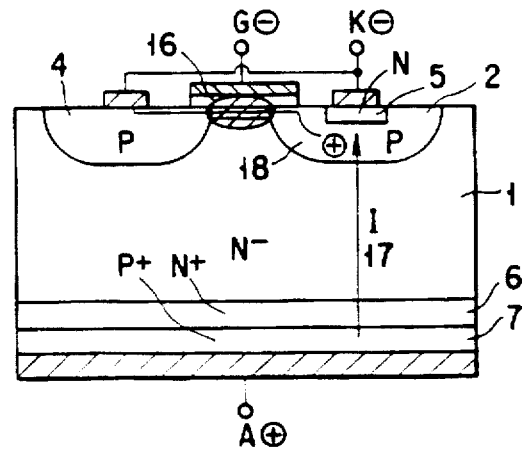

For example, as shown in FIG. 18A to 18C the auxiliary p-type emitter region 20 is formed near the p⁻-type base region 3, and the auxiliary p-type emitter region 20 is connected to the p-type source region 4. For this reason, the p-type source region 4 and the auxiliary p-type emitter region 20 are present at the entire periphery of the n-type emitter region 5. Although the auxiliary p-type emitter region 20 is not directly connected to the cathode electrode 10, the auxiliary p-type emitter region 20 is connected to the p-type source region 4. For this reason, the auxiliary p-type emitter region 20 is substantially connected to the cathode electrode 10.

Therefore, in this device, the anode is biased positive, the cathode is biased negative, and the main current flows from the anode to the cathode. In this state, when the gate is biased negative, the p-channel inversion layer 16 if formed on the surface of the n⁻-type base region (substrate) 1 between the p-type base region 2 and the p-type source region 4, and the p-channel inversion layer 21 is formed on the surface of the n⁻-type base region 1 between the p⁻-type base region 3 and the auxiliary p-type emitter region 20.

Most of the holes 18 are discharged from the main current through a path, i.e., the p-type base region 2→the p-channel inversion layer 16→the p-type source region 4→the cathode electrode 10 and a path, i.e., the p⁻-type base region 3→the p-channel inversion layer 21→the auxiliary p-type emitter region 20→the p-type source region 4→the cathode electrode 10. The turn-off region extends from the predetermined regions 19 and 23 of the n-type emitter region 5 over the entire area of the n-type emitter region 5, thereby turning off the device.

In this manner, according to the prior art, in the p⁻-type base region, the turn-off region extends from only the n-type emitter region which is a portion opposite to the p-type source region. For this reason, it is difficult to completely turn off the device. However, according to the second aspect of the present invention, since a turn-off operation is also started from the p⁻-type regions, turn-off characteristics are improved. In addition, when a device according to the second aspect of the present invention is combined with a shorted emitter structure according to the first aspect of the present invention, the efficiency of discharging holes is increased, and turn-off characteristics are improved.

The third aspect of the present invention will be described below.

Figure 27:
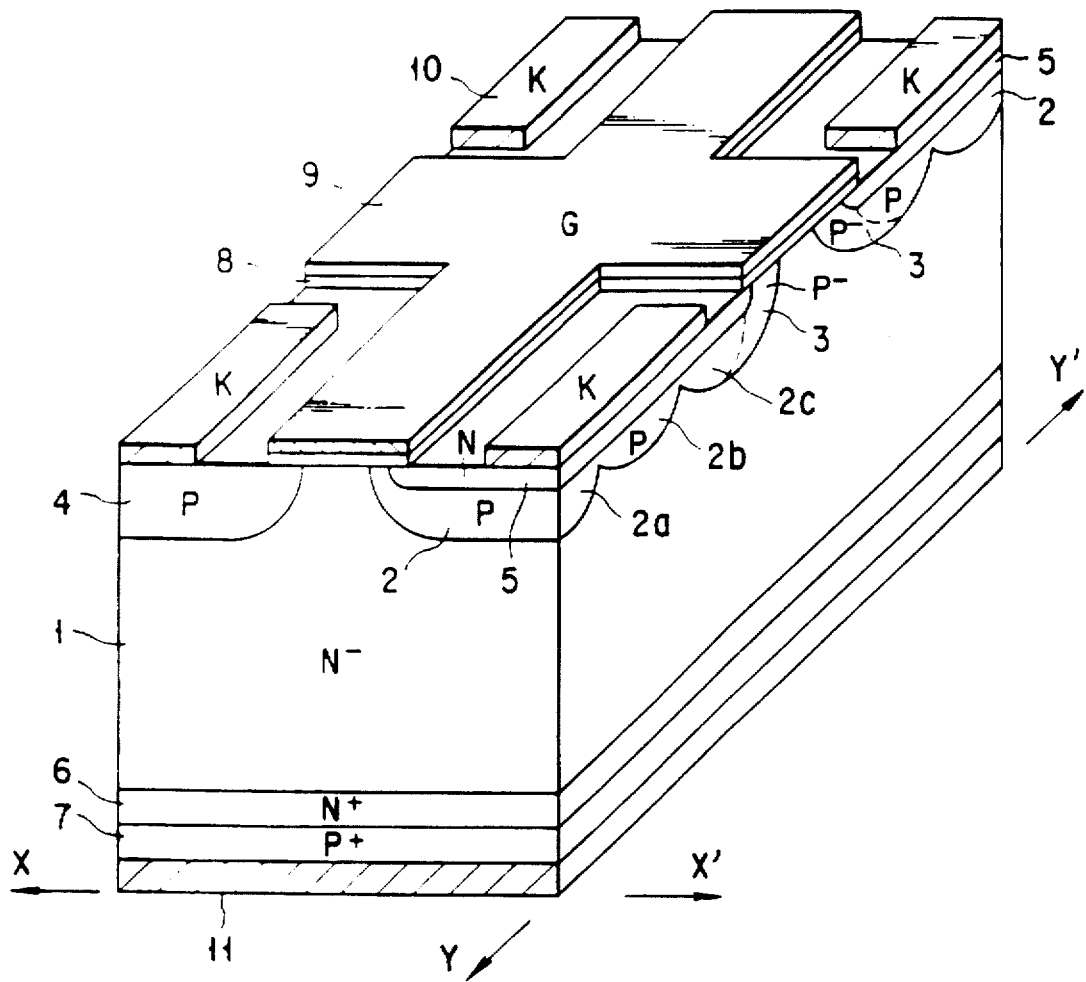
FIG. 27 is a view showing a semiconductor device according to the first embodiment of the third aspect of the present invention.

FIG. 27 shows a semiconductor device according to the first embodiment of the third aspect of the present invention. Referring to FIG. 27, reference numeral 1 denotes an n⁻-type semiconductor substrate; 2, a p-type base region; 3, a p⁻-type base region; 4, a p-type source region; 5, the n-type emitter region; 6, an n⁺-type buffer layer; 7, a lower-surface p⁺-type emitter layer; 8, a gate oxide film; 9, a polysilicon gate electrode; 10, cathode electrodes; and 11, an anode electrode.

In the semiconductor device according to the third aspect of the present invention, the p-type base region 2 is constituted by diffusion layers $2a$, $2b$, . . . . These diffusion layers must be electrically connected to each other. With the above arrangement, at the connection portions between the diffusion layers $2a$, $2b$, . . . . the depth of each of the diffusion layers is decreased. As a result, the same effect as that obtained when p⁻-type base regions are formed at the connection portions can be obtained. Therefore, in a turn-off operation, electrons are easily injected from the n-type emitter region 5 into the n-type base region (substrate) 1, and turn-off characteristics are further improved.

The steps in manufacturing the semiconductor device will be briefly described below. The n⁺-type buffer layer 6 and the lower-surface p⁺-type emitter layer 7 are formed on the n⁻-type semiconductor substrate 1. The gate oxide film 8 and the polysilicon gate electrode 9 are formed. Thereafter, the p-type base region 2, the p⁻-type base region 3, the p-type source region 4, and the n-type emitter region 5 are respectively formed in the surface regions of the substrate 1 by diffusion. Note that diffusion for forming the p-type base region 2 is performed in the following manner. A plurality of diffusion holes are partially formed, and a p-type impurity is implanted in the substrate 1. The impurity is diffused, and the p-type base region 2 is formed such that the diffusion layers 2a, 2b, . . . are connected to each other by lateral diffusion and the depths of the diffusion layers at the connection portions between the diffusion layers 2a, 2b, . . . are smaller than those at other portions. Finally, the cathode electrodes 10 and the anode electrode 11 are formed.

An operational principle of the semiconductor device according to the third aspect of the present invention will be described below.

A turn-on operation will be described below with reference to FIG. 28A to 28C. An anode is biased positive, cathodes are biased negative, and the gate is biased positive. In this state, n-channel inversion layers 12 are formed on the surface of the p⁻-type base regions 3, and electrons 13 are injected form the n-type emitter region 5 to the n⁻-type base region (substrate) 1. In this manner, holes 14 are induced from the lower-surface p⁺-type emitter layer 7, and the holes 14 are injected into the n⁻-type base region 1.

As a result, conductivity modulation occurs in the n⁻-type base region 1, and electrons 22 are injected to the n⁻-type base region 1 from portions where the diffusion layers 2a, 2b, . . . constituting the p-type base region 2 are in contact with each other, i.e., the n-type emitter region 5 near portions 21 where the depth of the p-type base region 2 is small. Therefore, the portions 15 facing the p⁻-type base regions 3 and the portions 21 where the depth of the p-type base region 2 is small become early turn-on areas, thereby starting a turn-on operation. When a turn-on region extends over the entire areas of the n-type emitter regions, the device is completely turn on.

Figure 29A:
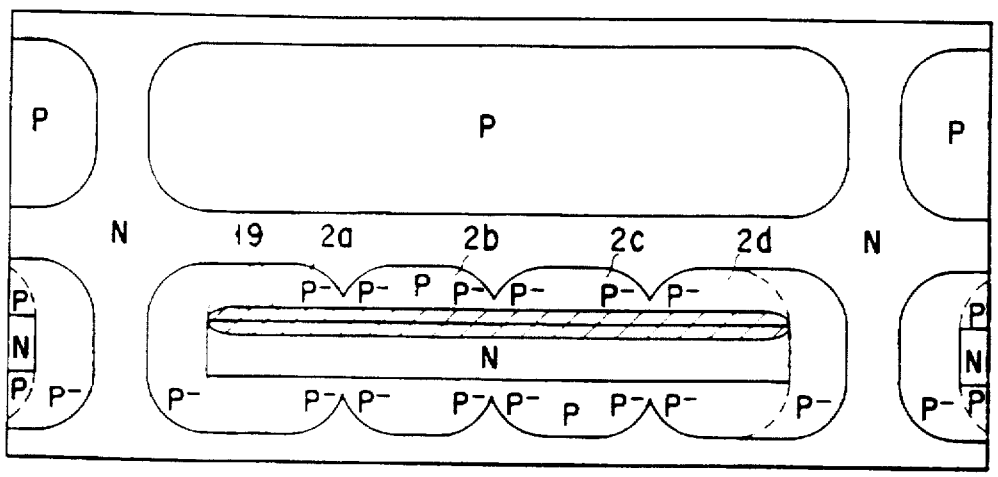
FIG. 29A to 29C are a view showing a turn-off operation of the semiconductor device in FIG. 27.
Figure 29B:
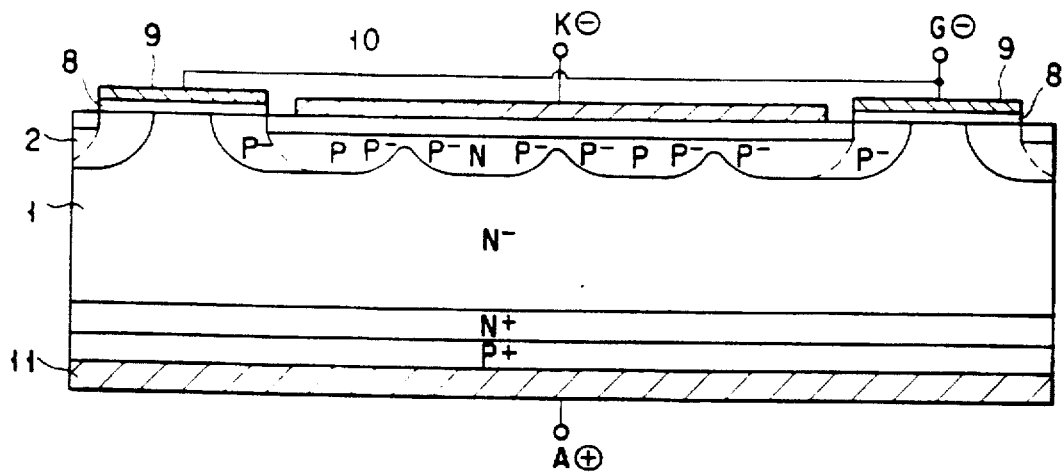
Figure 29C:
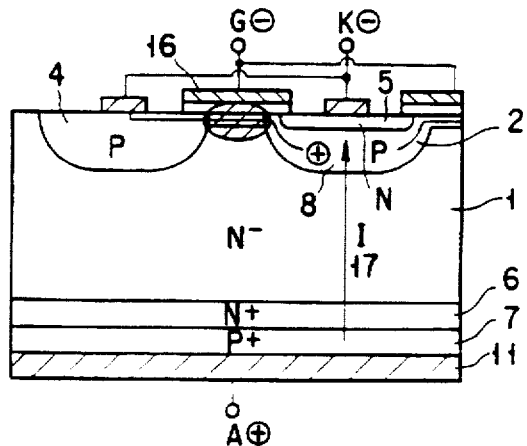

A turn-on operation will be described below with reference to FIG. 29A to 29C. The anode is biased positive, the cathodes are biased negative, and a main current 17 flows from the anode to the cathodes. In this state, when the gate is biased negative with respect to the cathodes, the n-channel inversion layers 12 which are formed during the turn-on operation disappear. In addition, a p-channel inversion layer 16 is formed on the surface of the n⁻-type base region 1 between the p-type base region 2 and the p-type emitter region 4.

For this reason, holes which are present in the n⁻-type semiconductor substrate 1 and the p-type base region 2 immediately under the n-type emitter region 5 are discharged through a path, i.e., the n⁻-type base region 1→the p-type base region 2→the p-channel inversion layer 16→the p-type source region 4→the cathode electrode 10. Note that, since there are a plurality of connection portions between the diffusion layers 2a, 2b, . . . , in other words, since a plurality of every other p⁻-type base regions are present in the p-type base region 2, the holes which are present in the n⁻-type base region 1 near the connection portions are discharged through the p-type base region 2 having a low resistance and through a path, i.e., the p-channel inversion layer 16→the p-type source region 4→the cathode electrode 10.

With the above operation, injection of electrons from the n-type emitter region 5 is stopped, and the main current 17 does not flow. Note that, since holes are discharged through the above path, degradation of a current cut-off capability caused by the presence of the shallow portions of the p-type base region 2, i.e., a high-resistance p⁻-base region, rarely occurs. Therefore, trade-off between turn-on characteristics and turn-off characteristics is considerably improved in comparison with that of the conventional structure.

Figure 30:
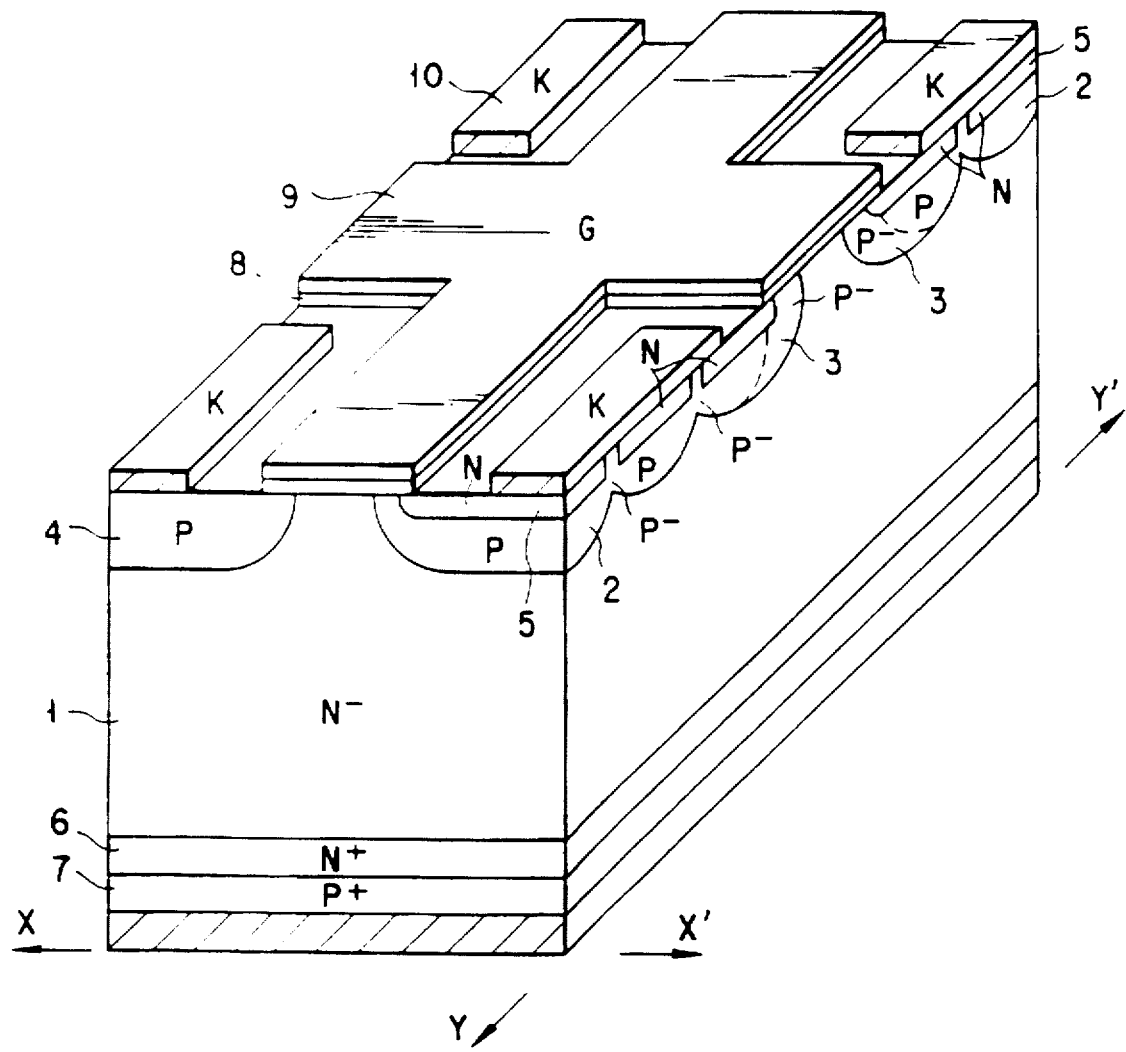
FIG. 30 is a view showing a semiconductor device according to the second embodiment of the third aspect of the present invention.

FIG. 30 shows a semiconductor device according to the second embodiment of the third aspect of the present invention. FIGS. 31 and 32 are views showing a turn-on/turn-off operational principle of the semiconductor device in FIG. 30.

In the steps in manufacturing the semiconductor device in FIG. 30, as in those of the first embodiment, a p-type base region 2 is partially diffused, and an n-type emitter region 5 is partially diffused. Since this structure is the same as that of the prior art, a description thereof will be omitted. In addition, in an operational principle of the semiconductor device in this embodiment, since a turn-on operation (see FIG. 31A to 31C) is the same as that of the first embodiment, a description of the turn-on operation will be omitted, and only a turn-off operation will be described below.

Figure 32A:
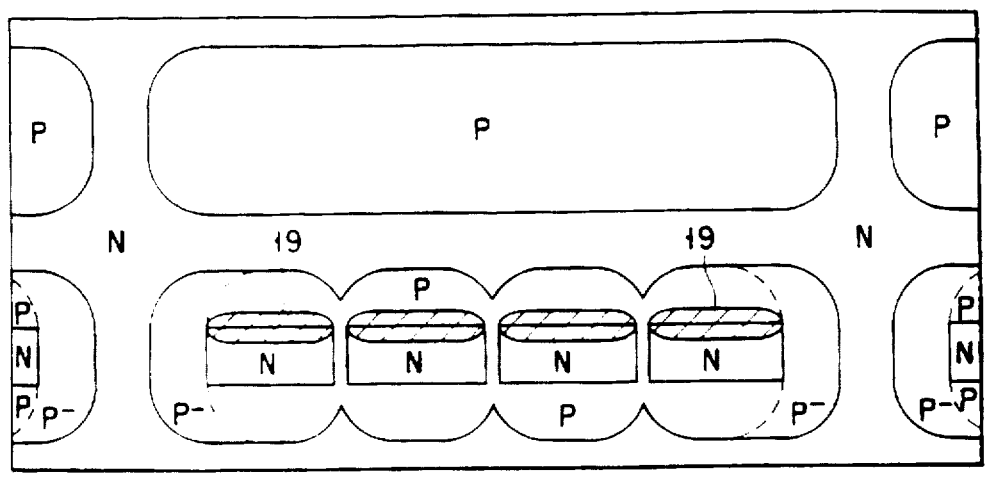
FIG. 32A to 32C are a view showing a turn-off operation of the semiconductor device in FIG. 30.
Figure 32B:
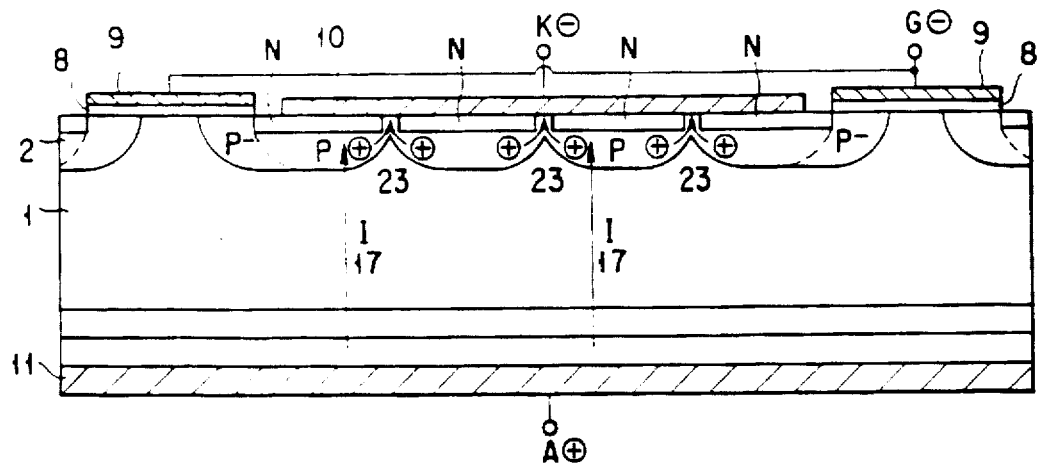
Figure 32C:
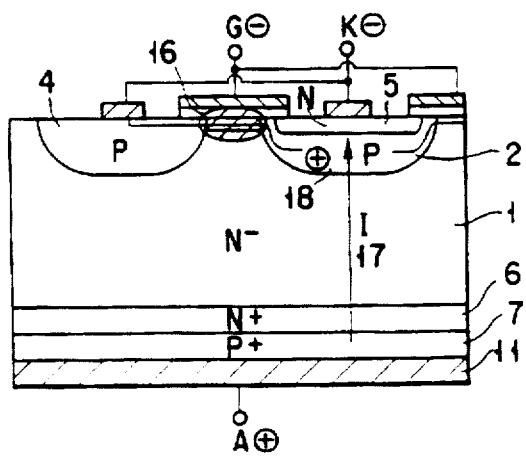

A turn-off operation will be described below with reference to FIG. 32A to 32C. An anode is biased positive, cathodes are biased negative, and a main current 17 flows from the anode to the cathodes. In this state, when a gate is biased negative with respect to the cathodes, n-channel inversion layers 12 (see FIG. 31) which are formed during a turn-on operation disappear. In addition, a p⁻-channel inversion layer 16 is formed on the surface of an n⁻-type semiconductor substrate 1 between the p-type base region 2 and the p-type source region 4, and the p-type base region 2, the p-type source region 4, and a cathode electrode 10 are short-circuited to each other. For this reason, holes 18 of the main current are discharged to the cathode electrode 10.

In this structure, since the n-type emitter region 5 is always short-circuited to the p-type base region 2 by the cathode electrode 10, holes 23 are discharged from the short-circuit portion. Therefore, the efficiency of discharging holes in a turn-off operation is further increased. Since the discharging of electrons from the n-type emitter region 5 is stopped by the above operation, the main current 17 does not flow, thereby turning off the device. Note that this structure is generally called a shorted emitter structure.

Although the two embodiments have been exemplified above, the third aspect of the present invention can be applied to a double gate structure using both the first and second embodiments or a structure in which an n⁻-type substrate is replaced with a p⁻-type substrate and a p-channel MOSFET and an n-channel MOSFET are respectively used as an on-channel and an off-channel.

The third aspect of the present invention can be applied to a structure in which, as shown in FIG. 33, the anode electrode 11 is connected to the n⁺-type layer 6 and the lower-surface p⁺-type emitter layer 7 to short-circuit the corresponding n⁺-type buffer layer 6 to the corresponding lower-surface p⁺-type emitter layer 7.

According to the above arrangement, in the semiconductor device according to the third aspect of the present invention, since a p-type base region 2 is constituted by a plurality of diffusion layers 2a, 2b, . . . , a p⁻-type base region is substantially formed at each of the connection portions between the diffusion layers 2a, 2b, . . . . Therefore, turn-off characteristics which pose problems can be improved.

More specifically, in the conventional structure, in order to improve the turn-off characteristics, the concentrations of the p-type base region 2 and the p-type source region 4 are increased to decrease the resistance of a path for discharging holes in the turn-off operation, and an on-gate region is formed in the p⁻-type base region 3 which is formed at an end portion of the cell to have a small area. For this reason, a portion which is in contact with the p⁻-type base region 3 at the end portion of the n-type emitter region 5 becomes an early turn-on area 15, and a turn-on region extends to the central portion of the n-type emitter region, thereby turning on the device. However, each early turn-on area 15 is a small area at the end portion of the n-type emitter region, and a considerably long time is required for causing the turn-on region to extend over the entire area of the n-type emitter region 5. For this reason, the turn-on operation cannot be efficiently performed, and the turn-on characteristics are adversely affected.

According to the third aspect of the present invention, the turn-on operation is not started from only the on-gate regions. That is, the p-type base region 2 is constituted by the plurality of diffusion layers 2a, 2b, . . . , a plurality of shallow portions are formed, and these portions are used at the start of the turn-on operation as portions to which electrons are easily injected from the n-type emitter region 5 during conductivity modulation, thereby decreasing a turn-on voltage. That is, the turn-on characteristics are improved by forming a large number of early turn-on areas.

According to the third aspect of the present invention, the following effect can be obtained. That is, the p-type base region 2 is constituted by the plurality of diffusion layers 2a, 2b, . . . , and the diffusion layers 2a, 2b, . . . are electrically connected to each other. In this manner, the depths of the diffusion layers are relatively decreased at the connection portions between the diffusion layers 2a, 2b, . . . . As a result, p⁻-type base regions 20 and 21 each having a low impurity concentration are formed at the connection portions.

For this reason, the anode is biased positive, the cathodes are biased negative, and the gate is biased positive. In this state, the n-channel inversion layers 12 are formed on the surface regions of the p⁻-type base regions 3. In addition, when electrons are injected from the n-type emitter region 5 into the n⁻-type base region 1, holes induced from the lower-surface p-type emitter layer 7 are injected into the n⁻-type base region 1. Electrons are injected from the n-type emitter region 5 which is in contact with the p⁻-type base regions 3 into the n⁻-type base region 1, and electrons 22 are injected from the shallow portions 20 and 21 of the p-type base region 2 into the n⁻-type base region 1.

With the above operation, a turn-on region extends using, is early turn-on areas, the n-type emitter region 5 which is in contact with the p⁻-type base regions 3 and the n-type emitter regions which are in contact with the shallow portions 20 and 21 of the p-type base region 2.

As described above, according to the prior art, the early turn-on area is only the n-type emitter region 5 which is in contact with the p⁻-type base regions 3. However, according to the third aspect of the present invention, n-type emitter regions which are in contact with the shallow portions 20 and 21 of the p-type base region 2 are also used as early turn-on areas. For this reason, the number of early turn-on areas are increased, thereby improving turn-on characteristics.

The turn-off characteristics rarely adversely affect the off-gate efficiency because each portion near the shallow portions 20 and 21 of the p-type base region 2 serves as the p-type base region of the prior art. Therefore, the turn-on characteristics can be improved without degrading turn-off characteristics, and trade-off between the turn-on characteristics and the turn-off characteristics in design can be improved.

In the third aspect of the present invention, as described in the second embodiment, the efficiency of discharging holes can be further increased by combining a semiconductor device with a shorted emitter structure. In addition, when the shorted emitters are formed near the shallow portions 20 and 21 of the p-type base region 2, turn-on characteristics are improved even at a portion where electrons are injected during a turn-on operation, and trade-off characteristics can be improved.

The fourth aspect of the present invention will be described below.

In the Description of the Related Art, an MCT is developed as a self-turn-off device to improve its turn-off efficiency having priority over other conditions. In a conventional technique, in order to increase the turn-off efficiency, an on-gate portion is separated from an off-gate portion, and a ratio of the area of the off-gate portion to the area of the on-gate portion is set such that most of the area of the gate is used as the off-gate portion. In addition, in portions except for the on-gate portion, in order to improve turn-off characteristics, the concentration of a p-type base region is increased, and a method of decreasing the resistance of a path, formed in a turn-off operation and constituted by the p-type base region, a p-channel inversion layer, and a p-type source region, for discharging a hole current is used.

However, when the turn-off characteristics are to be improved by the above method, the following drawback is posed. That is, when this drawback is described with reference to, e.g., the conventional MCT shown in FIG. 4, an npn-n⁺p⁺ type thyristor immediately under an n-type emitter region 5 is turned on to set the thyristor in an ON state. At this time, electrons are injected from the n-type emitter region 5 into the p-type base region 2.

When the thyristor is to be turned off, when a negative voltage is applied to a gate electrode 9, a p-channel inversion layer 16 is formed on the surface of an n⁻-type semiconductor substrate 1 between a p-type base region 2 and a p-type source region 4. In this manner, the p-type base region 2, the p-type source region 4, and a cathode electrode 10 are short-circuited to each other, and holes 18 of a main current are discharged from the cathode electrode 10.

However, even when the holes 18 of the main current are discharged through the above path, the number of discharged holes is limited to a predetermined value. For this reason, electrons injected from the n-type emitter region 5 into the p-type base region 2 does not disappear soon. More specifically, the injection of the electrons cannot be immediately stopped at the turn-off operation, and satisfactory turn-off characteristics cannot be obtained.

FIG. 34 shows a semiconductor device according to the first embodiment of the fourth aspect of the present invention. FIGS. 35 and 36 are sectional views each showing the semiconductor device in FIG. 34 in detail when viewed from the three directions. Referring to FIGS. 34 to 36, reference numeral 1 denotes an n⁻-type semiconductor substrate; 2, a p-type base region; 3. p⁻-type base regions; 4. a p-type source region; 5. an n-type emitter region; 6. an n⁺-type buffer layer; 7. a lower-surface p⁺-type emitter layer; 8. a gate oxide film; 9. a polysilicon gate electrode 9; 10. cathode electrodes; and 11. an anode electrode.

In the semiconductor device according to the fourth embodiment of the present invention. turn-off characteristics obtained when the state of a thyristor is changed from an ON state to an OFF state are improved so as to improve trade-off between turn-on characteristics and the turn-off characteristics.

For this reason, according to the fourth aspect of the present invention. the n-type emitter region 5 is subjected to the following improvement. That is, the n-type emitter region 5 does not have a uniform depth and has partially shallow portions. In this case, the following facts require attention. That is, according to the fourth aspect of the present invention, as shown in FIG. 34 to 41. a shorted emitter structure in which the cathode electrode 10 is connected to both the p-type base region 2 and the n-type emitter region 5 is not used, but the cathode electrode 10 is connected to only the n-type emitter region 5. and the depth of the n-type emitter region 5 partially varies.

The steps in manufacturing the semiconductor device in FIG. 34 will be briefly described below.

The n⁺-type buffer layer 6 and the lower-surface p⁺-type emitter layer 7 are formed on the n⁻-type semiconductor substrate 1. The gate oxide film 8 and the polysilicon gate electrode 9 are formed. Thereafter, the p-type base region 2. the p⁻-type base regions 3, the p-type source region 4, and the n-type emitter region 5 are respectively formed in the surface regions of the substrate 1.

When the n-type emitter region 5 is to be formed, a plurality of diffusion holes are partially formed, and an n-type impurity is doped in the p-type base region 2. Thereafter, the n-type impurity is diffused in the lateral directions by annealing, and the impurity regions are brought into contact with each other. As a result, one n-type emitter region 5 in which the depth of the contact portion between the impurity regions is small is formed.

Finally, the cathode electrodes 10 and the anode electrode 11 are formed.

According to the above arrangement. in the semiconductor device of the fourth aspect of the present invention. the depth of the n-type emitter region 5 is not uniformed. and the n-type emitter region 5 has partially shallow portions. In this manner, when holes 18 of the main current are discharged from the shallow portions of the p-type base region 2 in the turn-off operation, injection of electrons from the shallow portions of the n-type emitter region 5 is immediately stopped. For this reason, turn-off characteristics can be improved.

That is, in the conventional structure (FIG. 4), in order to improve the turn-off characteristics, the concentrations of the p-type base region 2 and the p-type source region 4 are increased, and the resistance of a path. i.e.. the p-type base region 2→the p-channel inversion layer→the p-type source region 4→the cathode electrode 10. formed in the turn-off operation, for discharging the hole current component of the main current is decreased, thereby efficiently discharging holes. However, when only this method is used. the efficiency of discharging holes is limited to a predetermined value because the discharging efficiency of the holes is determined by a difference between the potential of a main current portion and the potential of a cathode electrode. That is, when the main current becomes a large current, the number of electrons injected from the n-type emitter region is increased, and the number of holes injected in accordance with the injection of electrons is increased. Therefore, when only the method of discharging holes from the p-channel gate portion is used. the main current cannot be easily cut off.

In the first aspect (FIG. 7) of the present invention, not only the method of discharging holes from the p-channel gate portion is used, but also the cathode electrode 10 is connected to both the p-type base region 2 and the n-type emitter region 5 so as to short-circuit the p-type base region 2 to the n-type emitter region 5. For this reason, the hole components of the main current can be directly discharged from the p-type base region 2 to the cathode electrode 10, and can be indirectly discharged from the p-channel inversion layer to the cathode electrode 10 through the p-type source region 4, thereby increasing the efficiency of discharging holes in the turn-off operation.

Figure 4:
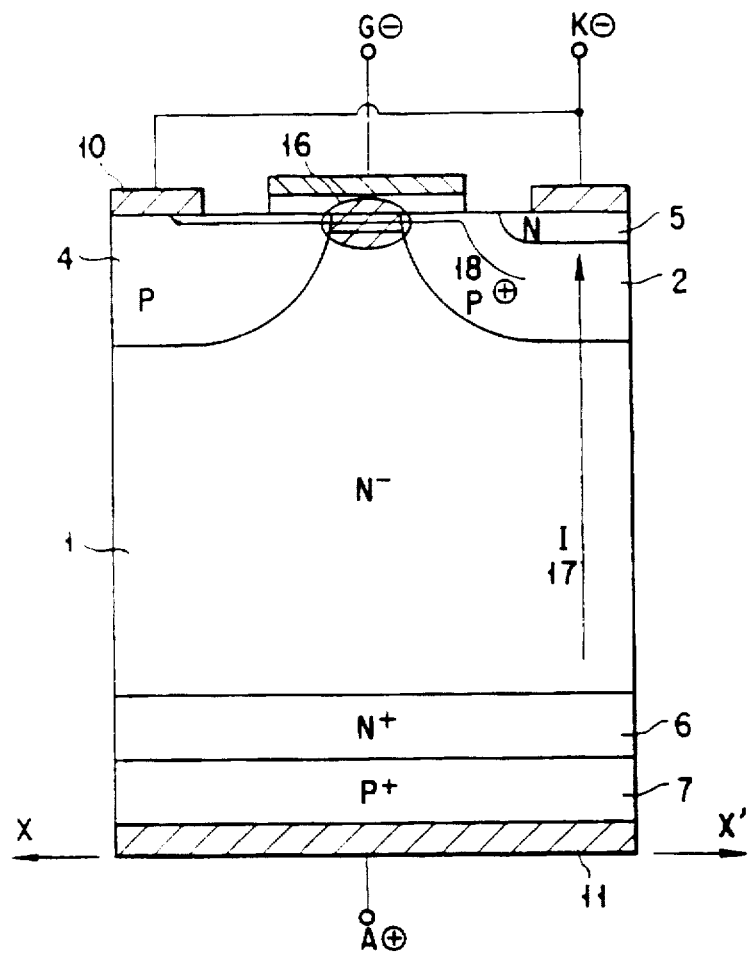

In contrast to this, a turn-off operation of the semiconductor device according to the fourth aspect of the present invention is the same as that of the conventional semiconductor device (FIG. 4). However, the device of the fourth aspect of the present invention has an arrangement in which injection of electrons from the n-type emitter region 5 is immediately stopped in the turn-off operation, i.e., the n-type emitter region 5 has partially shallow portions, and turn-off characteristics can be improved.

Figure 35A:
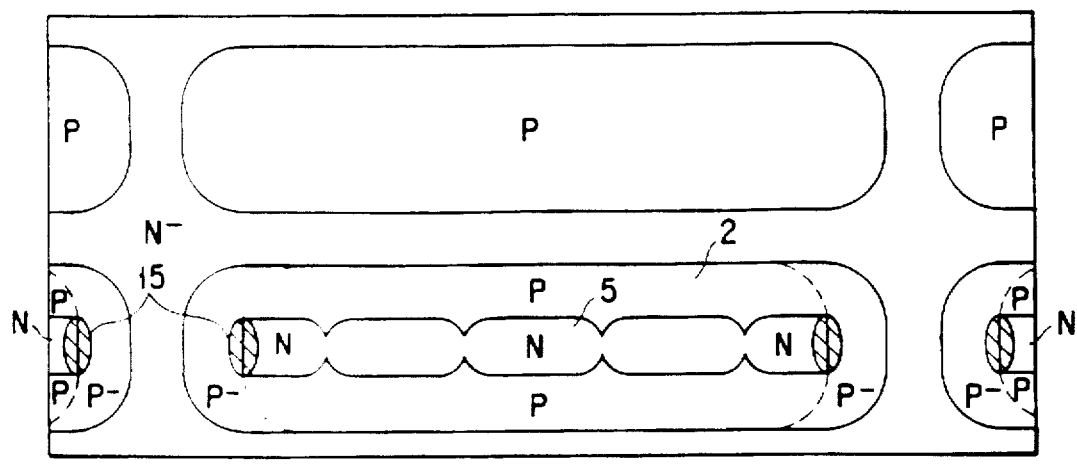
FIG. 35A to 35C are a view showing a turn-on operation of the semiconductor device in FIG. 34.
Figure 35B:
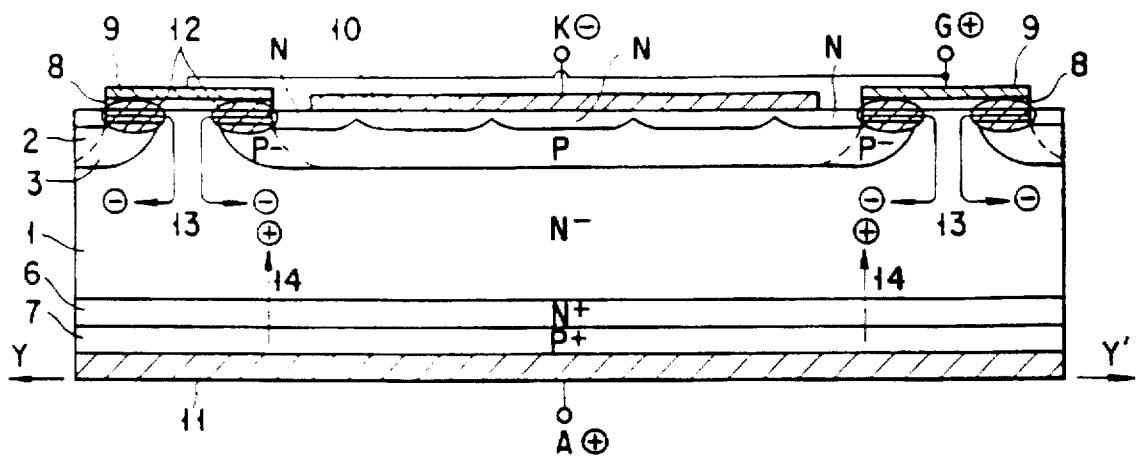
Figure 35C:
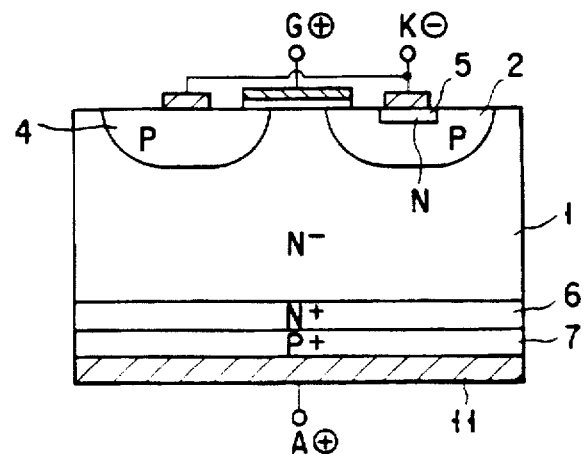

A turn-on operation will be described below with reference to FIG. 35A to 35C. An anode is biased positive, cathodes are biased negative, and a gate is biased positive. In this state, n-channel inversion layers 12 are formed in the p⁻-type base regions 3, and electrons are injected from the n-type emitter region 5 into the n⁻-type base region (substrate) 1. In this manner, holes 14 are induced from the lower-surface p⁺-type emitter layer 7, conductivity modulation occurs in the n⁻-type base region 1, portions 15 where the p⁻-type base regions 3 are in contact with the n-type emitter region 5 become early turn-on areas, thereby starting the turn-on operation. A turn-on region extends over the entire area of the n-type emitter region 5, and the device is completely turned on.

Figure 36A:
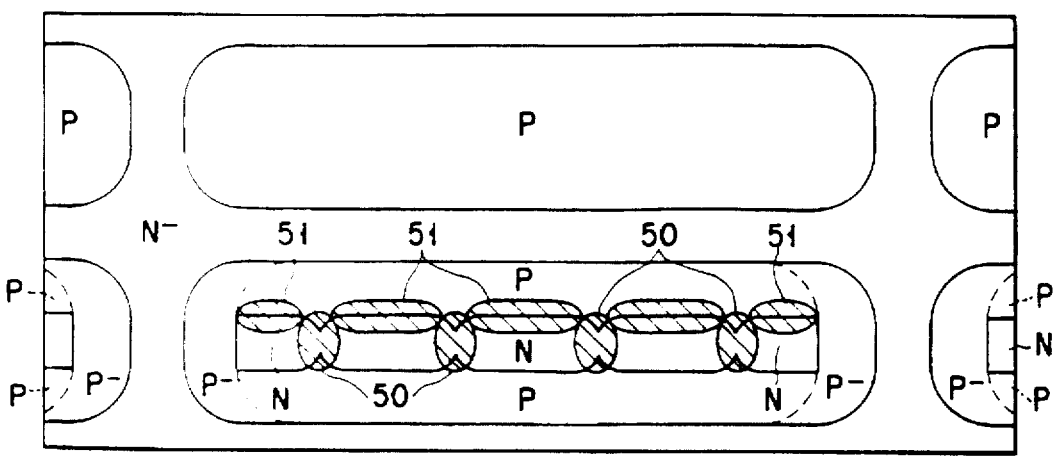
FIG. 36A to 36C are a view showing a turn-off operation of the semiconductor device in FIG. 34.
Figure 36B:
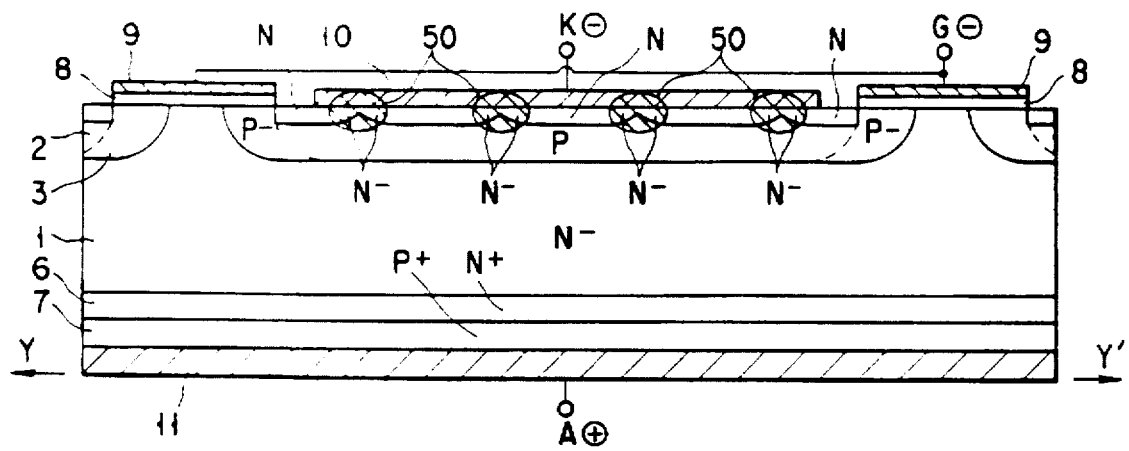
Figure 36C:
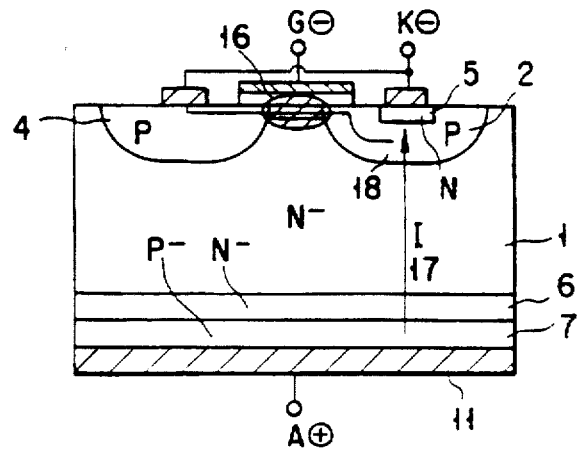

A turn-off operation will be described below with reference to FIG. 36A to 36C. The anode is biased positive, the cathodes are biased negative, and a main current 17 flows. In this state, when the gate is biased negative with respect to the cathodes, the n-channel regions which are formed during the turn-on operation disappear. On the other hand, a p-channel inversion layer 16 is formed on the surface of the p⁻-type base region (substrate) 1 between the p-type base region 2 and the p-type source region 4, and a path. i.e., the p-type base region 2→the p-channel inversion layer→the p-type source region 4→the cathode electrode 10. is formed. In this manner, the holes 18 of the main current 17 are discharged through this path.

On the other hand, when the holes of the main current 17 are discharged from the p-type base region 2, injection of electrons from the n-type emitter region 5 begins to stop from shallow portions 50 of the n-type emitter region 5, and injection of electrons from the entire area of the n-type emitter region 5 is gradually stopped. For this reason, the main current 17 does not flow.

That is, the turn-off region extends to the shallow portions of the n-type emitter region 5 and portions 51 of the n-type emitter region on the p-type source region 4 side at the beginning, and the turn-off region extends over the entire area of the n-type emitter region 5 at last.

In the fourth aspect of the present invention, when the depth of the n-type emitter region 5 partially varies, the shapes and area ratios of the p-type base region 2, the n-type emitter region 5, and the cathode electrode 10 are not limited to specific ones.

Figure 37:
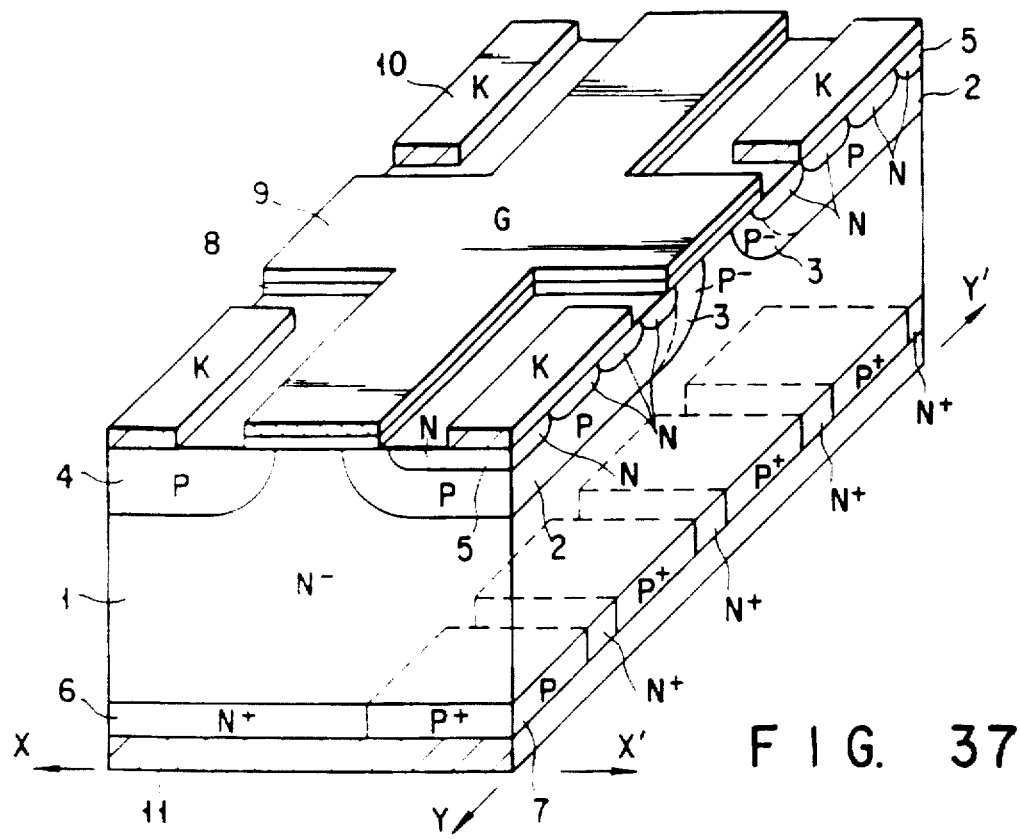
FIG. 37 is a view showing a modification of the semiconductor device in FIG. 34.

In addition, the semiconductor device according to the fourth aspect of the present invention can be applied to a structure in which, as shown in FIG. 37, the anode electrode 11 is connected to the $n^+$-type buffer layer 6 and the lower-surface $p^+$-type emitter layer 7 to short-circuit the $n^+$-type buffer layer 6 to the lower-surface $p^+$-type emitter layer 7.

FIGS. 38, 39A to 39C and 40A to 40C show a semiconductor device according to the second embodiment of the fourth aspect of the present invention. Referring to FIGS. 38, 39A to 39C and 40A to 40C reference numeral 1 denotes an $n^-$-type semiconductor substrate; 2, a p-type base region; 3, $p^-$-type base regions; 4, a p-type source region; 5, an n-type emitter region; 6, an $n^+$-type buffer layer; 7, a lower-surface $p^+$-type emitter layer; 8, a gate oxide film; 9, a polysilicon gate electrode; 10, cathode electrodes; and 11, an anode electrode.

The second embodiment is different from the first embodiment shown in FIG. 34 in the following point. That is, although the shallow portions 50 of the n-type emitter region 5 extend in the X—X' direction in the first embodiment, a shallow portion 50 of an n-type emitter region 5 extends in the Y—Y' direction in the second embodiment.

Note that the steps in manufacturing the semiconductor device in the second embodiment are the same as those in the first embodiment.

Figure 39A:
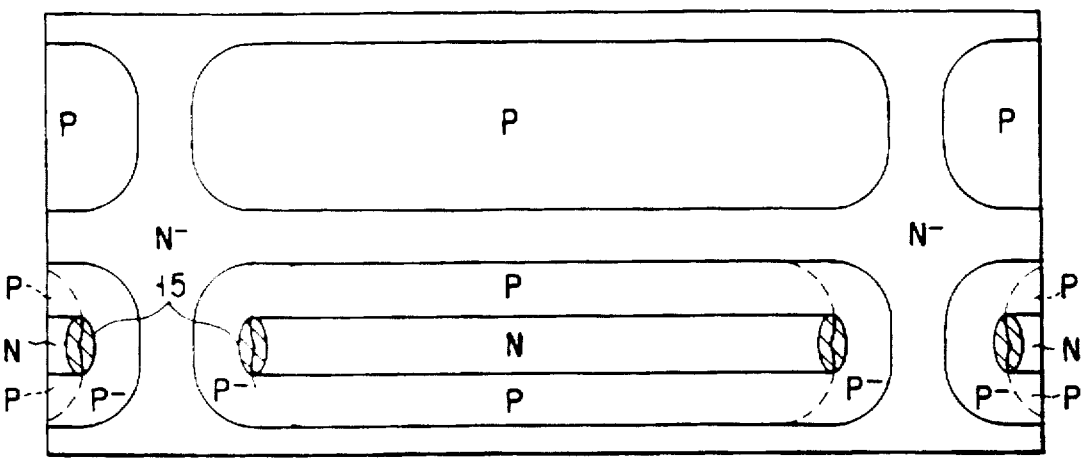
FIG. 39A to 39C are a view showing a turn-on operation of the semiconductor device in FIG. 38.
Figure 39B:
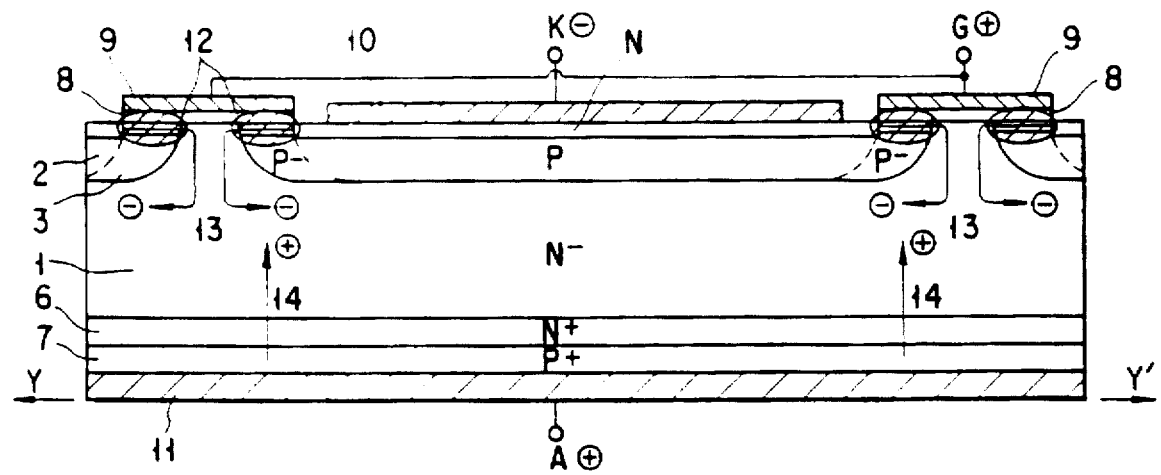
Figure 39C:
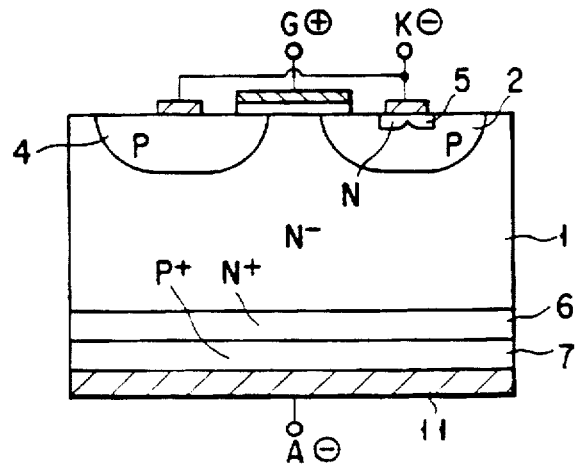

An operational principle of the semiconductor device of this embodiment is basically the same as that of the first embodiment. More specifically, in a turn-on operation, as shown in FIG. 39A to 39C an anode is biased positive, cathodes are biased negative, and a gate is biased positive. In this state, an n-channel inversion layer 12 is formed in the $p^-$-type base region 3, and electrons are injected from the n-type emitter region 5 into the $n^-$-type base region (substrate) 1. In this manner, holes 14 are induced from the lower-surface $p^+$-type emitter layer 7, conductivity modulation occurs in the $n^-$-type base region 1, and portions 15 where the $p^-$-type base regions 3 are in contact with the n-type emitter region 5 become early turn-on areas, thereby starting the turn-on operation. A turn-on region extends over the entire area of the n-type emitter region 5, and the device is completely turned on.

In a turn-off operation, as shown in FIG. 40A to 40C, the anode is biased positive, the cathodes are biased negative, and a main current 17 flows. In this state, when the gate is biased negative with respect to the cathode, the n-channel regions which are formed during the turn-on operation disappear. On the other hand, a p-channel inversion layer 16 is formed on the surface of the $n^-$-type base region (substrate) 1 between the p-type base region 2 and the p-type source region 4, and a path, i.e., the p-type base region 2→the p-channel inversion layer→the p-type source region 4→the cathode electrode 10, is formed. In this manner, the holes of the main current 17 are discharged through this path.

On the other hand, when the holes of the main current 17 are discharged from the p-type base region 2, injection of electrons from the n-type emitter region 5 begins to stop from the shallow portion 50 of the n-type emitter region 5, and injection of electrons from the entire area of the n-type emitter region 5 is gradually eliminated. For this reason, the main current 17 does not flow.

Figure 38:
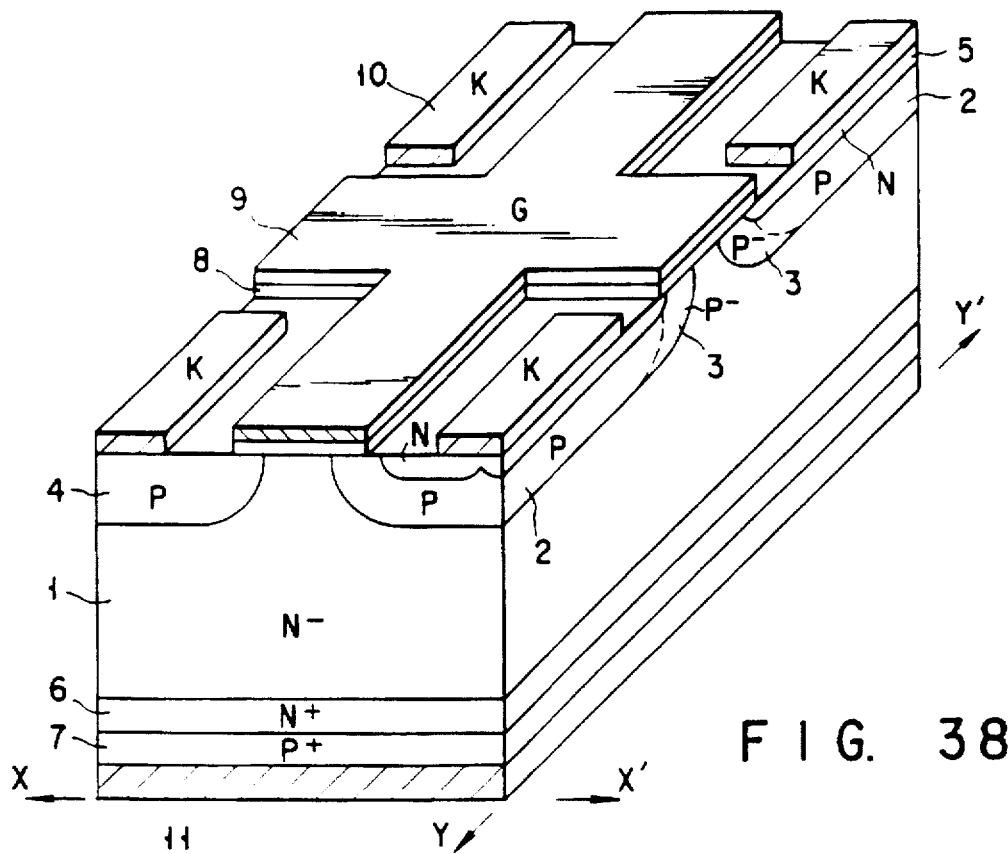
FIG. 38 is a view showing a semiconductor device according to the second embodiment of the fourth aspect of the present invention.
Figure 41:
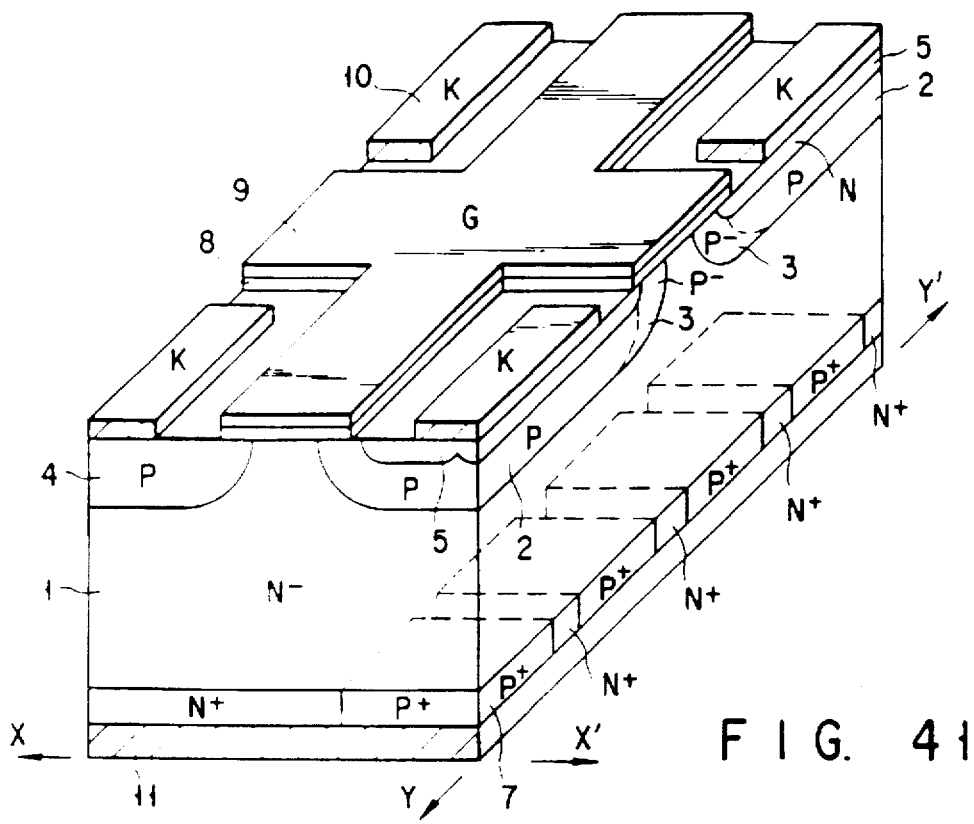
FIG. 41 is a view showing a modification of a semiconductor device in FIG. 38.

In the semiconductor device in FIG. 38, the anode electrode 11 may be connected to the $n^+$-type buffer layer 6 and the lower-surface $p^+$-type emitter layer 7 to short-circuit the $n^+$-type buffer layer 6 to the lower-surface $p^+$-type emitter layer 7, as shown in FIG. 41.

As described above, the fourth aspect of the present invention is not limited to the above two embodiments, and can be applied to a semiconductor device having a double gate structure or a semiconductor device having a structure in which the $n^-$-type substrate 1 is replaced with a $p^-$-type substrate, and a p-channel MOSFET and an n-channel MOSFET are respectively used as an on-channel and an off-channel.

According to the fourth aspect of the present invention, turn-off characteristics can be improved without degrading turn-on characteristics. That is, the n-type emitter region 5 is preferably formed to have a high concentration and a large depth in consideration of the turn-on characteristics. However, in this case, injection of electrons from the n-type emitter region 5 is not easily stopped in the turn-off operation, and the turn-off characteristics may be degraded. Therefore, according to the fourth aspect of the present invention, the n-type emitter region 5 is formed to have partially shallow portions.

The turn-off characteristics can be improved without degrading the turn-on characteristics, and trade-off between the turn-on characteristics and the turn-off characteristics can be improved. More specifically, when, as in the prior art, the concentrations of the p-type base region 2 and the p-type source region 4 are increased to improve the turn-off characteristics, the turn-on characteristics are degraded. The fourth aspect of the present invention has the following characteristic features. That is, the efficiency of discharging holes is not increased, but the shallow portion (a low-concentration portion) 50 is formed in the n-type emitter region 5 to immediately stop injection of electrons from the n-type emitter region 5.

In this case, early turn-on areas in the turn-off operation are two portions, i.e., the shallow portion 50 of the n-type emitter region 5 and the portion 51 of the n-type emitter region on the p-type source region 4 side, thereby improving the turn-off characteristics. This is because the number of early turn-on areas is larger than that in a case wherein the early turn-on area is constituted by the n-type emitter region on the p-type source region 4 side as in the prior art. On the other hand, although the n-type emitter region 5 has partially shallow portions, and the turn-on characteristics are not degraded because the area of the n-type emitter region 5 is not different from that of the prior art. The entire area of the n-type emitter region 5 can be used as an early turn-on area for the turn-on operation.

The fifth aspect of the present invention will be described below.

In the Description of the Related Art, an MCT is developed as a self-turn-off device to improve its turn-off efficiency having priority over other conditions. In a conventional technique, in order to increase the turn-off efficiency, an on-gate portion is separated from an off-gate portion, and a ratio of the area of the off-gate portion to the area of the on-gate portion is set such that most of the area of the gate is used as the off-gate portion. In addition, in portions except for the on-gate portion, in order to improve turn-off characteristics, the concentration of a p-type base region is increased, and a method of decreasing the resistance of a path. formed in a turn-off operation and constituted by the p-type base region. a p-channel inversion layer. and a p-type source region. for discharging a hole current is used.

Figure 1:
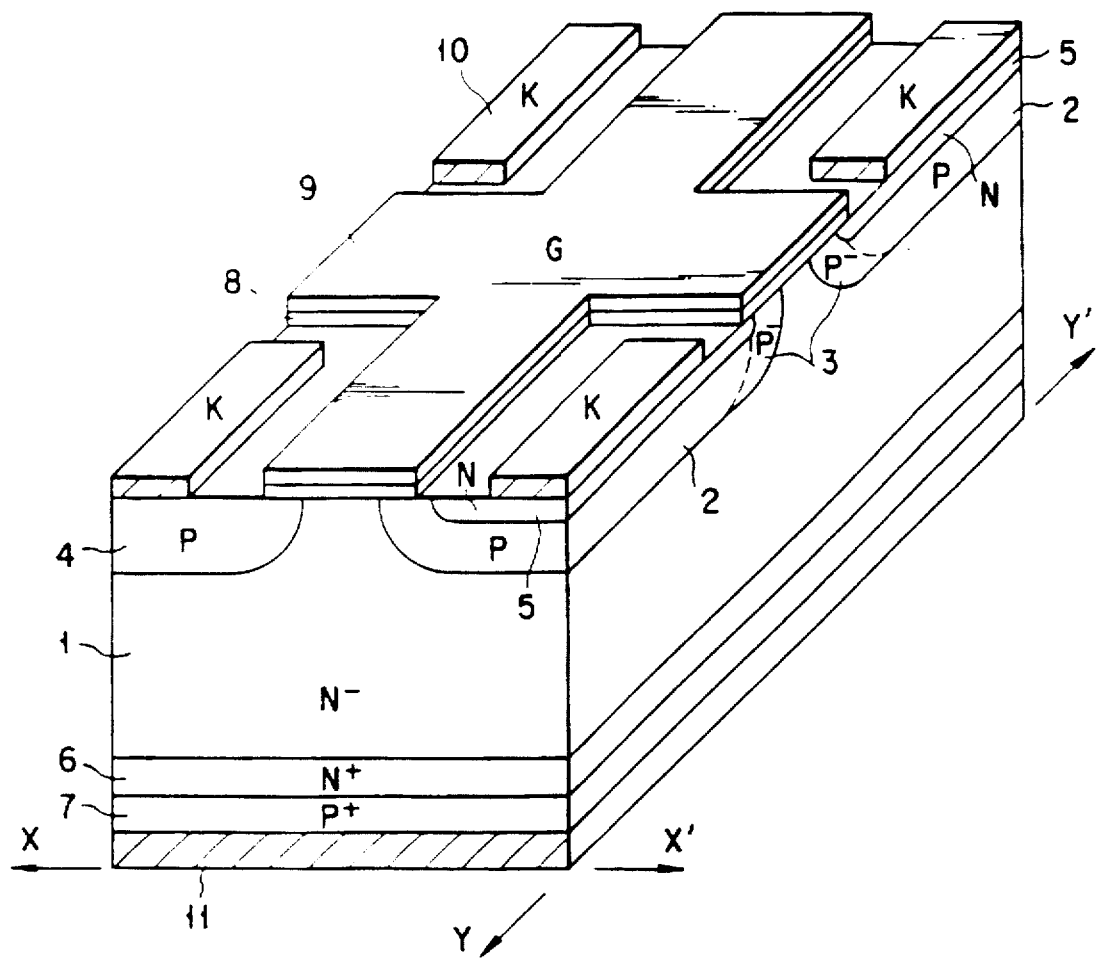
FIG. 1 is a view showing a conventional semiconductor device.
Figure 3A:
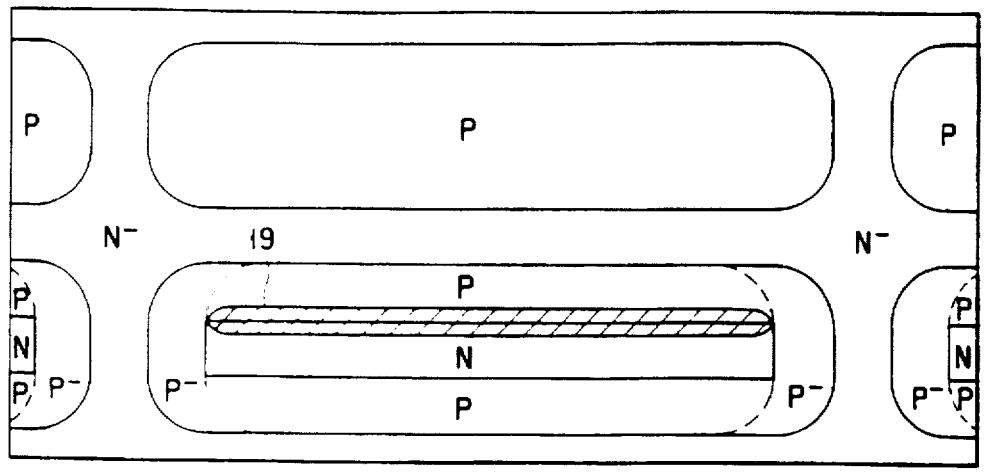
FIGS. 3A to 3C and 4 are views showing a turn-off operation of the semiconductor device in FIG. 1.
Figure 3B:
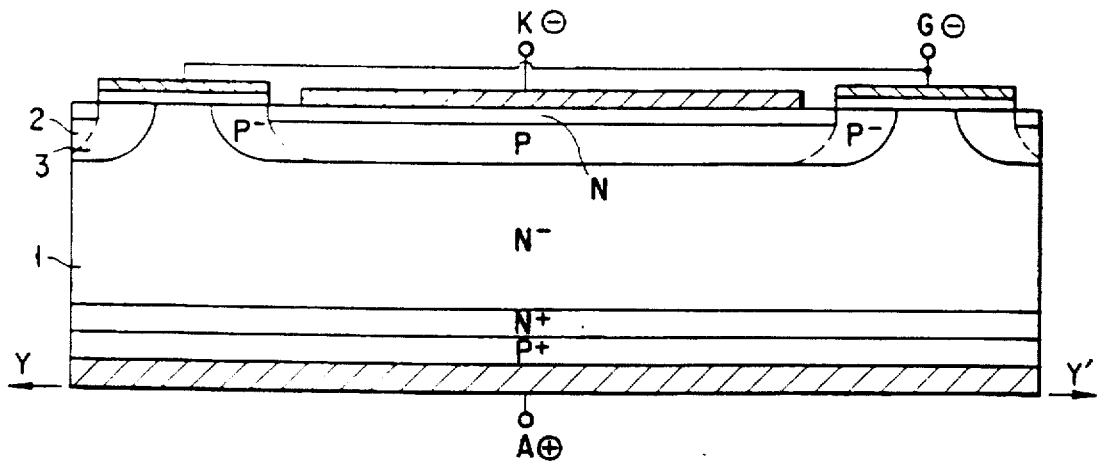
Figure 3C:
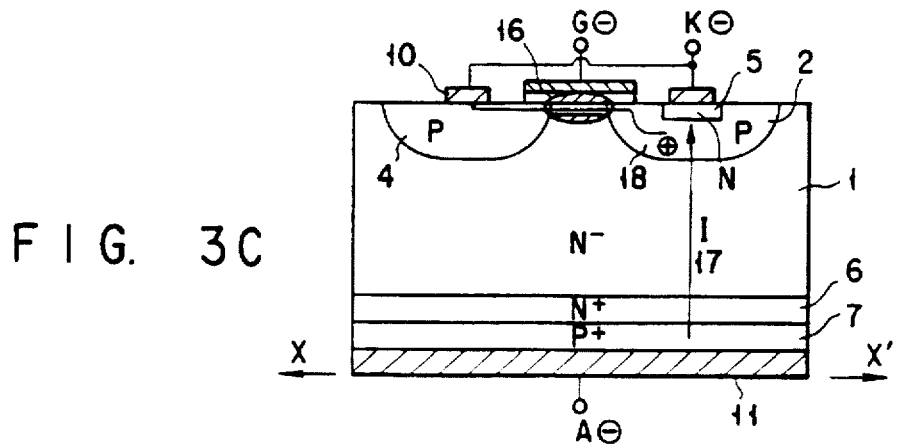

However. when the turn-off characteristics are to be improved by the above method. the following drawback is caused. That is. in a turn-off operation of the thyristor of the prior art. when a negative voltage is applied to the gate electrode of the thyristor. a p-channel inversion layer is formed on the surface of the $n^-$-type semiconductor substrate between the p-type base region and the p-type source region. In this manner. the p-type base region. the p-type source region. and the cathode electrodes are short-circuited to each other. and the holes of the main current are discharged from the cathode electrode. However. in the turn-off operation. in the $p^-$-type base region (e.g.. reference numeral 3 in FIG. 3) serving as the on-gate region. the resistance is high. and the holes cannot be easily discharged. For this reason. the main current cannot be efficiently cut off.

Figure 42:
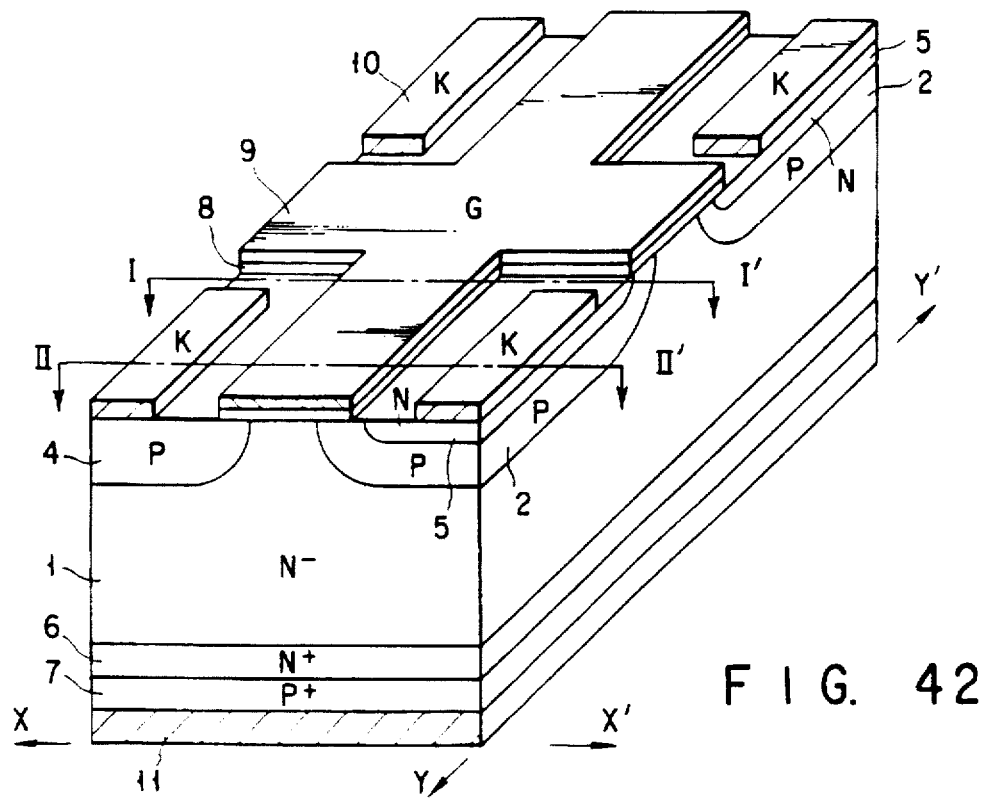
FIG. 42 is a view showing a semiconductor device according to the first embodiment of the fifth aspect of the present invention.
Figure 44:
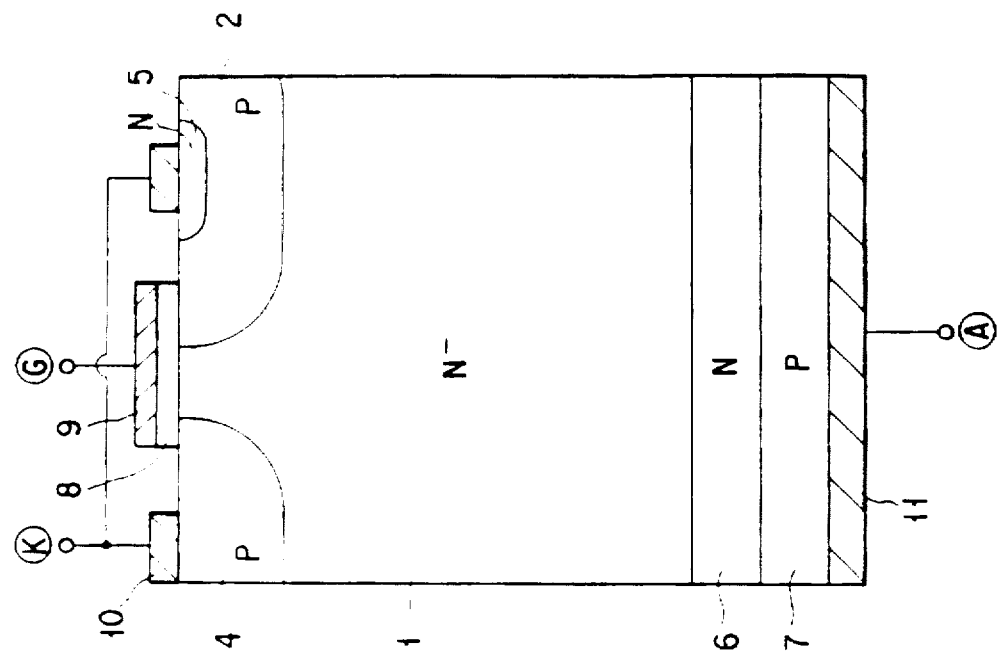
FIG. 44 is a sectional view showing the semiconductor device along a II—II' line in FIG. 42.
Figure 43:
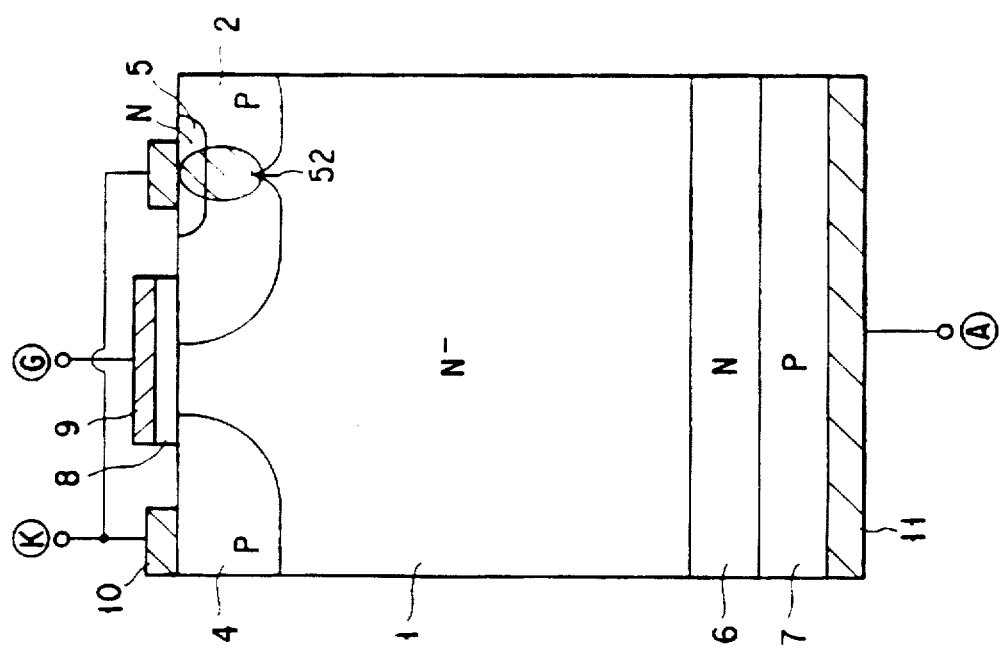
FIG. 43 is a sectional view showing the semiconductor device along a I—I' line in FIG. 42.

FIG. 42 shows a semiconductor device according to the first embodiment of the fifth aspect of the present invention. FIG. 43 is a sectional view showing the semiconductor device along a I—I' line in FIG. 42. and FIG. 44 is a sectional view showing the semiconductor device along a II—II' line in FIG. 42. Referring to FIGS. 42 and 44. reference numeral 1 denotes an $n^-$-type semiconductor substrate; 2. a p-type base region; 4. a p-type source region; 5. an n-type emitter region; 6. an $n^+$-type buffer layer; 7. a lower-surface $p^+$-type emitter layer; 8. a gate oxide film; 9. a polysilicon gate electrode; 10. cathode electrodes; and 11. an anode electrode.

In the semiconductor device according to the fifth aspect of the present invention. the efficiency of discharging holes of an on-gate portion in a turn-on operation is increased without degrading turn-on characteristics to improve turn-off characteristics obtained when the state of the semiconductor device is changed from an ON state to an OFF state. thereby improve trade-off between the turn-on characteristics and the turn-off characteristics.

According to the fifth aspect of the present invention. a conventional p-type base region 2 and a conventional $p^-$-type base region 3 are subjected to the following improvement. That is. the semiconductor device according to the fifth embodiment of the present invention does not have the $p^-$-type base region 3. In place of the $p^-$-type base region 3. as shown in FIG. 43. a portion 52 of the p-type base region 2 at an on-gate portion is shallowly formed (to have a low concentration). In this manner. the portion 52 has the same effect as that obtained when the $p^-$-type base region is substantially formed. In addition. since the on-gate portion 52 can be formed to have a minimum size. the on-gate portion 52 does not adversely affect the turn-off characteristics in the turn-off operation.

The steps in manufacturing a semiconductor device according to the fifth aspect of the present invention will be described below.

The $n^+$-type buffer layer 6 and the lower-surface $p^+$-type emitter layer 7 are formed on the $n^-$-type semiconductor substrate 1. The gate oxide film 8 and the polysilicon gate electrode 9 are formed.

As shown in FIG. 45. the p-type base region 2 and the p-type source region 4 are respectively formed in the surface regions of the substrate 1 using. e.g.. diffusion. At this time. unlike the semiconductor device of the prior art. cut portions (or slits) 53 are formed in the p-type base region 2 in advance such that portions serving as. e.g.. the on-gate portions. have a recessed shape in implantation of boron ions.

As shown in FIG. 46. when lateral diffusion of the p-type base region 2 is performed. the cut portions 53 of the p-type base region 2 are filled. and the p-type base region 2 in each cut portion is formed to have a small depth (a low concentration). As a result. the area of each portion 54 corresponding to a $p^-$-type base region is smaller than that of the conventional device (the area is minimized).

Finally. the cathode electrodes 10 and the anode electrode 11 are formed.

In the above steps in manufacturing the semiconductor device. unlike the prior art. the step of forming a $p^-$-type base region is omitted. and the number of steps is reduced. In addition. since the low-concentration p-type base region (shallow portion) 2 for forming n-channel inversion layers 54 is formed by lateral diffusion. the p-type base region 2 has a small area. Therefore. since the area of the $p^-$-type base region in which a current cannot be easily stopped in the turn-off operation can be decreased. the turn-off efficiency can be increased.

With reference to the turn-on characteristics. the shallow portion of the p-type base region 2 can drive an n-channel MOSFET as in the prior art without adversely affecting the formation of the n-channel inversion layers 54. As a result. since electrons are sufficiently supplied from the n-type emitter region 5 to the $n^-$-type substrate 1 in the turn-on operation. the turn-off operation is not degraded.

Figure 47A:
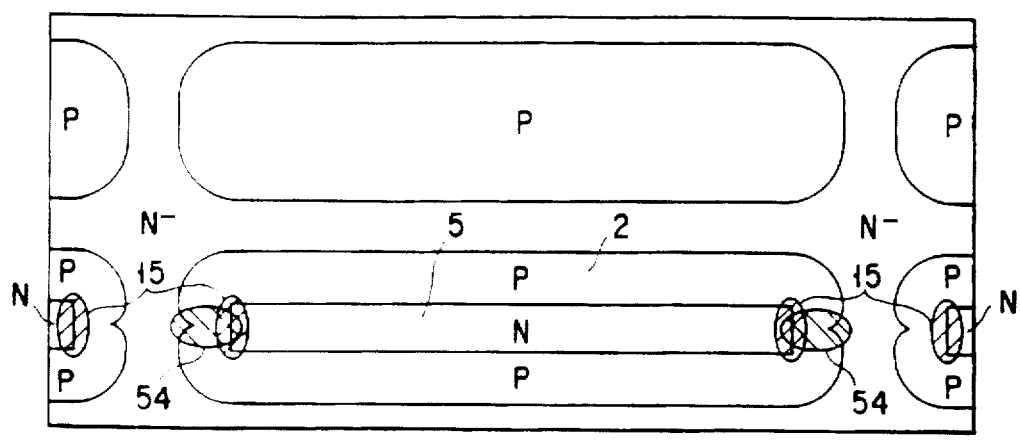
FIG. 47A to 47C are a view showing a turn-on operation of the semiconductor device in FIG. 42.
Figure 47B:
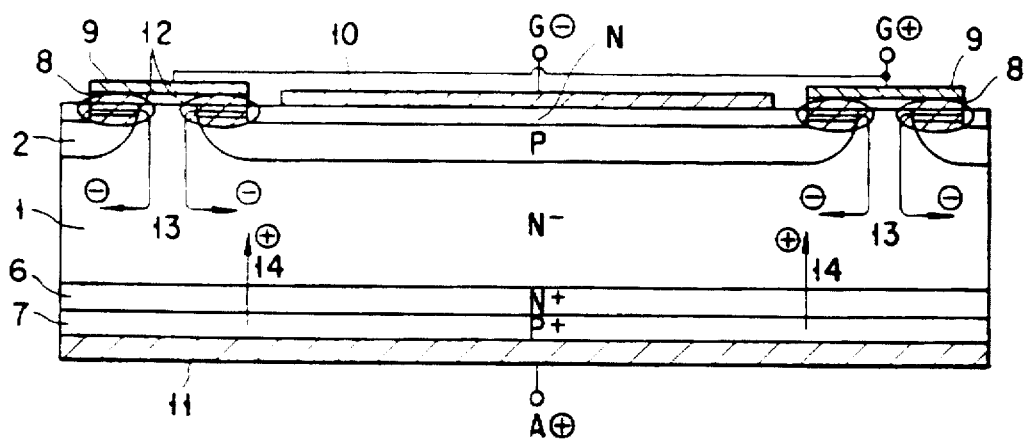
Figure 47C:
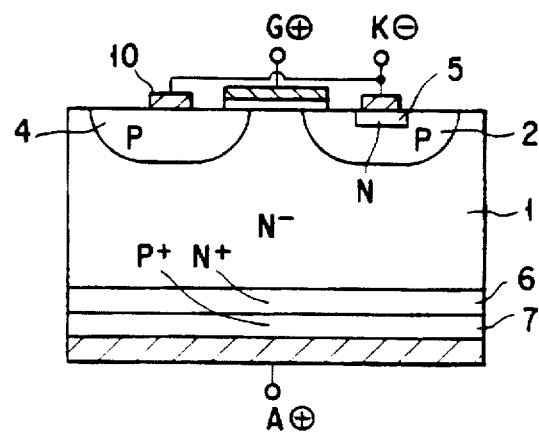

A turn-on operation will be described below with reference to FIG. 47A to 47C.

An anode is biased positive. cathodes are biased negative. and a gate is biased positive. In this state. an n-channel inversion layer is formed in each portion (on-gate region) 54 where the p-type base region 2 has a small depth. i.e.. the p-type base region 2 having a low concentration. and electrons are injected from the n-type emitter region 5 into the $n^-$-type base region (substrate) 1. Holes 14 are then induced from the lower-surface $p^+$-type emitter layer 7. conductivity modulation occurs in the $n^-$-type base region 1. and portions 15 where the n-type emitter region 5 is in contact with the on-gate regions become early turn-on areas. thereby starting a turn-on operation. A turn-on region extends over the entire area of the n-type emitter region 5. and the device is completely turned on.

A turn-off operation will be described below with reference to FIG. 48A to 48C.

The anode is biased positive. the cathodes are biased negative. and a main current 17 flows. In this state. when the gate is biased negative with respect to the cathode. n-channel inversion layers 12 which have been formed in the turn-on operation disappear. On the other hand. a p-channel inversion layer 16 is formed on the surface of the $n^-$-type base region (substrate) 1 between the p-type base region 2 and the p-type source region 4. and a path. i.e.. the p-type base region 2→the p-channel inversion layer→the p-type source region 4→the cathode electrode 10 is formed. In this manner. holes of the main current 17 are discharged through this path.

For this reason. injection of electrons from the n-type emitter region 5 is stopped to stop flowing a main current I. In the fifth aspect of the present invention. an early turn-off area 19 serves as a part of the n-type emitter region on the p-type source region 4 side. and the turn-off area finally extends over the entire area of the emitter region 5. thereby turning off the thyristor.

Figure 49:
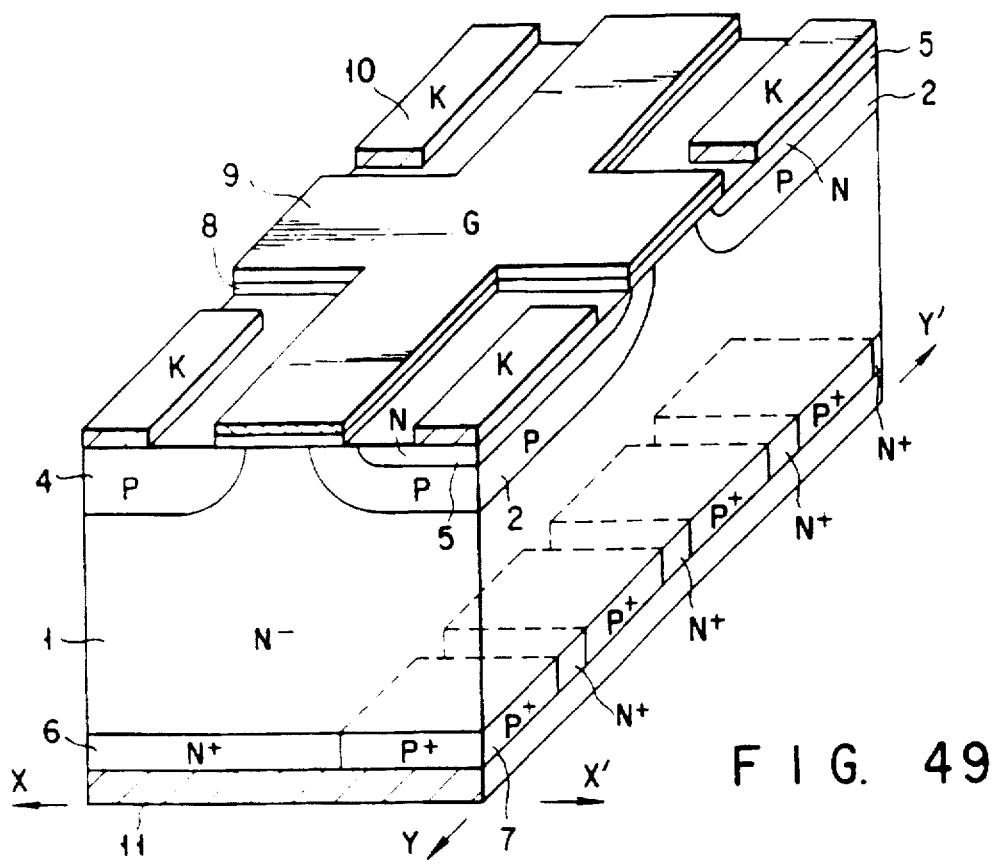
FIG. 49 is a view showing a modification of the semiconductor device in FIG. 42.

Note that the semiconductor device of the fifth aspect of the present invention can be applied to a structure in which. as shown in FIG. 49. the anode electrode 11 is connected to the n⁺-type buffer layer 6 and the lower-surface p⁺-type emitter layer 7 to short-circuit the n⁺-type buffer layer 6 to the lower-surface p⁺-type emitter layer 7.

Figure 50:
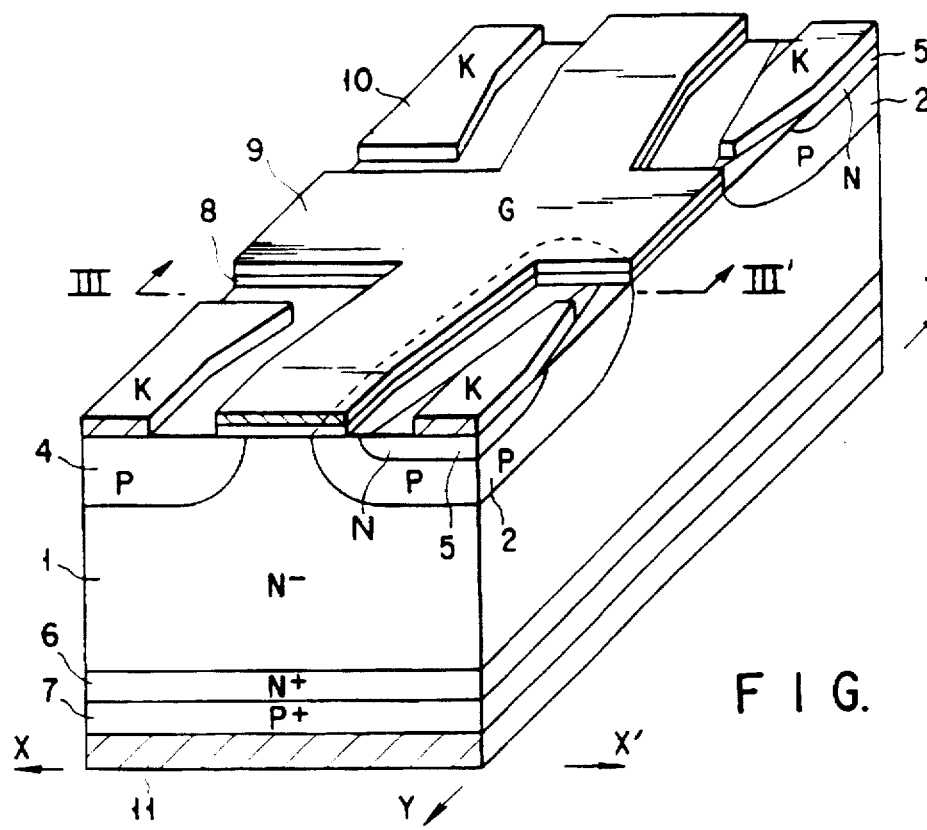
FIG. 50 is a view showing a semiconductor device according to the second embodiment of the fifth aspect of the present invention.

FIG. 50 shows a semiconductor device according to the second embodiment of the fifth aspect of the present invention. Referring to FIG. 50, reference numeral 1 denotes an n⁻-type semiconductor substrate; 2, a p-type base region; 4, a p-type source region; 5, an n-type emitter region; 6, an n⁺-type buffer layer; 7, a lower-surface p⁺-type emitter layer; 8, a gate oxide film; 9, a polysilicon gate electrode; 10, cathode electrodes; and 11, an anode electrode.

This second embodiment is different from the first embodiment shown in FIG. 42 in the following point. That is, in the second embodiment, the end portions of p-type base region 2 serving as an on-gate region are decreased in width to be narrowed. More specifically, the width of each of the p-type base region 2, the n-type emitter region 5, and the cathode electrode 10 on the n-type emitter region 5 is decreased at the on-gate portions. The arrangement of the remaining portions is the same as that in the first embodiment.

With the above arrangement, the area of the on-gate region is further decreased. For this reason, the area of a portion where the main current is left in the turn-off operation is minimized, thereby improving the turn-off characteristics.

The steps in manufacturing the semiconductor device in FIG. 50 will be described below.

The n⁺-type buffer layer 6 and the lower-surface p⁺-type emitter layer 7 are formed on the n⁻-type semiconductor substrate 1. The gate oxide film 8 and the polysilicon gate electrode 9 are formed.

Figure 51:
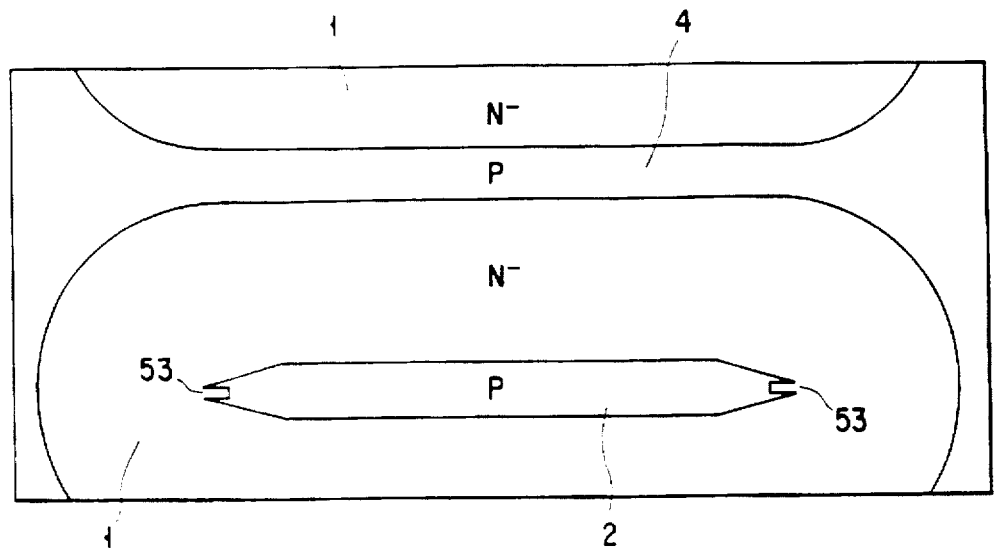
FIGS. 51 and 52 are views showing a method of manufacturing a semiconductor device according to the second embodiment of the fifth aspect of the present invention.

As shown in FIG. 51, by using, e.g., an ion-implantation method, boron is implanted in regions, in which the p-type base region 2 and the p-type source region 4 are to be formed, in the surface region of the substrate 1. In this case, in the region in which the p-type base region 2 is to be formed, portions which are to be on-gate portions are sharpened, and boron is implanted in the region to form a recessed portion (cut portion) 53 at each of the end portions.

Figure 52:
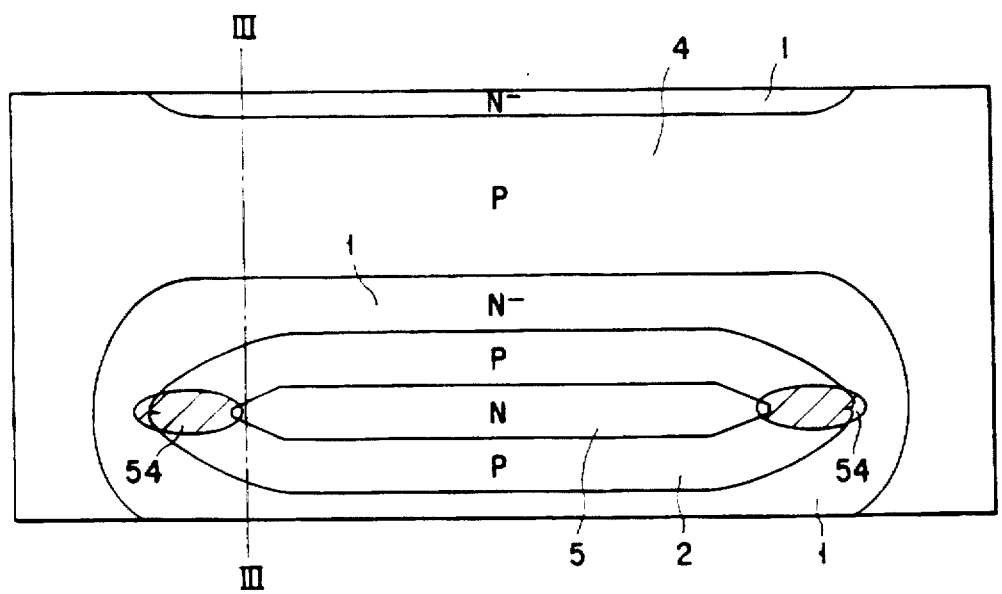

As shown in FIG. 52, the p-type base region 2 and the p-type source region 4 are formed using thermal diffusion. At this time, although the cut portions 53 in the p-type base region 2 are filled, the p-type base region 2 in each of the cut portions has a small depth (low concentration). As a result, the area of a portion 54 corresponding to the p⁻-type base region is smaller than that of a conventional device. Thereafter, the n-type emitter region 5, the cathode electrodes 10, and the anode electrode 11 are formed.

Figure 53:
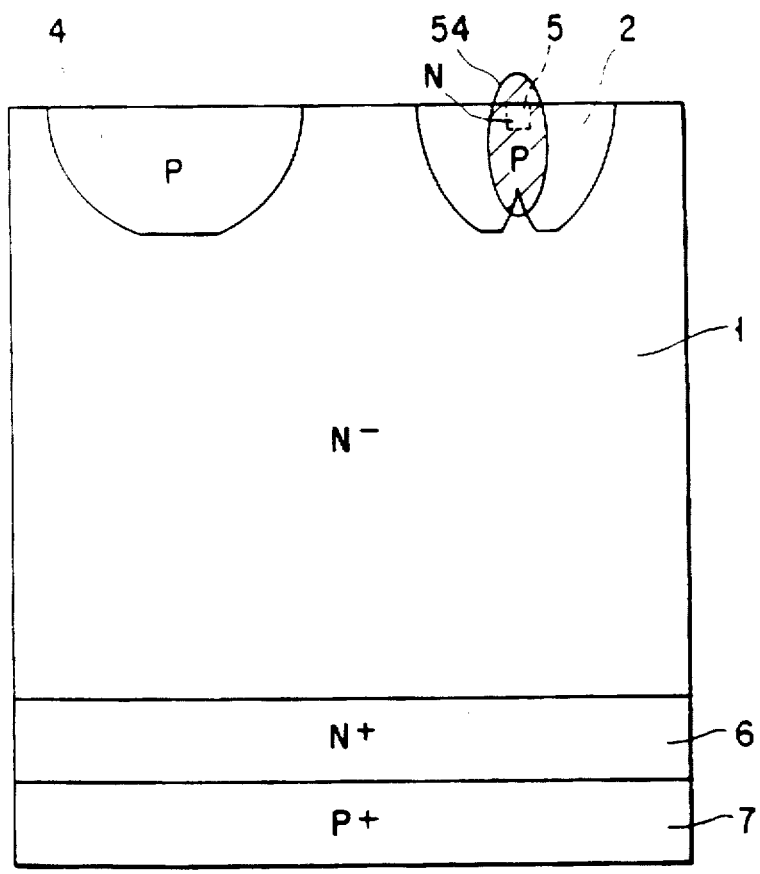
FIG. 53 is a sectional view showing the semiconductor device along a III—III' line in FIG. 50.

FIG. 53 shows a sectional view showing the semiconductor device along a III—III' line in FIG. 50 or 52. When the method of manufacturing the semiconductor device is used, the diffusion depth of each of the on-gate portions of the p-type base region 2 can be decreased (its concentration can be decreased). This means that a p⁻-type base region is substantially formed. In addition, since the p⁻-type base region is considerably smaller than that of the conventional device, turn-off characteristics can be improved.

Since the operation of the semiconductor device according to this embodiment is the same as that of the semiconductor device in the first embodiment, a description thereof will be omitted. Note that, for reference, the state of the semiconductor device in a turn-on operation is shown in FIG. 54A to 54C, and the state of the semiconductor device in a turn-off operation is shown in FIG. 55A to 55C.

Figure 56:
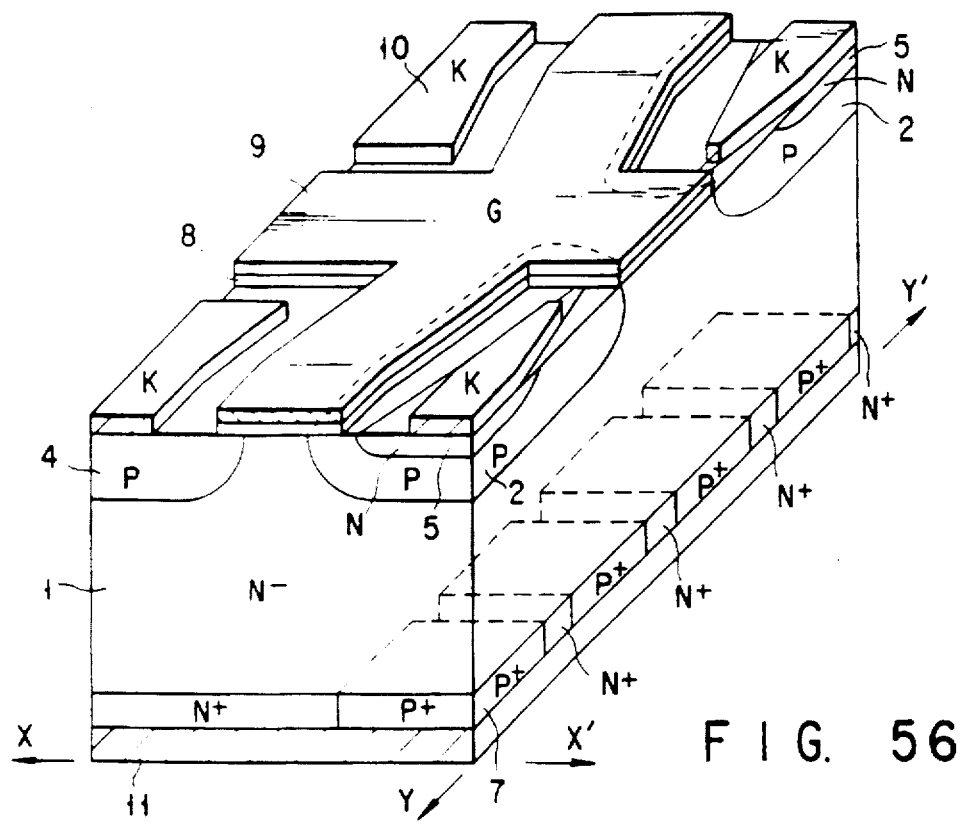
FIG. 56 is a view showing a modification of the semiconductor device in FIG. 50.

In the second embodiment, as shown in FIG. 56, the anode electrode 11 may be connected to the n⁺-type buffer layer 6 and the lower-surface p⁺-type emitter layer 7 to short-circuit the n⁺-type buffer layer 6 to the lower-surface p⁺-type emitter layer 7.

The fifth aspect of the present invention is not limited to the above two embodiment, and can be applied to a semiconductor device having a double gate structure or a semiconductor having a structure in which the n⁻-type substrate 1 is replaced with a p⁻-type substrate, and a p-channel MOSFET and an n-channel MOSFET are respectively used as an on-channel and an off-channel.

According to the fifth aspect of the present invention, the following effect can be obtained.

In the conventional technique, in order to improve the turn-off characteristics, the concentrations of the p-type base region 2 and the p-type source region 4 are increased, and the resistance of a path, constituted by the p-type base region, the p-channel inversion layer, the p-type source region, and the cathode electrode, for discharging holes, thereby improving the turn-off characteristics. Therefore, in the conventional technique, the efficiency of discharging holes in the p⁻-type base region 3 serving as an on-gate region is decreased.

In contrast to this, according to the fifth aspect of the present invention, the p⁻-type base region serving as an on-gate region is formed by lateral diffusion of the p-type base region 2. That is, a low-concentration on-gate regions are formed between the adjacent p-type base regions 2. For this reason, when the time and temperature of the lateral diffusion of the p-type case region 2 are controlled, the width and concentration of the on-gate region can be freely changed.

Therefore, in the turn-off operation, holes can be efficiently discharged from the p-type base region 2, and, unlike the conventional device, the main current left in the p⁻-type base region is not generated, thereby increasing the turn-off efficiency. On the other hand, in the turn-off operation, as in the conventional device, the n-channel inversion layer is formed in the on-gate region. For this reason, electrons are injected from the n-type emitter region 5 into the n⁻-type substrate 1, and the turn-on characteristics are not degraded. In addition, since the on-gate region in which electrons can be injected from the n-type emitter region 5 into the n⁻-type substrate 1 can be minimized, the on-gate region does not adversely affect the turn-off characteristics in the turn-off operation.

In addition, since the end portions (on-gate portions) of the p-type base region and the end portions of the n-type emitter region are sharpened, controllability of the width of the p⁻-type base region can be excellent, and injection of electrons from the emitter region in the turn-off operation can be easily stopped.

As described above, according to the fifth aspect of the present invention, the turn-off characteristics can be improved without degrading the turn-on characteristics, and trade-off between the turn-on characteristics and the turn-off characteristics can be improved.

In addition, according to the fifth aspect of the present invention, since the p⁻-type base region serving as the on-gate region is formed by lateral diffusion of the p-type base region 2, the step, which is required in the prior art, of forming the p⁻-type base region can be omitted. For this reason, an effect of simplifying or shortening the steps can be obtained.

The sixth aspect of the present invention will be described below.

In the Description of the Related Art, an MCT is developed as a self-turn-off device to improve its turn-off efficiency having priority over other conditions. In a conventional technique, in order to increase the turn-off efficiency, an on-gate portion is separated from an off-gate portion, and a ratio of the area of the off-gate portion to the area of the on-gate portion is set such that most of the area of the gate is used as the off-gate portion. In addition, in portions except for the on-gate portion, in order to improve turn-off characteristics, the concentration of a p-type base region is increased, and a method of decreasing the resistance of a path, formed in a turn-off operation and constituted by the p-type base region, a p-channel inversion layer, and a p-type source region, for discharging a hole current is used.

However, when the turn-off characteristics are to be improved by the above method, the p-type base region and the p-type source region constituting a p-channel MOSFET serving as an off-gate are formed by lateral diffusion. For this reason, the concentrations of the p-type case region and the p-type source region are decreased, the ON resistance of the p-channel MOSFET is not decreased to fail an improvement on the turn-off characteristics.

Figure 57:
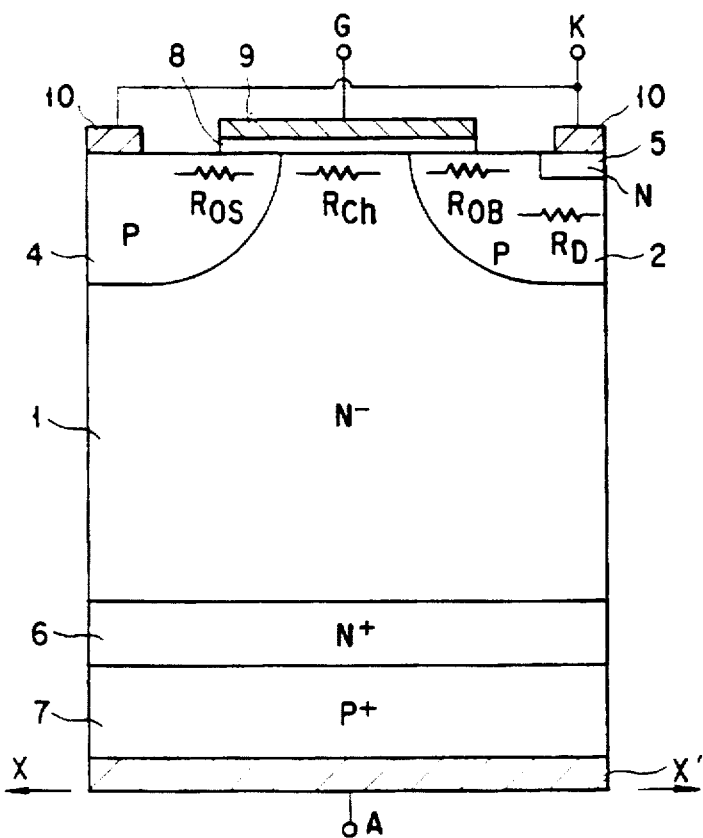
FIG. 57 is a view illustrating resistances which influence turn-off characteristics.

This will be described in detail. FIG. 57 illustrates resistance which influence the semiconductor device in a turn-off operation.

As shown in FIG. 57, the resistance which influence the turn-off characteristics in the turn-off operation are a diffusion resistance $R_D$ of a p-type base region 2 immediately under an n-type emitter region 5 and an ON resistance $R_{On}$ of the p-channel MOSFET. The ON resistance $R_{On}$ can be divided into a pure channel resistance $R_{ch}$ and diffusion resistances $R_{OB}$ and $R_{OS}$ in the lateral direction of the p-type base region 2 and the p-type source region 4.

That is, a total resistance $R_A$ of these resistances which influences the turn-off characteristics is given by:

$$R_A = R_D + R_{ch} + R_{OB} + R_{OS} \quad (1)$$

In this case, for descriptive convenience, the diffusion resistance components $R_{OB} + R_{OS}$ of the p-channel MOSFET is substituted by $R_O$, equation (1) is rewritten into:

$$R_A = R_D + R_{ch} + R_O \quad (2)$$

As described above, when the resistance $R_A$ which influences the turn-off characteristics is divided into the diffusion resistance $R_D$ of the p-type base region 2, the channel resistance $R_{ch}$ of the p-channel MOSFET, and the diffusion resistance $R_O$ of the p-channel MOSFET, and the resistances are compared with each other with reference to the resistance $R_D$, the following result can be obtained:

$$R_O : R_{ch} : R_D = 1000 : 100 : 1 \quad (1)$$

More specifically, it is understood that a resistance which most largely influences the turn-on characteristics is the diffusion resistance $R_O$ of the p-channel MOSFET. Therefore, as in the conventional technique, when the diffusion resistance $R_D$ is to be decreased by increasing the concentrations of the p-type base region 2 and the p-type source region 4, the turn-off characteristics cannot be effectively improved because the total resistance is largely dependent on the diffusion resistance $R_O$ of the p-channel MOSFET.

In other words, the diffusion resistance $R_O$ of the p-channel MOSFET must be decreased to effectively improve the turn-off characteristics.

Figure 58:
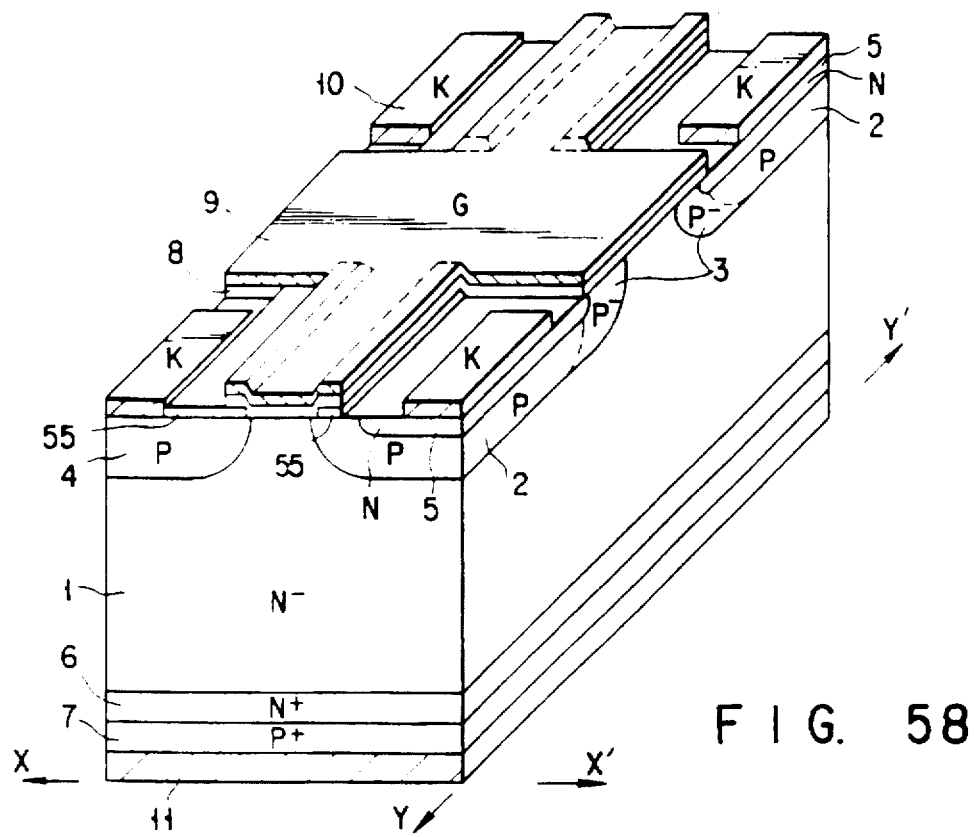
FIG. 58 is a semiconductor device according to the first embodiment of the sixth aspect of the present invention.

FIG. 58 shows a semiconductor device according to the first embodiment of the sixth aspect of the present invention. Referring to FIG. 58, reference numeral 1 denotes an n⁻-type semiconductor substrate; 2, a p-type base region; 3, p⁻-type base regions; 4, a p-type source region; 5, an n-type emitter region; 6, an n⁺-type buffer layer; 7, a lower-surface p⁺-type emitter layer; 8, a gate oxide film; 9, a polysilicon gate electrode; 10, cathode electrodes; 11, an anode electrode; and 55, low-resistance films.

In the semiconductor device of the sixth aspect of the present invention, in order to improve turn-off characteristics obtained when the state of a thyristor is changed from an ON state to an OFF state, the diffusion resistance $R_O$ of the p-channel MOSFET serving as a resistance which most largely influences the turn-off characteristics is decreased to improve trade-off between turn-on characteristics and the turn-off characteristics.

In the sixth aspect of the present invention, the low-resistance layer 55 is formed on each of the surfaces of the p-type base region 2 and the p-type source region 4, and a current flows in the low-resistance layer 55 when the p-channel MOSFET is set in an ON state, thereby decreasing the diffusion resistance $R_O$ of the p-channel MOSFET.

On the surface of the p-type base region 2, the low-resistance layer 55 is formed in only the p-type base region 2 not to be in contact with the n⁻-type substrate 1 and the n-type emitter region 5. In addition, on the surface of the p-type source region 4, the low-resistance layer 55 is formed between the cathode electrode 10 and the n⁻-type substrate 1 and connected to the cathode electrode 10. Although any film having a resistance lower than that of the diffusion resistance $R_O$ of the p-channel MOSFET may be used as each of the low-resistance layers 55, a metal film is mainly used, and a refractory metal film (e.g., a tungsten silicide film, a titanium silicide film, or a molybdenum silicide film) is used as the low-resistance layer 55 for the manufacturing steps.

The steps in manufacturing the semiconductor device in FIG. 58 will be briefly described below.

The n⁺-type buffer layer 6 and the lower-surface p⁺-type emitter layer 7 are formed on the n⁻-type semiconductor substrate 1. The p-type base region 2, the p⁻-type base region 3, the p-type source region 4, and the n-type emitter region 5 are respectively formed in the surface regions of the substrate 1 by diffusion.

The low-resistance layer 55 is formed on the entire surface of the resultant structure and patterned to form predetermined patterns of the low-resistance layers 55 on the surface of the p-type base region 2 and the p-type source region 4.

The gate oxide film 8 and the polysilicon gate electrode 9 are formed. The cathode electrodes 10 are respectively formed on the p-type source region 4 and the n-type emitter region 5, and the anode electrode 11 is formed on the lower-surface p⁺-type emitter layer 7.

Figure 59A:
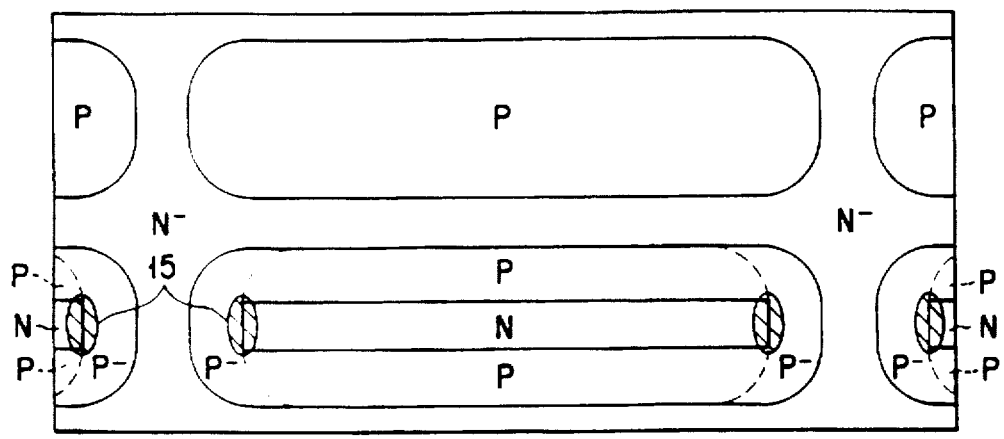
FIG. 59A to 59C are a view showing a turn-on operation of the semiconductor device in FIG. 58.
Figure 59B:
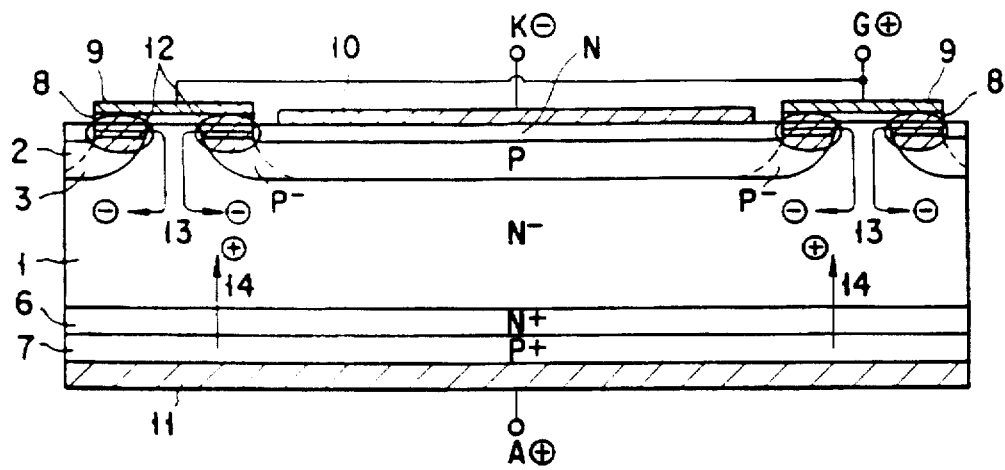
Figure 59C:
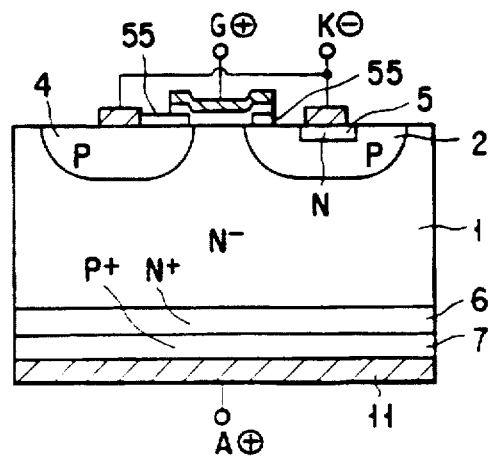

A turn-on operation will be described below with reference to FIG. 59A to 59C.

An anode is biased positive, cathodes are biased negative, and a gate is biased positive. In this state, n-channel inversion layers 12 are formed in the p⁻-type base regions 3, and electrons are injected from then n-type emitter region 5 into the n⁻-type base region (substrate) 1. In this manner, holes 14 are induced from the lower-surface p⁺-type emitter layer 7, conductivity modulation occurs in the n⁻-type base region 1, and portions 15 where the p⁻-type base regions 3 are in contact with the n-type emitter region 5 become early turn-on areas, thereby starting the turn-on operation. A turn-on region extends over the entire area of the n-type emitter region 5, and the device is completely turned on.

Figure 60A:
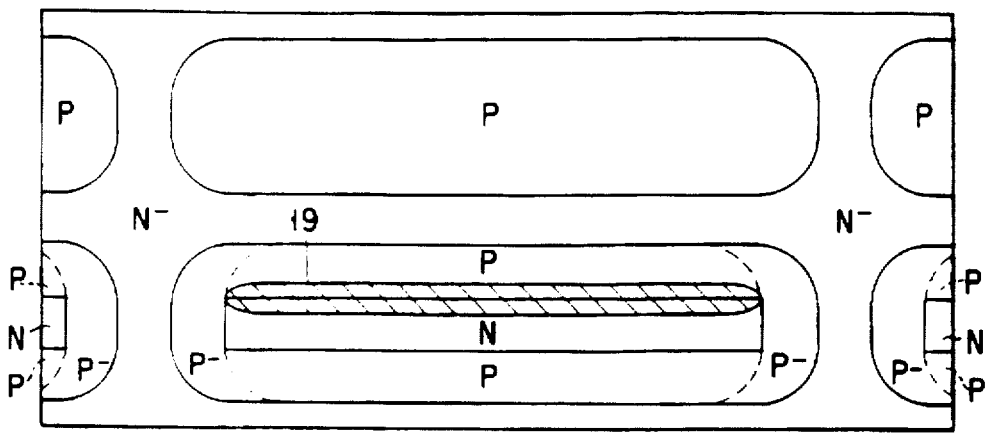
FIG. 60A to 60C are a view showing a turn-off operation of the semiconductor device in FIG. 58.
Figure 60B:
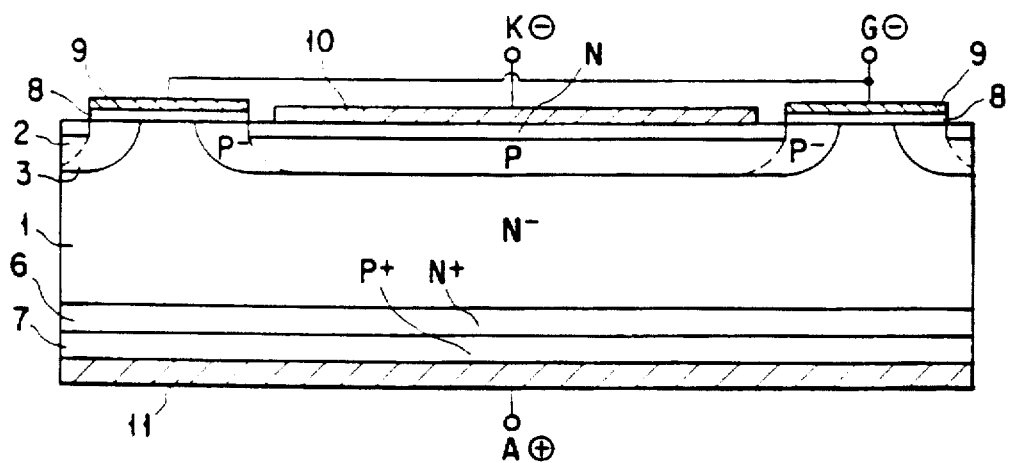
Figure 60C:
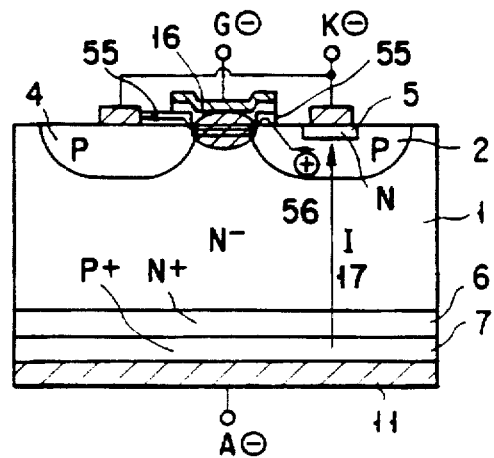

A turn-off operation will be described below with reference to FIG. 60A to 60C.

The anode is biased positive, the cathodes are biased negative, and a main current 17 flows. In this state, when the gate is biased negative with respect to the cathodes, the n-channel regions which are formed during the turn-on operation disappear. On the other hand, a p-channel inversion layer 16 is formed on the surface of the n$^-$-type base region (substrate) 1 between the p-type base region 2 and the p-type source region 4. As a result, a path, i.e., the p-type base region 2→the low-resistance layer 55→the p-channel inversion layer→the low resistance layer 55→the cathode electrode 10, is formed, and holes 56 of the main current 17 are discharged to the cathode electrode 10 through this path.

Since the above operation stops injection of electrons from the n-type emitter region 5, the main current 17 does not flow. Note that a turn-off region becomes a portion 19 of the n-type emitter region on the p-type source region 4 side at the beginning, and the turn-off region extends over the entire area of the n-type emitter region 5 at last.

According to the above arrangement, the semiconductor of the sixth aspect of the present invention has the low-resistance layers 55 on the p-type base region 2 and the p-type source region. In this manner, a diffusion resistance $R_O$ of the p-channel MOSFET can be decreased, and the holes 56 in the p-type base region 2 can be discharged from the p-type base region 2 to the cathode electrode 10 through the p-type source region 4. Therefore, the semiconductor device contributes to the improvement on the turn-off characteristics.

An effect of the sixth aspect of the present invention will be described below in detail.

Figure 61:
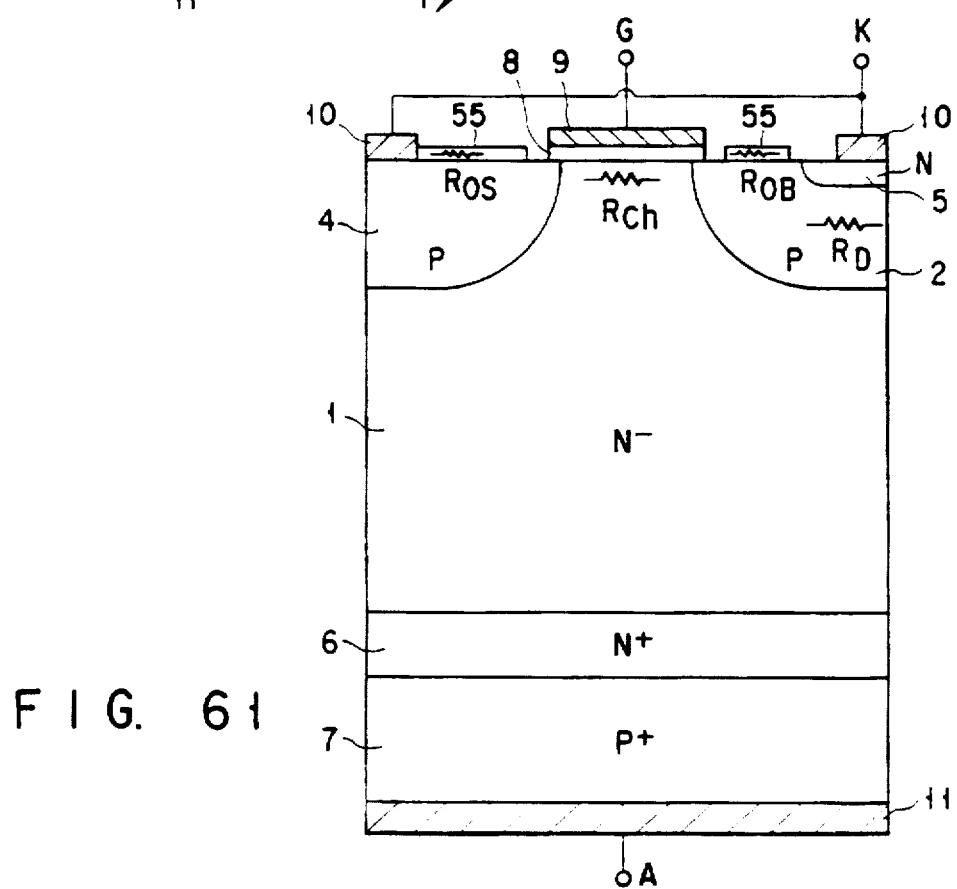
FIG. 61 is a view showing resistance which influence the turn-off characteristics of a semiconductor device according to the sixth aspect of the present invention.

FIG. 61 illustrates, in a semiconductor device according to the sixth aspect of the present invention, resistances which influence the characteristics of the semiconductor device in a turn-off operation, and corresponds to FIG. 57 illustrating resistances which influence the characteristics of a conventional semiconductor device.

In the conventional technique, it is important to decrease the resistance of the diffusion resistance RD, of the p-type base region 2, of the resistances which influence the turn-off characteristics. In contrast to this, according to the sixth aspect of the present invention, the diffusion resistance $R_O$ of the p-channel MOSFET is decreased.

The sixth aspect of the present invention has the following characteristic feature. That is, the low-resistance layers 55 are formed on the surfaces of the p-type base region 2 and the p-type source region 4, respectively, and holes in the p-type base region 2 are discharged to the cathode electrodes 10 through the low-resistance layers 55 in the turn-off operation. More specifically, since a hole current flows in a refractory metal film such as a tungsten silicide film having, e.g., a resistance of almost zero, the diffusion resistance $R_O$ is eliminated, thereby improving the turn-off characteristics.

In FIG. 61, as in the prior art (FIG. 57), when a resistance which influences the turn-off characteristics is divided into a diffusion resistance $R_D$ of the p-type base region 2 immediately under the n-type emitter region 5, a channel resistance $R_{ch}$ of the p-channel MOSFET, and the diffusion resistance $R_O$ ($R_{OS}+R_{OB}$) of the p-channel MOSFET, a ratio of the resistances is given by:

$$R_O \cdot R_{ch} \cdot R_D = 100:100:1 \quad (1)$$

More specifically, the diffusion resistance $R_O$ of the p-channel MOSFET which most largely influences the turn-off characteristics is 1/10 that of the conventional device. For this reason, a total resistance $R_A$ is reduced to 1/10 that of the conventional device.

As described above, according to the sixth aspect of the present invention, since the resistance which influences the turn-off characteristics can be decreased, a hole current can be efficiently discharged to the cathode electrodes. Therefore, the turn-off characteristics can be improved. In addition, the turn-on characteristics are not influenced, and the same turn-off characteristics as those of the prior art can be obtained. That is, the turn-off characteristics can be improved without degrading the turn-on characteristics, and trade-off between the turn-on characteristics and the turn-off characteristics can be improved.

The size, shape, area, and the like of each of the low-resistance layers 55 are not limited to those of the embodiment of the sixth aspect of the present invention only if the low-resistance layers 55 are formed on the surfaces of the p-type base region 2 and the p-type source region 4.

The semiconductor device according to the sixth aspect of the present invention can be applied to a structure in which, as shown in FIG. 62, the anode electrode 11 is connected to the n$^+$-type buffer layer 6 and the lower-surface p$^+$-type emitter layer 7 to short-circuit the n$^+$-type buffer layer 6 to the lower-surface p$^+$-type emitter layer 7.

FIG. 63 shows a semiconductor device according to the second embodiment of the sixth aspect of the present invention. Referring to FIG. 63, reference numeral 1 denotes an n$^-$-type semiconductor substrate; 2, p-type base regions; 3, a p$^-$-type base region; 4, a p-type source region; 5, an n-type emitter region; 6, an n$^+$-type buffer layer; 7, a lower-surface p$^+$-type emitter layer; 8, a gate oxide film; 9, a polysilicon gate electrode; 10, cathode electrodes; 11, an anode electrode; and 55, low-resistance films.

The semiconductor device of this embodiment is different from the semiconductor device according to the first embodiment shown in FIG. 58 in the following point. That is, although the low-resistance layer 55 overlaps the gate oxide film 8 and the polysilicon gate electrode 9 in the first embodiment, the low-resistance layer 55 does not overlap the gate oxide film 8 and the polysilicon gate electrode 9 in the second embodiment. Other points of the second embodiment are the same as those of the first embodiment.

Therefore, the low-resistance layer 55 can be formed after the polysilicon gate electrode 9 and the cathode electrodes 10 are formed.

The steps in manufacturing the semiconductor device in FIG. 63 will be briefly described below.

The n$^+$-type buffer layer 6 and the lower-surface p$^+$-type emitter layer 7 are respectively formed on the n$^-$-type semiconductor substrate 1. The gate oxide film 8 and the polysilicon gate electrode 9 are formed.

Thereafter, the p-type base region 2, the p$^-$-type base regions 3, the p-type source region 4, and the n-type emitter region 5 are respectively formed in the surface regions of the substrate 1. The low-resistance layer 55 is formed on the entire surface of the resultant structure, and the low-resistance layer 55 is patterned to form predetermined patterns of the low-resistance layers 55 on the surfaces of the p-type base region 2 and the p-type source region 4.

After the surfaces of the low-resistance layers 55 are oxidized, openings are partially formed in the resultant oxide film, and the cathode electrodes 10 are formed on the p-type source region 4 and the n-type emitter region 5. The anode electrode 11 is formed on the lower-surface p$^+$-type emitter layer 7.

In this embodiment, the same effect as described in the first embodiment can be obtained. Note that, since an operational principle of the semiconductor device is the same as that of the first embodiment, a description thereof will be omitted.

Figure 64:
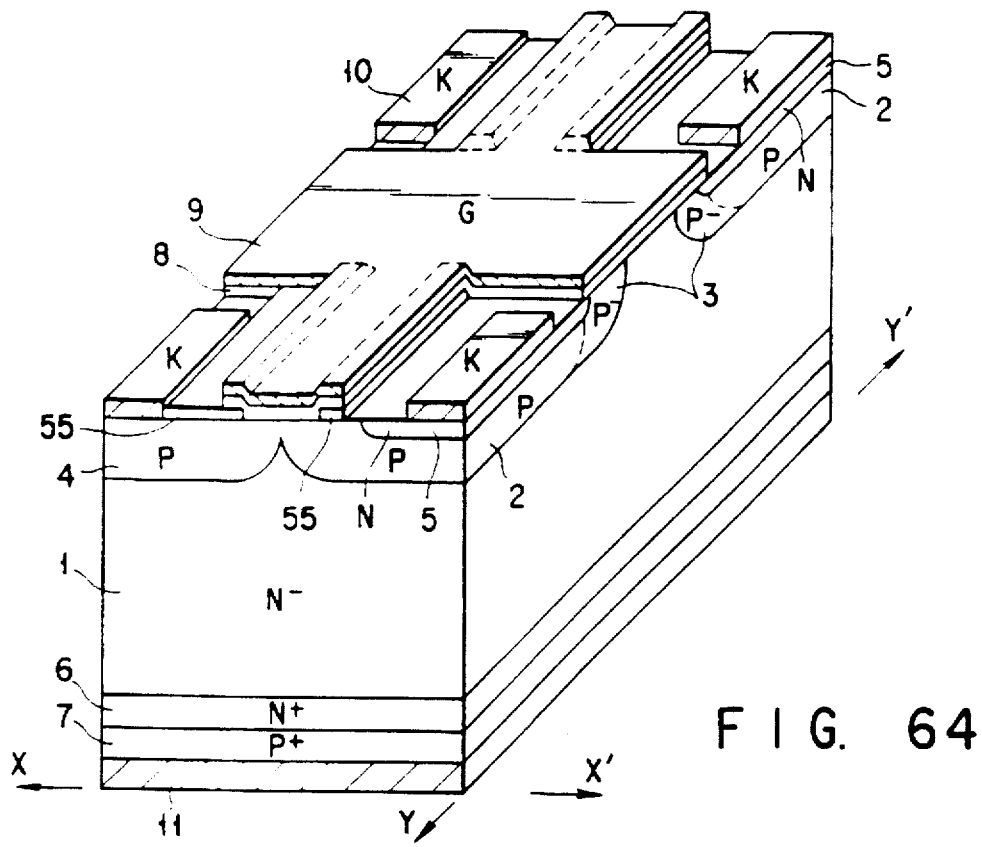
FIG. 64 is a view showing a semiconductor device according to the third embodiment of the sixth aspect of the present invention.

FIG. 64 shows a semiconductor device according to the third embodiment of the sixth aspect of the present invention. Referring to FIG. 64, reference numeral 1 denotes an n⁻-type semiconductor substrate; 2, a p-type base region; 3, p⁻-type base regions; 4, a p-type source region; 5, an n-type emitter region; 6, an n⁺-type buffer layer; 7, a lower-surface p⁺-type emitter layer; 8, a gate oxide film; 9, a polysilicon gate electrode; 10, cathode electrodes; 11, an anode electrode; and 55, low-resistance films.

This semiconductor device is a device in which a depression type MOSFET is used as the p-channel MOSFET serving as the off-gate in the first embodiment. The semiconductor device of the second embodiment has the same operational principle as that of the semiconductor device of the first embodiment.

In the second embodiment, the same effect as described in the first embodiment can be obtained.

Figure 65:
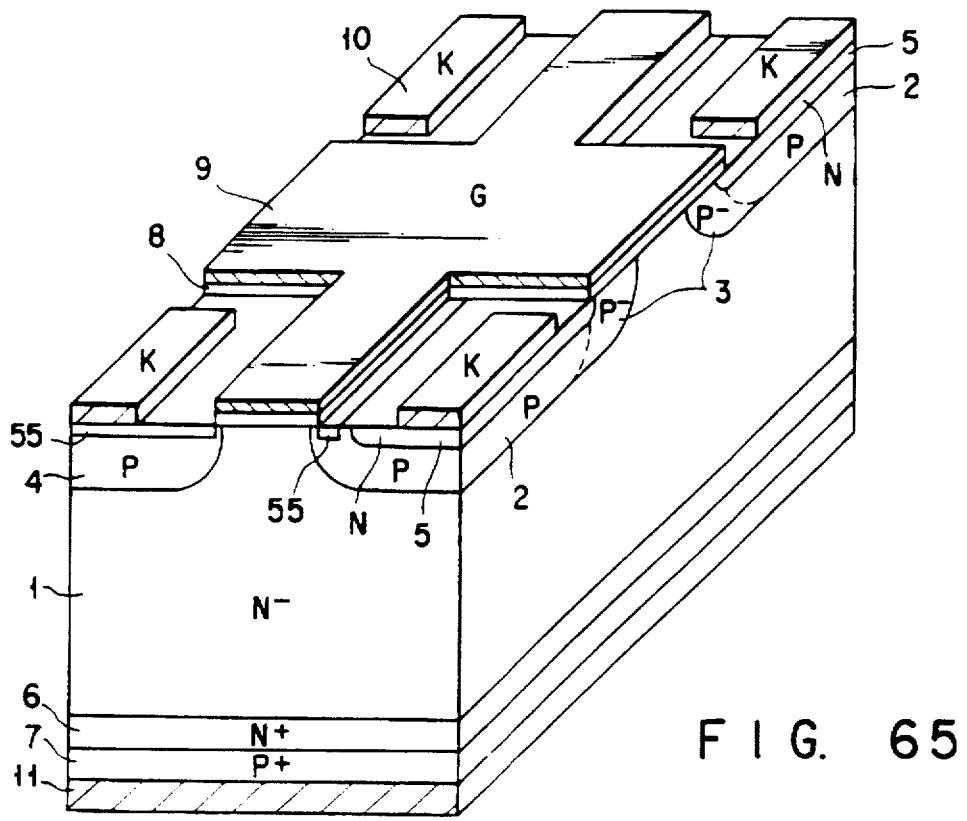
FIG. 65 is a view showing a semiconductor device according to the fourth embodiment of the sixth aspect of the present invention.

FIG. 65 shows a semiconductor device according to the fourth embodiment of the sixth aspect of the present invention. Referring to FIG. 65, reference numeral 1 denotes an n⁻-type semiconductor substrate; 2, a p-type base region; 3, p⁻-type base regions; 4, a p-type source region; 5, an n-type emitter region; 6, an n⁺-type buffer layer; 7, a lower-surface p⁺-type emitter layer; 8, a gate oxide film; 9, a polysilicon gate electrode; 10, cathode electrodes; 11, an anode electrode; and 55, low-resistance films.

This semiconductor device is a device in which the low-resistance layers 55 are buried in the p-type base region 2 and the p-type source region 4, respectively, in the first embodiment. The semiconductor device has the same operational principle as that of the semiconductor device of the first embodiment.

The steps in manufacturing the semiconductor device in FIG. 65 will be briefly described below.

The n⁺-type buffer layer 6 and the lower-surface p⁺-type emitter layer 7 are formed on the n⁻-type semiconductor substrate 1. The gate oxide film 8 and the polysilicon gate electrode 9 are formed. Thereafter, the p-type base region 2, the p⁻-type base regions 3, the p-type source region 4, and the n-type emitter region 5 are formed in the surface regions of the substrate 1, respectively, by diffusion.

The surfaces of the p-type base region 2 and the p-type source region 4 are partially etched to form recessed portions each having a predetermined depth. Thereafter, the low-resistance layer 55 is formed on the entire surface of the resultant structure and patterned to leave the low-resistance layers 55 in only the recessed portions. In addition, after the surfaces of the low-resistance layers 55 are oxidized, openings are partially formed in the oxide films, and the cathode electrodes 10 are formed on the low-resistance layer 55 and the n-type emitter region 5. The anode electrode 11 is formed on the lower-surface p⁺-type emitter layer 7.

In this embodiment, the same effect as described in the first embodiment can be obtained. Note that, since an operational principle of the semiconductor device is the same as that of the semiconductor device of the first embodiment, a description thereof will be omitted.

As described above, according to the present invention, the following effects can be obtained.

First, a shorted emitter structure in which both a p-type base region and an n-type emitter region are connected to cathode electrodes is used. Second, an auxiliary p-type emitter region, formed immediately under a gate electrode, for assuring the breakdown voltage of the device is connected to a p-type source region connected to the cathode electrode. Third, the p-type base region is constituted by a plurality of diffusion layers which are electrically connected to each other.

Therefore, the turn-off characteristics of an on-gate portion in which a turn-on area is easily left can be improved, and the turn-off characteristics of the device can be improved. In addition, the turn-on characteristics can be improved without degrading the turn-off characteristics, and trade-off between the turn-on characteristics and the turn-off characteristics can be improved.

Fourth, the depth of the n-type emitter region partially varies, i.e., the impurity concentration of the n-type emitter region is partially decreased. Fifth, a p⁻-type base region is formed by the junction of the p-type base region such that an n-channel inversion layer in an on-gate region is minimized. Sixth, a low-resistance film is formed on each of the p-type base region and the p-type source region to eliminate a diffusion resistance component which most influences the turn-off characteristics.

Therefore, the turn-off characteristics can be improved without degrading the turn-on characteristics, and trade-off between the turn-on characteristics and the turn-off characteristics can be improved.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor device comprising:

a semiconductor substrate of a first conductivity type;

a first semiconductor region of a second conductivity type formed on a first major surface of said semiconductor substrate;

a second semiconductor region of the first conductivity type formed in said first semiconductor region;

a first electrode being formed to be in contact with both said first and second semiconductor regions;

a third semiconductor region of the second conductivity type formed on a second major surface of said semiconductor substrate;

a second electrode formed to be in contact with said third semiconductor region;

a fourth semiconductor region of the second conductivity type formed in only a part of an end portion of said first semiconductor region and in contact with said first semiconductor region and having an impurity concentration lower than that of said first semiconductor region;

a gate electrode formed above said semiconductor substrate, with an insulating film interposed, and surrounding said first and fourth semiconductor regions; and a fifth semiconductor region of the second conductivity type formed on the first major surface of said semiconductor substrate to be adjacent to said first semiconductor region such that said semiconductor substrate is located between said first semiconductor region and fifth semiconductor region, and said gate electrode formed on said semiconductor substrate, said first semiconductor region, and said fifth semiconductor region through said insulating film. wherein said first electrode is formed to be in contact with said fifth semiconductor region.

2. The device according to claim 1. further comprising:
a first contact region where said first semiconductor region and said semiconductor substrate contact each other is larger than a second contact region where said fourth semiconductor region and said semiconductor substrate contact each other.

3. A device according to claim 1. further comprising a buffer layer formed to be in contact with both said semiconductor substrate and said third semiconductor region.

4. A device according to claim 3. wherein said second electrode is formed to be in electrical contact with both said third semiconductor region and said buffer layer.

* * * * *